US012635198B2

(12) United States Patent
Kim et al.

(10) Patent No.: US 12,635,198 B2
(45) Date of Patent: May 19, 2026

(54) SEMICONDUCTOR DEVICES INCLUDING A LOWER POWER INTERCONNECTION LINE AND METHODS OF MANUFACTURING THE SAME

(71) Applicant: Samsung Electronics Co., Ltd., Suwon-si (KR)

(72) Inventors: Gukhee Kim, Suwon-si (KR); Kyoungwoo Lee, Suwon-si (KR); Jeewoong Kim, Suwon-si (KR); Sangcheol Na, Suwon-si (KR); Minchan Gwak, Suwon-si (KR); Youngwoo Kim, Suwon-si (KR); Anthony Dongick Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 456 days.

(21) Appl. No.: 18/307,259

(22) Filed: Apr. 26, 2023

(65) Prior Publication Data

US 2024/0072117 A1     Feb. 29, 2024

(30) Foreign Application Priority Data

Aug. 24, 2022     (KR) ......................... 10-2022-0106476

(51) Int. Cl.
*H10D 62/13*     (2025.01)
*H01L 21/768*     (2006.01)
(Continued)

(52) U.S. Cl.
CPC ....... *H10D 62/151* (2025.01); *H10D 84/0149* (2025.01); *H10D 84/038* (2025.01); *H10D 84/83* (2025.01)

(58) Field of Classification Search
CPC ............. H10D 30/6713; H10D 84/013; H10D 30/0198; H10D 30/797; H10D 64/251; (Continued)

(56) References Cited

U.S. PATENT DOCUMENTS

2020/0105889 A1*   4/2020   Liaw ...................... H10D 84/83
2020/0266169 A1   8/2020   Kang et al.
(Continued)

*Primary Examiner* — Sonya McCall-Shepard
(74) *Attorney, Agent, or Firm* — Wolf, Greenfield & Sacks, P.C.

(57)     ABSTRACT

A semiconductor device includes a substrate having a first and second active patterns therein, first and second source/drain patterns extending on the first and second active patterns, respectively, and an active contact on the first and second source/drain patterns. An upper contact is provided, which extends from the active contact towards the substrate, and between the first and second active patterns. A lower power interconnection line is provided, which is buried in a lower portion of the substrate and includes: a buried interconnection portion having a line shape, and a lower contact portion extending vertically from the buried interconnection portion to a bottom surface of the upper contact. A barrier pattern is provided, which extends between the lower contact portion and the upper contact, but not between the buried interconnection portion and the lower contact portion.

20 Claims, 42 Drawing Sheets

(51) Int. Cl.

| | |
|---|---|
| *H01L 23/485* | (2006.01) |
| *H01L 23/528* | (2006.01) |
| *H10D 30/62* | (2025.01) |
| *H10D 84/01* | (2025.01) |
| *H10D 84/03* | (2025.01) |
| *H10D 84/83* | (2025.01) |
| *H10D 84/85* | (2025.01) |

(58) Field of Classification Search
 CPC ........... H10D 84/0149; H10D 30/6735; H10D
 84/0128; H10D 84/038; H10D 30/014;
 H10D 30/43; H10D 30/6757; H10D
 62/151; H10D 84/83; H10D 84/0186;
 H10D 30/6219; H10D 64/256; H10D
 84/851; H10D 84/8311; H10D 30/62;
 H10D 84/853; H01L 23/481; H01L
 23/5286; H01L 21/28525; H01L
 21/76897; H01L 21/76895; H01L 23/485;
 H01L 21/76805; H01L 23/5226; H01L
 23/5283
 See application file for complete search history.

(56) References Cited

U.S. PATENT DOCUMENTS

| | | | | |
|---|---|---|---|---|
| 2021/0028112 | A1* | 1/2021 | Kim .................... | H10D 84/038 |
| 2021/0335675 | A1 | 10/2021 | Tsao | |
| 2021/0358848 | A1 | 11/2021 | Wu et al. | |
| 2021/0376071 | A1 | 12/2021 | Liu et al. | |
| 2021/0384351 | A1 | 12/2021 | Chen et al. | |
| 2022/0037192 | A1 | 2/2022 | Yu et al. | |
| 2022/0069076 | A1 | 3/2022 | Yu et al. | |
| 2022/0115510 | A1 | 4/2022 | Yu et al. | |

* cited by examiner

SEMICONDUCTOR DEVICES INCLUDING A LOWER POWER INTERCONNECTION LINE AND METHODS OF MANUFACTURING THE SAME

REFERENCE TO PRIORITY APPLICATION

This U.S. non-provisional patent application claims priority under 35 U.S.C. § 119 to Korean Patent Application No. 10-2022-0106476, filed Aug. 24, 2022, the disclosure of which is hereby incorporated herein by reference.

BACKGROUND OF THE INVENTION

The present disclosure relates to semiconductor devices and methods of manufacturing the same and, more particularly, to semiconductor devices having field effect transistors therein and methods of manufacturing the same.

Semiconductor devices may include integrated circuit devices, such as metal-oxide-semiconductor field effect transistors (MOSFETs). As sizes and design rules of semiconductor devices have been reduced, MOSFETs have been scaled down. Operating characteristics of semiconductor devices may deteriorate in response to their reduction in size. Accordingly, various methods of fabricating semiconductor devices having improved performance, and which overcome limitations caused by high integration, have been studied.

SUMMARY

Embodiments of the inventive concepts may provide a semiconductor device having improved electrical characteristics and reliability, and manufacturing methods having higher yield.

Embodiments of the inventive concepts may also provide methods of manufacturing a semiconductor device with improved electrical characteristics and reliability.

According to some embodiments of the inventive concept, a semiconductor device is provided, which includes a substrate having first and second active patterns therein that are adjacent to each other, and first and second source/drain patterns extending on the first and second active patterns, respectively. An active contact is provided on the first and second source/drain patterns, and an upper contact is provided, which extends from the active contact toward the substrate, and between the first and second active patterns. A lower power interconnection line is provided, which is buried in a lower portion of the substrate. The lower power interconnection line may include a buried interconnection portion having a line shape, and a lower contact portion that extends vertically from the buried interconnection portion to a bottom surface of the upper contact. A barrier pattern may also be provided between the lower contact portion and the upper contact, but may be omitted from between the buried interconnection portion and the lower contact portion.

According to another embodiment of the inventive concept, a semiconductor device is provided that includes a substrate having first and second active patterns therein, which are adjacent to each other, and first and second source/drain patterns extending on the first and second active patterns, respectively. An active contact is provided on the first and second source/drain patterns, and an upper contact is provided, which extends from the active contact toward the substrate and between the first and second active patterns. A lower power interconnection line is provided, which is buried in a lower portion of the substrate. The lower power interconnection line may include a buried interconnection portion having a line shape. A lower contact portion is provided, which extends vertically from the buried interconnection portion to a bottom surface of the upper contact. A connection portion is provided between the buried interconnection portion and the lower contact portion. The buried interconnection portion may have a first width, the connection portion may have a second width less than the first width, and the lower contact portion may have a third width less than the second width. A ratio of the second width to the third width may be greater than a ratio of the first width to the second width.

According to a further embodiment of the inventive concept, a semiconductor device may include a substrate having a first and second active regions therein, which are spaced apart from each other in a first direction. A first active pattern is provided on the first active region and a second active pattern is provided on the second active region. A first channel pattern and a first source/drain pattern are provided on the first active pattern; a second channel pattern and a second source/drain pattern are provided on the second active pattern. The second source/drain pattern has the same conductivity type as the first source/drain pattern. A gate electrode is provided on the first and second channel patterns. A gate insulating layer is provided, which extends between the gate electrode and the first and second channel patterns. A gate spacer is provided on a sidewall of the gate electrode, and a gate capping pattern is provided on a top surface of the gate electrode. A gate cutting pattern is provided, which penetrates the gate electrode between the first and second channel patterns. An interlayer insulating layer is provided, which covers the first and second source/drain patterns and the gate capping pattern. An active contact is provided, which penetrates the interlayer insulating layer so as to be electrically connected to the first and second source/drain patterns. In addition, metal-semiconductor compound layers are provided, which extend between the active contact and corresponding ones of the first and second source/drain patterns. A gate contact is provided, which penetrates the interlayer insulating layer and the gate capping pattern so as to be electrically connected to the gate electrode. A first metal layer is provided on the interlayer insulating layer. The first metal layer may include a first interconnection line electrically connected to the gate contact. A second metal layer may be provided on the first metal layer. The second metal layer may include a second interconnection line electrically connected to the first metal layer. An upper contact is provided, which extends from the active contact towards the substrate. The upper contact extends between the first and second active patterns. A lower power interconnection line is provided, which is buried in a lower portion of the substrate. The lower power interconnection line vertically overlaps with the gate cutting pattern and extends in a second direction intersecting the first direction. A power delivery network layer is provided on a bottom surface of the substrate. The lower power interconnection line may include a buried interconnection portion having a line shape extending in the second direction. A lower contact portion is provided, which extends vertically from the buried interconnection portion to a bottom surface of the upper contact.

According to a further embodiment of the inventive concept, a method of manufacturing a semiconductor device may include performing a patterning process on a substrate to form a first active pattern, a second active pattern, and a dummy pattern, which extends between the first and second active patterns. In addition, a first source/drain pattern and a second source/drain pattern are formed on the first and second active patterns, respectively, and an interlayer insulating layer is formed, which covers the first and second source/drain patterns. A patterning process is performed on the interlayer insulating layer to form an upper contact hole, which exposes the dummy pattern. The dummy pattern exposed through the upper contact hole is then replaced with a sacrificial pillar, before forming an upper contact by filling the upper contact hole with a conductive material. An active contact is then formed to be electrically connected to the first and second source/drain patterns and the upper contact. A planarization process is performed on a bottom surface of the substrate to reduce a thickness of the substrate. Then, a patterning process is performed on the bottom surface of the substrate to form a lower interconnection line trench, which exposes the sacrificial pillar. This sacrificial pillar is selectively removed to form a lower contact hole. A lower power interconnection line is formed by filling the lower interconnection line trench and the lower contact hole with a conductive material. The lower power interconnection line may include a lower contact portion formed in the lower contact hole so as to be connected to the upper contact, and a line-shaped buried interconnection portion formed in the lower interconnection line trench.

DETAILED DESCRIPTION

Figure 1:
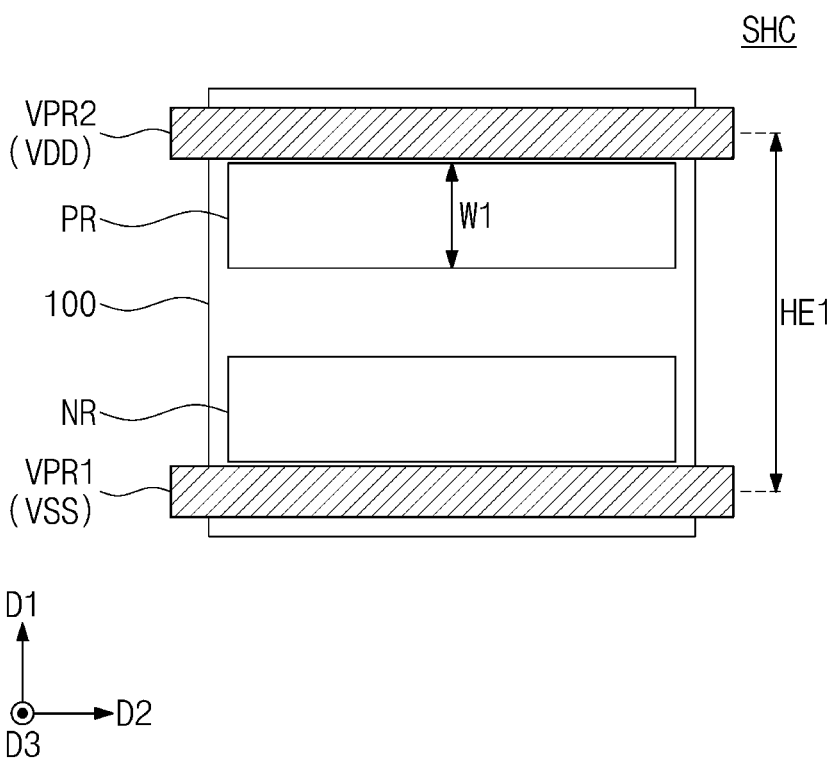
FIGS. 1 to 3 are conceptual views illustrating logic cells of a semiconductor device according to some embodiments of the inventive concepts.
Figure 2:
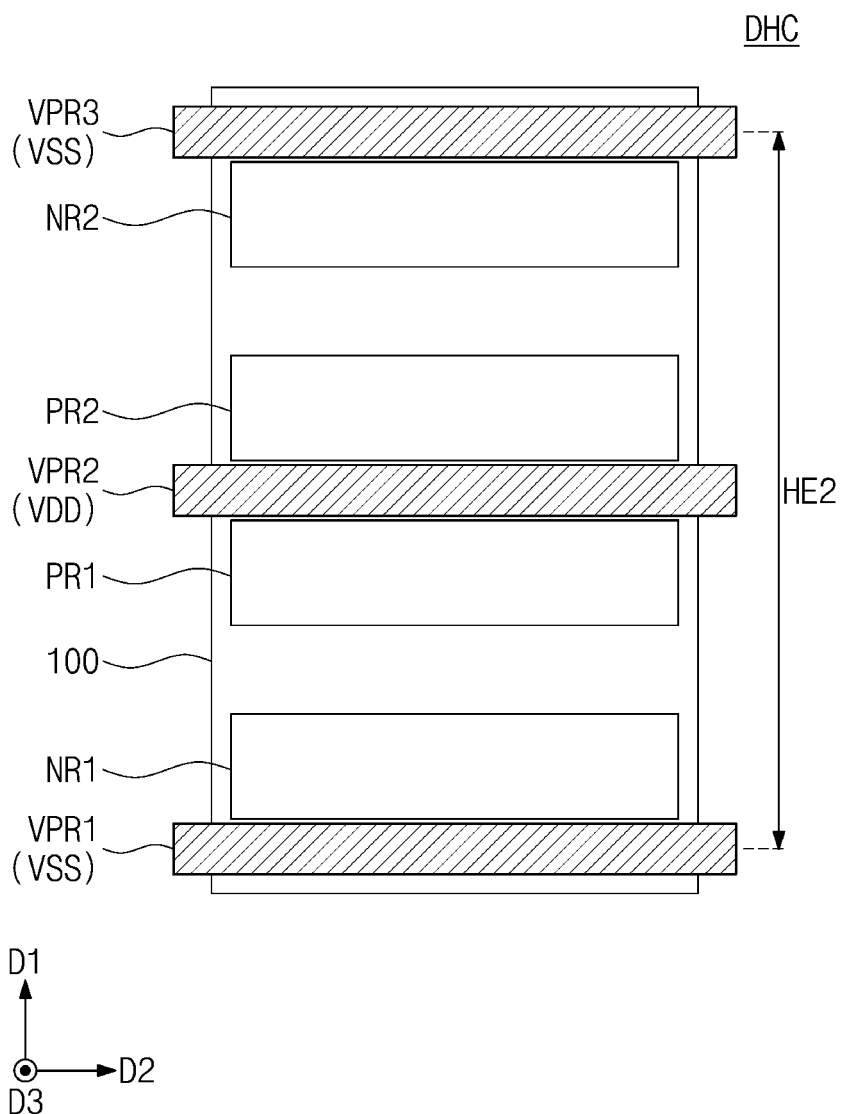
Figure 3:
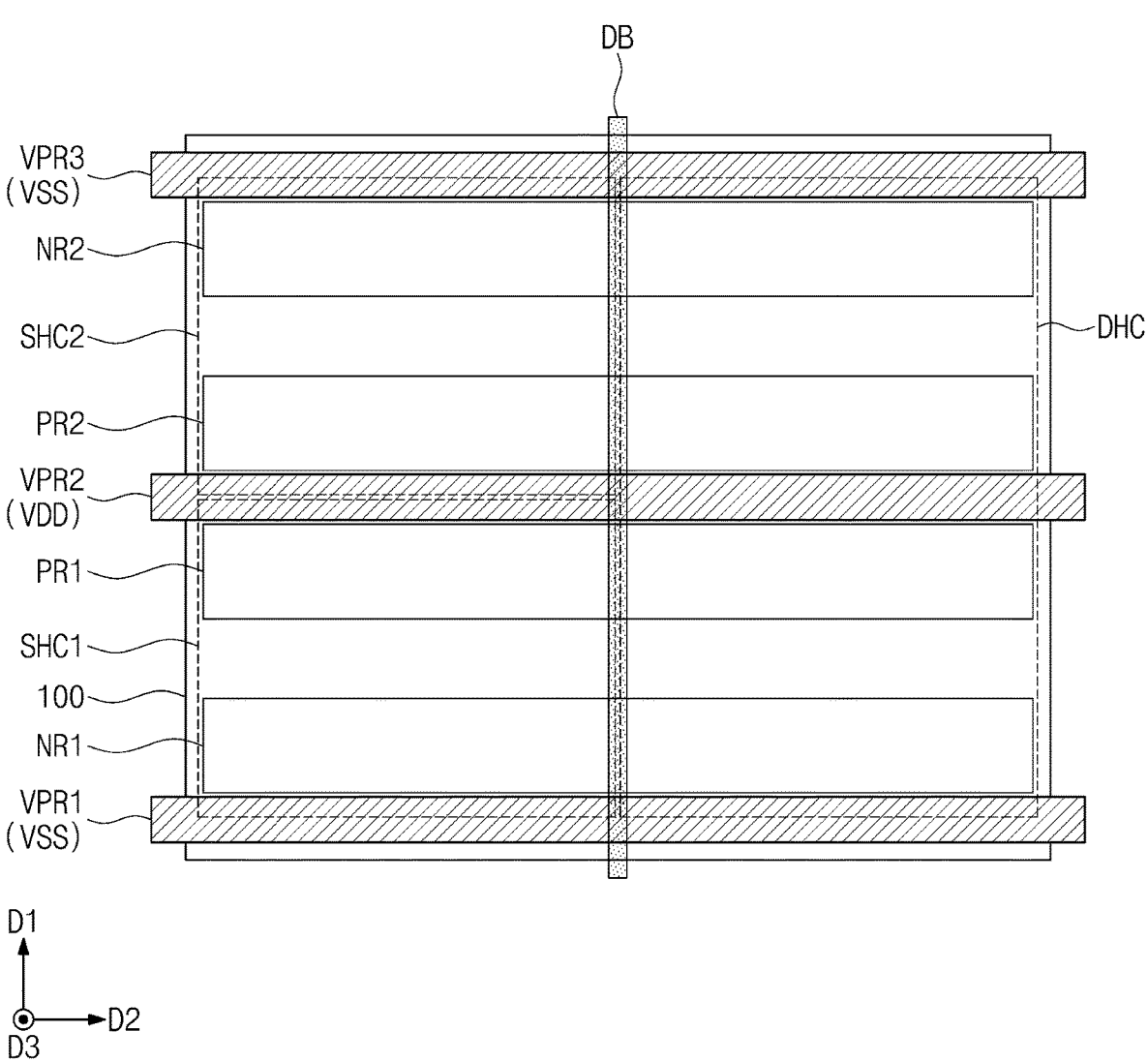

FIGS. 1 to 3 are conceptual views illustrating logic cells of a semiconductor device according to some embodiments of the inventive concepts. Referring to FIG. 1, a single height cell SHC may be provided. More particularly, a first lower power interconnection line VPR1 and a second lower power interconnection line VPR2 may be provided in a lower portion of a substrate 100. The first lower power interconnection line VPR1 may be a path through which a source voltage VSS (e.g., a ground voltage) is provided; the second lower power interconnection line VPR2 may be a path through which a drain voltage VDD (e.g., a power voltage) is provided.

The single height cell SHC may be defined between the first lower power interconnection line VPR1 and the second lower power interconnection line VPR2. The single height cell SHC may include a PMOSFET region PR and an NMOSFET region NR. In other words, the single height cell SHC may have a CMOS structure provided between the first lower power interconnection line VPR1 and the second lower power interconnection line VPR2. As shown, each of the PMOSFET region PR and the NMOSFET region NR may have a first width W1 in a first direction D1. And, a length of the single height cell SHC in the first direction D1 may be defined as a first height HE1, which may be substantially equal to a distance (e.g., a pitch) between the first lower power interconnection line VPR1 and the second lower power interconnection line VPR2. The single height cell SHC may form a logic cell. In the present specification, the logic cell may mean a logic element (e.g., an AND element, an OR element, an XOR element, an XNOR element, an inverter, etc.) for performing a specific function. In other words, the logic cell may include transistors and interconnection lines connecting the transistors to each other, which constitute the logic element.

Referring to FIG. 2, a double height cell DHC may be provided. More particularly, a first lower power interconnection line VPR1, a second lower power interconnection line VPR2 and a third lower power interconnection line VPR3 may be provided as parallel lines on a substrate 100. The second lower power interconnection line VPR2 may extend between the first lower power interconnection line VPR1 and the third lower power interconnection line VPR3. The third lower power interconnection line VPR3 may be a path through which the source voltage VSS is provided.

The double height cell DHC may be defined between the first lower power interconnection line VPR1 and the third lower power interconnection line VPR3. The double height cell DHC may include a first PMOSFET region PR1, a second PMOSFET region PR2, a first NMOSFET region NR1, and a second NMOSFET region NR2, as shown. The first NMOSFET region NR1 may be adjacent to the first lower power interconnection line VPR1. The second NMOSFET region NR2 may be adjacent to the third lower power interconnection line VPR3. The first and second PMOSFET regions PR1 and PR2 may be adjacent to (and on opposite sides of) the second lower power interconnection line VPR2. The second lower power interconnection line VPR2 may extend between the first and second PMOSFET regions PR1 and PR2 when viewed from a plan perspective.

A length of the double height cell DHC in the first direction D1 may be defined as a second height HE2. The second height HE2 may be about twice the first height HE1 of FIG. 1. The first and second PMOSFET regions PR1 and PR2 of the double height cell DHC may be combined with each other to operate as a single PMOSFET region. Thus, a size of a channel of a PMOS transistor of the double height cell DHC may be greater than a size of a channel of a PMOS transistor of the single height cell SHC described above in FIG. 1.

For example, the size of the channel of the PMOS transistor of the double height cell DHC may be about twice the size of the channel of the PMOS transistor of the single height cell SHC. As a result, the double height cell DHC may operate at a higher speed than the single height cell SHC. In the inventive concepts, the double height cell DHC shown in FIG. 2 may be defined as a multi-height cell. Even though not shown in the drawings, the multi-height cell may include a triple height cell of which a cell height is about three times that of the single height cell SHC.

Referring to FIG. 3, a first single height cell SHC1, a second single height cell SHC2 and a double height cell DHC may be two-dimensionally disposed on a substrate 100. The first single height cell SHC1 may be disposed between first and second lower power interconnection lines VPR1 and VPR2. The second single height cell SHC2 may be disposed between second and third lower power interconnection lines VPR2 and VPR3. The second single height cell SHC2 may extend adjacent to the first single height cell SHC1 in the first direction D1. In addition, the double height cell DHC may be disposed between the first and third lower power interconnection lines VPR1 and VPR3. The double height cell DHC may be adjacent to the first and second single height cells SHC1 and SHC2 in a second direction D2, as shown.

An isolation structure DB may be provided between the first single height cell SHC1 and the double height cell DHC and between the second single height cell SHC2 and the double height cell DHC, and extend lengthwise in the first direction D1. Advantageously, an active region of the double height cell DHC may be electrically isolated from an active region of each of the first and second single height cells SHC1 and SHC2 by the isolation structure DB.

Figure 4:
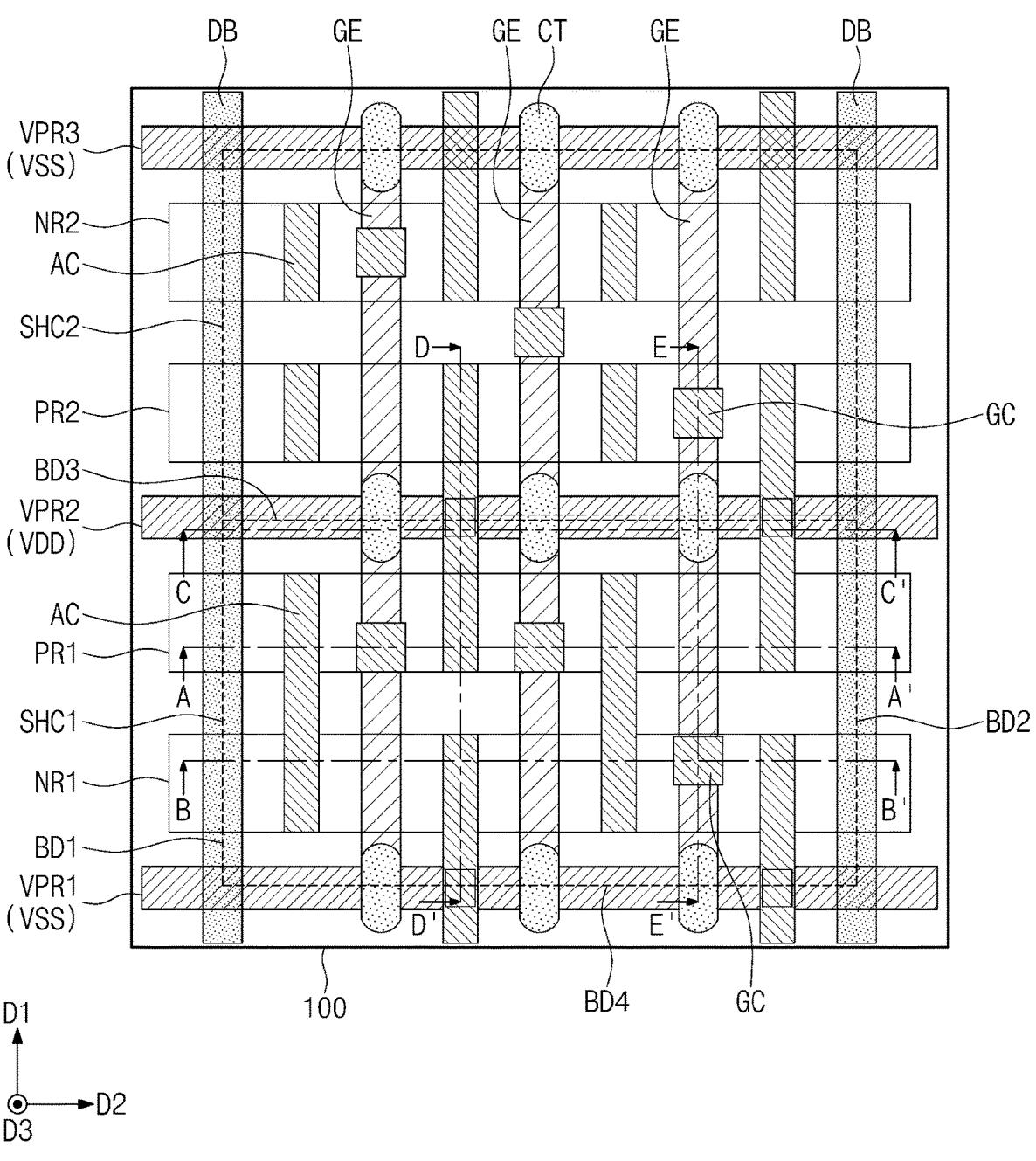
FIG. 4 is a plan view illustrating a semiconductor device according to some embodiments of the inventive concepts.

FIG. 4 is a plan view illustrating a semiconductor device according to some embodiments of the inventive concepts, and FIGS. 5A, 5B, 5C, 5D and 5E are cross-sectional views taken along lines A-A', B-B', C-C', D-D' and E-E' of FIG. 4, respectively. The semiconductor device of FIGS. 4 and 5A to 5E is a more detailed example of the first and second single height cells SHC1 and SHC2 of FIG. 3. Referring to FIGS. 4 and 5A to 5E, first and second single height cells SHC1 and SHC2 may be provided on a substrate 100. Logic transistors constituting a logic circuit may extend within each of the first and second single height cells SHC1 and SHC2. The substrate 100 may be a semiconductor substrate including silicon (Si), germanium (Ge) or silicon-germanium (Si—Ge), or a compound semiconductor substrate.

The substrate 100 may have a first PMOSFET region PR1, a second PMOSFET region PR2, a first NMOSFET region NR1, and a second NMOSFET region NR2. Each of the first PMOSFET region PR1, the second PMOSFET region PR2, the first NMOSFET region NR1 and the second NMOSFET region NR2 may extend in the second direction D2. The first single height cell SHC1 may include the first NMOSFET region NR1 and the first PMOSFET region PR1, and the second single height cell SHC2 may include the second PMOSFET region PR2 and the second NMOSFET region NR2.

A first active pattern AP1 and a second active pattern AP2 may be defined by a trench TR formed in an upper portion of the substrate 100. The first active pattern AP1 may be provided on each of the first and second PMOSFET regions PR1 and PR2. The second active pattern AP2 may be provided on each of the first and second NMOSFET regions NR1 and NR2. The first and second active patterns AP1 and AP2 may extend in the second direction D2. The first and second active patterns AP1 and AP2 may be portions of the substrate 100, which protrude vertically (e.g., in a third direction D3). A device isolation layer ST may fill the trench TR. The device isolation layer ST may include a silicon oxide layer. The device isolation layer ST may not cover first and second channel patterns CH1 and CH2 to be described later.

A first channel pattern CH1 may be provided on the first active pattern AP1. A second channel pattern CH2 may be provided on the second active pattern AP2. Each of the first channel pattern CH1 and the second channel pattern CH2 may include a first semiconductor pattern SP1, a second semiconductor pattern SP2 and a third semiconductor pattern SP3, which are sequentially stacked. The first to third semiconductor patterns SP1, SP2 and SP3 may be spaced apart from each other in a vertical direction (i.e., a third direction D3).

Each of the first to third semiconductor patterns SP1, SP2 and SP3 may include silicon (Si), germanium (Ge), or silicon-germanium (SiGe). For example, each of the first to third semiconductor patterns SP1, SP2 and SP3 may include crystalline silicon. Each of the first to third semiconductor patterns SP1, SP2 and SP3 may be configured as a nanosheet. A plurality of first source/drain patterns SD1 may be provided on the first active pattern AP1. A plurality of first recesses RS1 may be formed on the first active pattern AP1. The first source/drain patterns SD1 may be provided in the first recesses RS1, respectively. The first source/drain patterns SD1 may be dopant regions having a first conductivity type (e.g., a p-type). The first channel pattern CH1 may be disposed between a pair of the first source/drain patterns SD1. In other words, the first to third semiconductor patterns SP1, SP2 and SP3 that are stacked vertically may connect the pair of first source/drain patterns SD1 to each other.

A plurality of second source/drain patterns SD2 may be provided on the second active pattern AP2. A plurality of second recesses RS2 may be formed on the second active pattern AP2. The second source/drain patterns SD2 may be provided in the second recesses RS2, respectively. The second source/drain patterns SD2 may be dopant regions having a second conductivity type (e.g., an n-type). The second channel pattern CH2 may extend between a pair of the second source/drain patterns SD2. In other words, the first to third semiconductor patterns SP1, SP2 and SP3 that are stacked vertically may connect the pair of second source/drain patterns SD2 to each other.

The first and second source/drain patterns SD1 and SD2 may be epitaxial patterns formed by a selective epitaxial growth (SEG) process. For example, a top surface of each of the first and second source/drain patterns SD1 and SD2 may be located at substantially the same level as a top surface of the third semiconductor pattern SP3. Alternatively, the top surface of each of the first and second source/drain patterns SD1 and SD2 may be higher than the top surface of the third semiconductor pattern SP3, in other embodiments.

The first source/drain patterns SD1 may include a semiconductor element (e.g., SiGe) of which a lattice constant is greater than a lattice constant of a semiconductor element of the substrate 100. Thus, the pair of first source/drain patterns SD1 may provide compressive stress to the first channel pattern CH1 therebetween. The second source/drain patterns SD2 may include the same semiconductor element (e.g., Si) as the substrate 100.

Each of the first source/drain patterns SD1 may include a buffer layer BFL and a main layer MAL on the buffer layer BFL. Referring again to FIG. 5A, the buffer layer BFL may cover an inner surface of the first recess RS1. In some embodiments, the buffer layer BFL may have a substantially uniform thickness. For example, a thickness, in the third direction D3, of the buffer layer BFL on a bottom of the first recess RS1 may be substantially equal to a thickness, in the second direction D2, of the buffer layer BFL on an inner sidewall of an upper portion of the first recess RS1.

In certain embodiments, a thickness of the buffer layer BFL may become less from a lower portion of the buffer layer BFL toward an upper portion of the buffer layer BFL. For example, a thickness, in the third direction D3, of the buffer layer BFL on the bottom of the first recess RS1 may be greater than a thickness (in the second direction D2) of the buffer layer BFL on the inner sidewall of the upper portion of the first recess RS1. The buffer layer BFL may have a U-shape along a profile of the first recess RS1.

The main layer MAL may fill a most portion of a remaining region of the first recess RS1 except the buffer layer BFL. A volume of the main layer MAL may be greater than a volume of the buffer layer BFL. Each of the buffer layer BFL and the main layer MAL may include silicon-germanium (SiGe). More particularly, the buffer layer BFL may contain a relatively low concentration of germanium (Ge). In certain embodiments of the inventive concepts, the buffer layer BFL may contain silicon (Si) except germanium (Ge). A concentration of germanium (Ge) of the buffer layer BFL may range from 0 at % (i.e., atomic percent) to 10 at %.

The main layer MAL may contain a relatively high concentration of germanium (Ge). For example, a concentration of germanium (Ge) of the main layer MAL may range from 30 at % to 70 at %. The concentration of germanium (Ge) of the main layer MAL may increase toward the third direction D3. For example, the main layer MAL adjacent to the buffer layer BFL may have a germanium (Ge) concentration of about 40 at %, and an upper portion of the main layer MAL may have a germanium (Ge) concentration of about 60 at %.

Each of the buffer layer BFL and the main layer MAL may include dopants (e.g., boron, gallium, or indium) for allowing the first source/drain pattern SD1 to have the p-type. A concentration of the dopants of each of the buffer layer BFL and the main layer MAL may range from 1E18 atoms/cm$^3$ to 5E22 atoms/cm$^3$. The concentration of the dopants of the main layer MAL may be greater than the concentration of the dopants of the buffer layer BFL.

Advantageously, the buffer layer BFL may prevent a stacking fault between the substrate 100 (i.e., the first active pattern AP1) and the main layer MAL and between the main layer MAL and the first to third semiconductor patterns SP1, SP2 and SP3. When the stacking fault occurs, a channel resistance may be increased. The buffer layer BFL may protect the main layer MAL during a process of replacing second semiconductor layers SAL with first to third portions PO1, PO2 and PO3 of a gate electrode GE. In other words, the buffer layer BFL may prevent an etching material of removing the second semiconductor layers SAL from permeating to the main layer MAL to etch it.

Each of the second source/drain patterns SD2 may include silicon (Si). The second source/drain pattern SD2 may further include dopants (e.g., phosphorus, arsenic, or antimony) for allowing the second source/drain pattern SD2 to have the n-type. A concentration of the dopants of the second source/drain pattern SD2 may range from 1E18 atoms/cm$^3$ to 5E22 atoms/cm$^3$.

Gate electrodes GE may extend in the first direction D1 to intersect the first and second channel patterns CH1 and CH2. The gate electrodes GE may be arranged in the second direction D2 at a first pitch. Each of the gate electrodes GE may vertically overlap with the first and second channel patterns CH1 and CH2, as shown. The gate electrode GE may include a first portion PO1 disposed between the active pattern AP1 or AP2 and the first semiconductor pattern SP1, a second portion PO2 disposed between the first semiconductor pattern SP1 and the second semiconductor pattern SP2, a third portion PO3 disposed between the second semiconductor pattern SP2 and the third semiconductor pattern SP3, and a fourth portion PO4 on the third semiconductor pattern SP3.

Referring again to FIG. 5E, the gate electrode GE may be provided on a top surface TS, a bottom surface BS and both sidewalls SW of each of the first to third semiconductor patterns SP1, SP2 and SP3. In other words, a transistor according to the present embodiments may be a three-dimensional field effect transistor (e.g., a MBCFET or a GAAFET) in which the gate electrode GE three-dimensionally surrounds a channel.

For example, the first single height cell SHC1 may have a first boundary BD1 and a second boundary BD2, which are opposite to each other in the second direction D2. The first and second boundaries BD1 and BD2 may extend in the first direction D1. The first single height cell SHC1 may have a third boundary BD3 and a fourth boundary BD4, which are opposite to each other in the first direction D1. The third and fourth boundaries BD3 and BD4 may extend in the second direction D2.

Gate cutting patterns CT may be disposed on a boundary in the second direction D2 of each of the first and second single height cells SHC1 and SHC2. For example, the gate cutting patterns CT may be disposed on the third and fourth boundaries BD3 and BD4 of the first single height cell SHC1. The gate cutting patterns CT may be arranged along the third boundary BD3 at the first pitch. The gate cutting patterns CT may be arranged along the fourth boundary BD4 at the first pitch. The gate cutting patterns CT on the third and fourth boundaries BD3 and BD4 may overlap with the gate electrodes GE, respectively, when viewed in a plan view. The gate cutting patterns CT may include an insulating material such as silicon oxide, silicon nitride or a combination thereof.

The gate electrode GE on the first single height cell SHC1 may be separated from the gate electrode GE on the second single height cell SHC2 by the gate cutting pattern CT. The gate cutting pattern CT may be disposed between the gate electrode GE on the first single height cell SHC1 and the gate electrode GE on the second single height cell SHC2, which are aligned with each other in the first direction D1. In other words, the gate electrode GE extending in the first direction D1 may be divided into a plurality of the gate electrodes GE by the gate cutting patterns CT.

Referring again to FIGS. 4 and 5A to 5E, a pair of gate spacers GS may be disposed on both sidewalls of the fourth portion PO4 of the gate electrode GE, respectively. The gate spacers GS may extend along the gate electrode GE in the first direction D1. Top surfaces of the gate spacers GS may be higher than a top surface of the gate electrode GE. The top surfaces of the gate spacers GS may be coplanar with a top surface of a first interlayer insulating layer 110 to be described later. The gate spacers GS may include at least one of SiCN, SiCON, or SiN. For certain examples, each of the gate spacers GS may include a multi-layer formed of at least two of SiCN, SiCON, or SiN.

A gate capping pattern GP may be provided on the gate electrode GE. The gate capping pattern GP may extend along the gate electrode GE in the first direction D1. The gate capping pattern GP may include a material having an etch selectivity with respect to first and second interlayer insulating layers 110 and 120 to be described later. For example, the gate capping pattern GP may include at least one of SiON, SiCN, SiCON, or SiN.

A gate insulating layer GI may be disposed between the gate electrode GE and the first channel pattern CH1 and between the gate electrode GE and the second channel pattern CH2. The gate insulating layer GI may cover the top surface TS, the bottom surface BS and both sidewalls SW of each of the first to third semiconductor patterns SP1, SP2 and SP3. The gate insulating layer GI may cover a top surface of the device isolation layer ST under the gate electrode GE.

In some embodiments, the gate insulating layer GI may include a silicon oxide layer, a silicon oxynitride layer, and/or a high-k dielectric layer. The high-k dielectric layer may include a high-k dielectric material of which a dielectric constant is higher than that of a silicon oxide layer. For example, the high-k dielectric material may include at least one of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

In certain embodiments, the semiconductor device according to the inventive concepts may include a negative capacitance (NC) FET using a negative capacitor. For example, the gate insulating layer GI may include a ferro-electric material layer having ferroelectric properties, and a paraelectric material layer having paraelectric properties. The ferroelectric material layer may have a negative capacitance, and the paraelectric material layer may have a positive capacitance. For example, when two or more capacitors are connected in series to each other and a capacitance of each of the capacitors has a positive value, a total capacitance may be reduced to be less than the capacitance of each of the capacitors. On the contrary, when at least one of capacitances of two or more capacitors connected in series to each other has a negative value, a total capacitance may have a positive value and may be greater than an absolute value of the capacitance of each of the capacitors.

When the ferroelectric material layer having the negative capacitance is connected in series to the paraelectric material layer having the positive capacitance, a total capacitance value of the ferroelectric and paraelectric material layers connected in series may increase. The transistor including the ferroelectric material layer may have a subthreshold swing (SS) less than 60 mV/decade at room temperature by using the increase in the total capacitance value.

The ferroelectric material layer may have the ferroelectric properties. For example, the ferroelectric material layer may include at least one of hafnium oxide, hafnium zirconium oxide, barium strontium titanium oxide, barium titanium oxide, or lead zirconium titanium oxide. Here, for an example, the hafnium zirconium oxide may be a material formed by doping hafnium oxide with zirconium (Zr). For another example, the hafnium zirconium oxide may be a compound of hafnium (Hf), zirconium (Zr), and oxygen (O).

The ferroelectric material layer may further include dopants doped therein. For example, the dopants may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). Moreover, the type of dopants included in the ferroelectric material layer may be changed depending on a kind of the ferroelectric material included in the ferroelectric material layer. For example, when the ferro-electric material layer includes hafnium oxide, the dopants included in the ferroelectric material layer may include at least one of, for example, gadolinium (Gd), silicon (Si), zirconium (Zr), aluminum (Al), or yttrium (Y). And, when the dopants are aluminum (Al), the ferroelectric material layer may include aluminum of 3 at % (atomic %) to 8 at %. Here, a ratio of the dopants may be a ratio of the amount of aluminum to a sum of the amounts of hafnium and aluminum. In addition, when the dopants are silicon (Si), the ferroelectric material layer may include silicon of 2 at % to 10 at %. Furthermore, when the dopants are yttrium (Y), the ferroelectric material layer may include yttrium of 2 at % to 10 at %. And, when the dopants are gadolinium (Gd), the ferroelectric material layer may include gadolinium of 1 at % to 7 at %. Finally, when the dopants are zirconium (Zr), the ferroelectric material layer may include zirconium of 50 at % to 80 at %.

The paraelectric material layer may have the paraelectric properties. For example, the paraelectric material layer may include at least one of silicon oxide or a metal oxide having a high-k dielectric constant. For example, the metal oxide included in the paraelectric material layer may include at least one of, but not limited to, hafnium oxide, zirconium oxide, or aluminum oxide.

The ferroelectric material layer and the paraelectric material layer may include the same material. The ferroelectric material layer may have the ferroelectric properties, but the paraelectric material layer may not have the ferroelectric properties. For example, when the ferroelectric material layer and the paraelectric material layer include hafnium oxide, a crystal structure of hafnium oxide included in the ferroelectric material layer may be different from a crystal structure of hafnium oxide included in the paraelectric material layer.

The ferroelectric material layer may have a thickness showing the ferroelectric properties. For example, the thickness of the ferroelectric material layer may range from 0.5 nm to 10 nm, but embodiments of the inventive concepts are not limited thereto. A critical thickness showing the ferro-electric properties may be changed depending on a kind of a ferroelectric material, and thus the thickness of the ferroelectric material layer may be changed depending on a kind of the ferroelectric material included therein.

For some examples, the gate insulating layer GI may include a single ferroelectric material layer. In other examples, the gate insulating layer GI may include a plurality of the ferroelectric material layers spaced apart from each other. The gate insulating layer GI may have a stack structure in which the ferroelectric material layers and the paraelectric material layers are alternately stacked.

The gate electrode GE may include a first metal pattern, and a second metal pattern on the first metal pattern. The first metal pattern may be provided on the gate insulating layer GI and may be adjacent to the first to third semiconductor patterns SP1, SP2 and SP3. The first metal pattern may include a work function metal of adjusting a threshold voltage of a transistor. A desired threshold voltage of the transistor may be obtained by adjusting a thickness and a composition of the first metal pattern. For example, the first to third portions PO1, PO2 and PO3 of the gate electrode GE may be formed of the first metal pattern corresponding to the work function metal.

The first metal pattern may include a metal nitride layer. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers.

The second metal pattern may include a metal having a resistance lower than that of the first metal pattern. For example, the second metal pattern may include at least one metal selected from a group consisting of tungsten (W), aluminum (Al), titanium (Ti), and tantalum (Ta). The fourth portion PO4 of the gate electrode GE may also include the first metal pattern and the second metal pattern on the first metal pattern.

Referring again to FIG. 5B, inner spacers IP may be provided on the first and second NMOSFET regions NR1 and NR2. In other words, the inner spacers IP may be provided on the second active pattern AP2. The inner spacers IP may be disposed between the second source/drain pattern SD2 and the first to third portions PO1, PO2 and PO3 of the gate electrode GE, respectively. The inner spacers IP may be in direct contact with the second source/drain pattern SD2. Each of the first to third portions PO1, PO2 and PO3 of the gate electrode GE may be spaced apart from the second source/drain pattern SD2 by the inner spacer IP.

A first interlayer insulating layer 110 may be provided on the substrate 100. The first interlayer insulating layer 110 may cover the gate spacers GS and the first and second source/drain patterns SD1 and SD2. A top surface of the first interlayer insulating layer 110 may be substantially coplanar with the top surface of the gate capping pattern GP and the top surface of the gate spacer GS. A second interlayer insulating layer 120 covering the gate capping pattern GP may be disposed on the first interlayer insulating layer 110. A third interlayer insulating layer 130 may be provided on the second interlayer insulating layer 120. A fourth interlayer insulating layer 140 may be provided on the third interlayer insulating layer 130. For example, each of the first to fourth interlayer insulating layers 110 to 140 may include a silicon oxide layer.

A pair of isolation structures DB opposite to each other in the second direction D2 may be provided at both sides of each of the first and second single height cells SHC1 and SHC2. For example, the pair of isolation structures DB may be provided on the first and second boundaries BD1 and BD2 of the first single height cell SHC1, respectively. The isolation structure DB may extend in the first direction D1 in parallel to the gate electrode GE. A pitch between the isolation structure DB and the gate electrode GE adjacent thereto may be equal to the first pitch.

The isolation structure DB may penetrate the first and second interlayer insulating layers 110 and 120 and may extend into the first and second active patterns AP1 and AP2. The isolation structure DB may penetrate an upper portion of each of the first and second active patterns AP1 and AP2. The isolation structure DB may electrically isolate an active region (e.g., the PMOSFET and NMOSFET regions) of each of the first and second single height cells SHC1 and SHC2 from an active region of another cell adjacent thereto.

Active contacts AC may penetrate the first and second interlayer insulating layers 110 and 120 so as to be electrically connected to the first and second source/drain patterns SD1 and SD2. A pair of the active contacts AC may be provided at both sides of the gate electrode GE, respectively. The active contact AC may have a bar shape extending in the first direction D1 when viewed in a plan view. The active contact AC may be a self-aligned contact. In other words, the active contact AC may be formed to be self-aligned with the gate capping pattern GP and the gate spacer GS. For example, the active contact AC may cover at least a portion of a sidewall of the gate spacer GS. Even though not shown in the drawings, the active contact AC may cover a portion of the top surface of the gate capping pattern GP.

In some embodiments, metal-semiconductor compound layers SC (e.g., silicide layers) may extend between the active contact AC and the first source/drain pattern SD1 and between the active contact AC and the second source/drain pattern SD2, respectively. The active contact AC may be electrically connected to the source/drain pattern SD1 or SD2 through the metal-semiconductor compound layer SC. For example, the metal-semiconductor compound layer SC may include at least one of titanium silicide, tantalum silicide, tungsten silicide, nickel silicide, or cobalt silicide.

Gate contacts GC may penetrate the second interlayer insulating layer 120 and the gate capping patterns GP so as to be electrically connected to the gate electrodes GE, respectively. Two gate contacts GC on the first single height cell SHC1 may overlap with the first PMOSFET region PR1 when viewed in a plan view. In other words, the two gate contacts GC on the first single height cell SHC1 may be provided on the first active pattern AP1 (see FIG. 5A). One gate contact GC on the first single height cell SHC1 may overlap with the first NMOSFET region NR1 when viewed in a plan view. In other words, the one gate contact GC on the first single height cell SHC1 may be provided on the second active pattern AP2 (see FIG. 5B). The gate contact GC may be freely disposed on the gate electrode GE regardless of its position. For example, the gate contacts GC on the second single height cell SHC2 may be disposed on the second PMOSFET region PR2, the second NMOSFET region NR2 and the device isolation layer ST filling the trench TR, respectively (see FIG. 4).

Figure 5A:
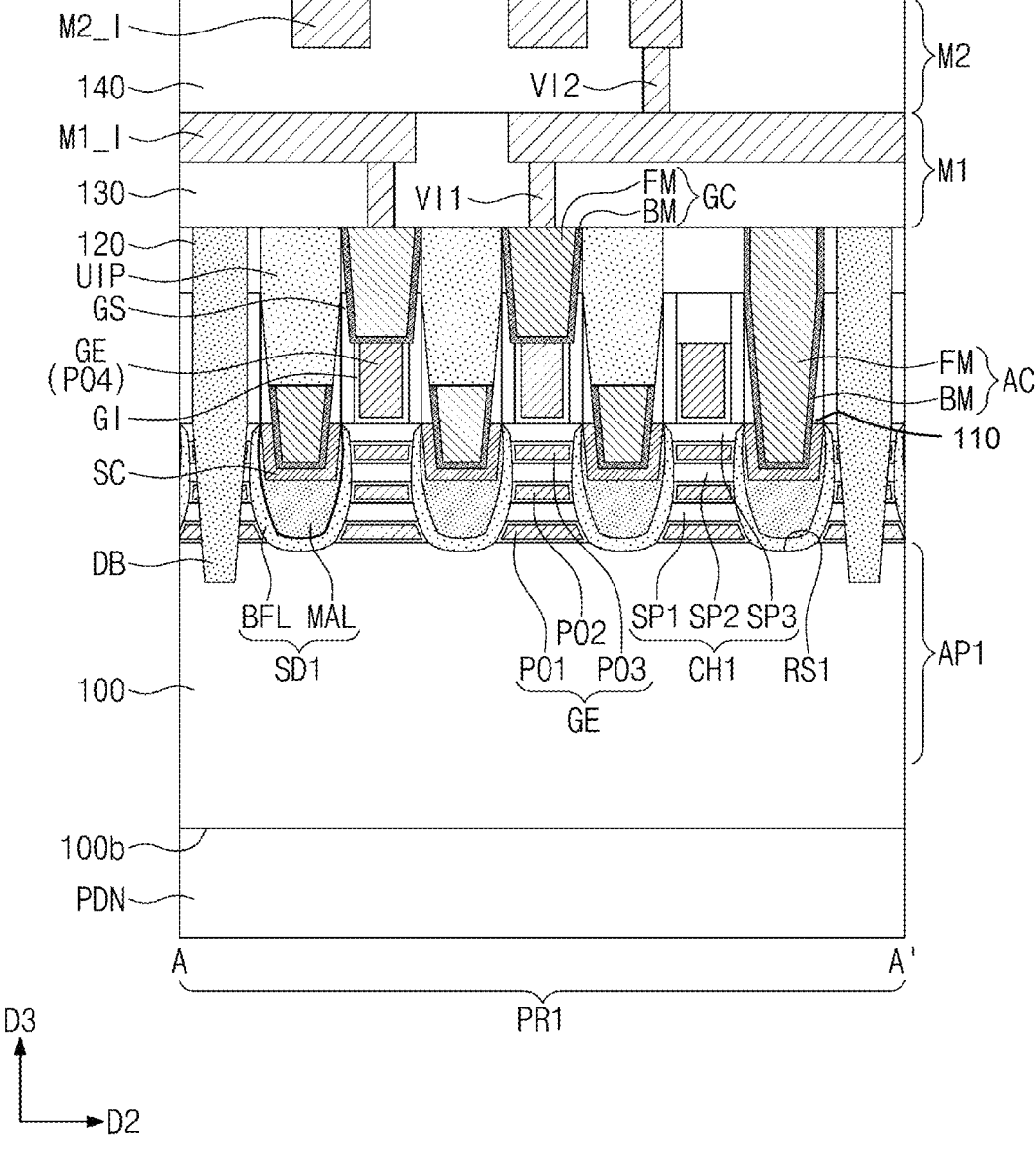
FIGS. 5A, 5B, 5C, 5D and 5E are cross-sectional views taken along lines A-A', B-B', C-C', D-D' and E-E' of FIG. 4, respectively.
Figure 5B:
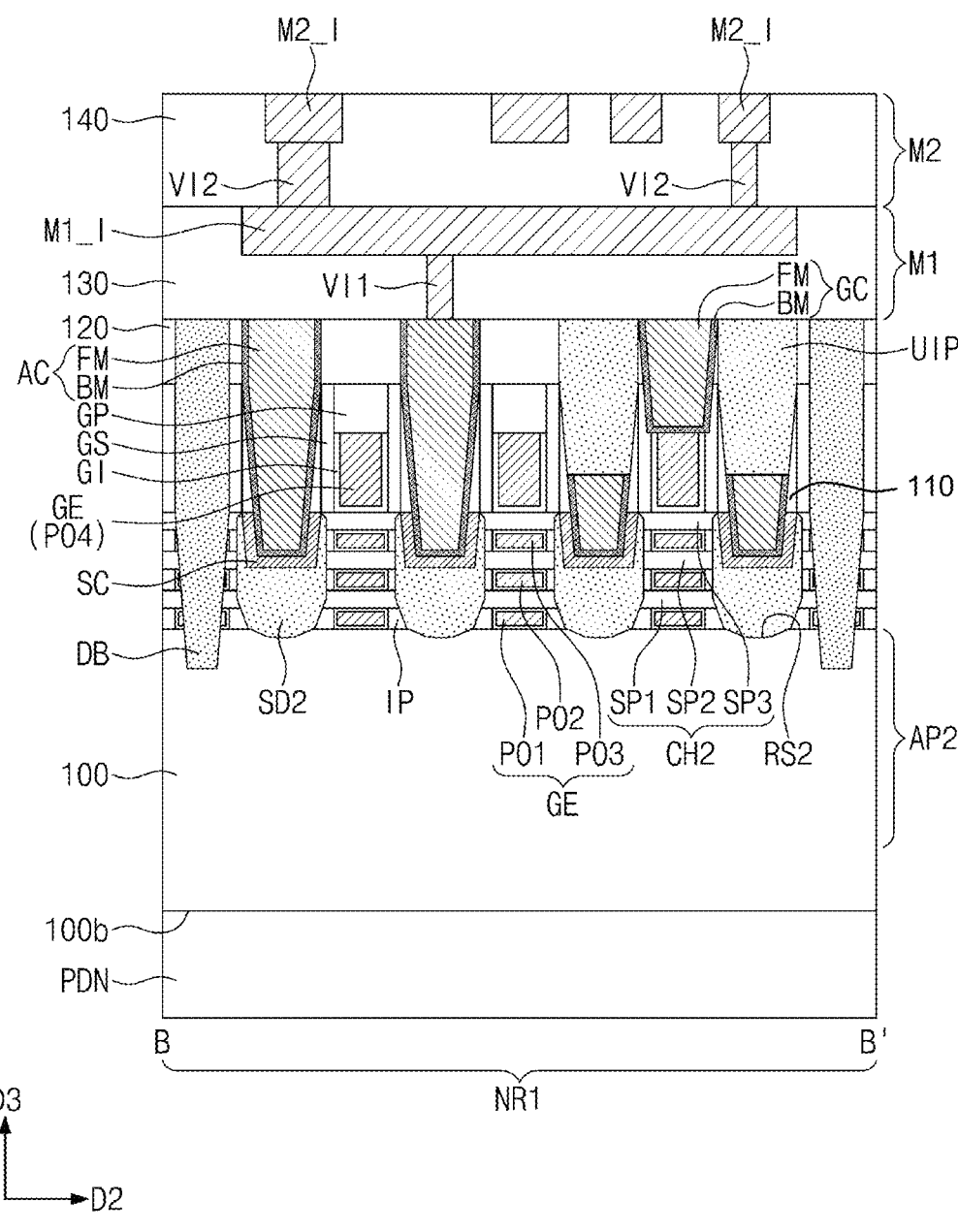
Figure 5C:
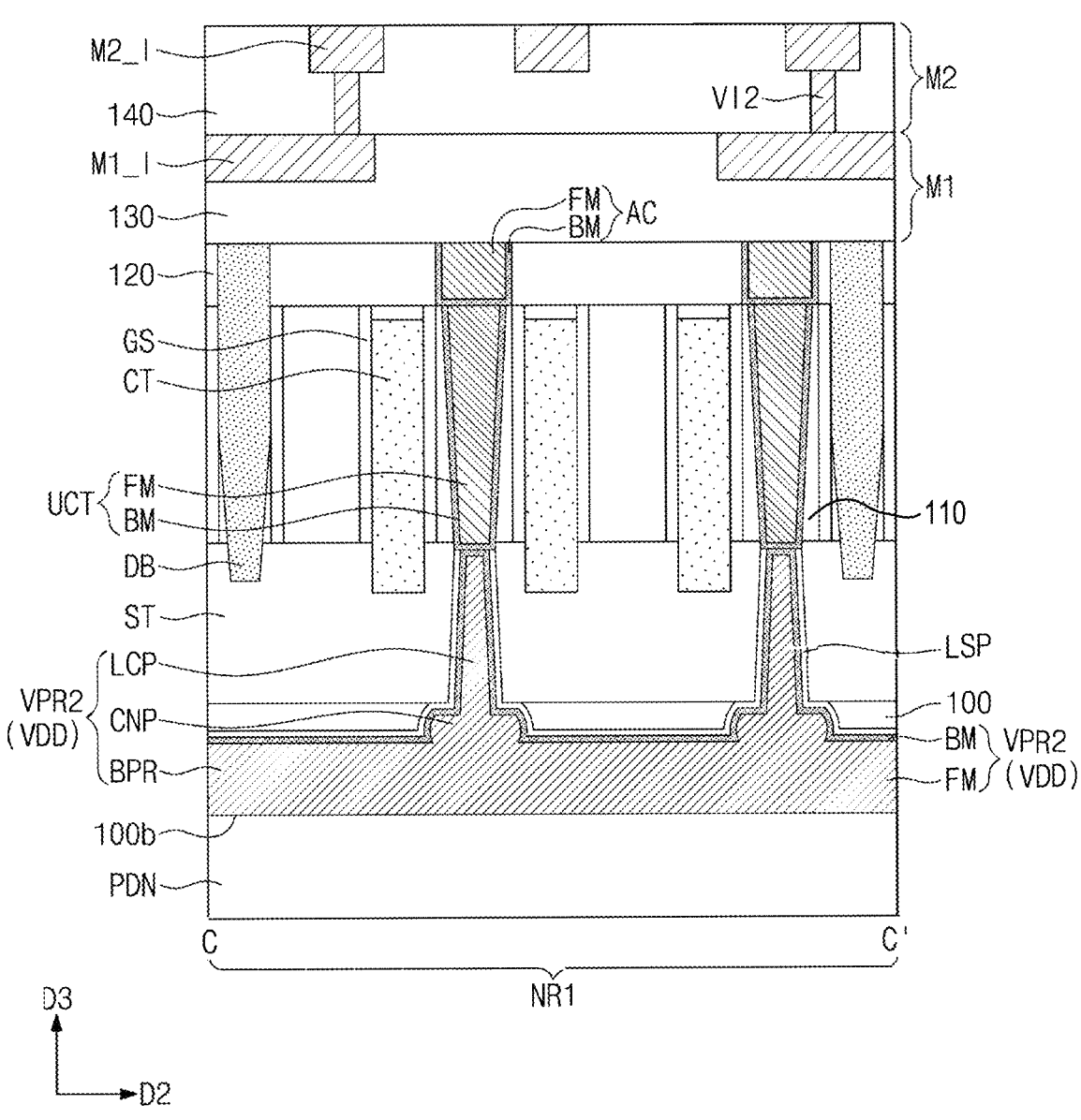
Figure 5D:
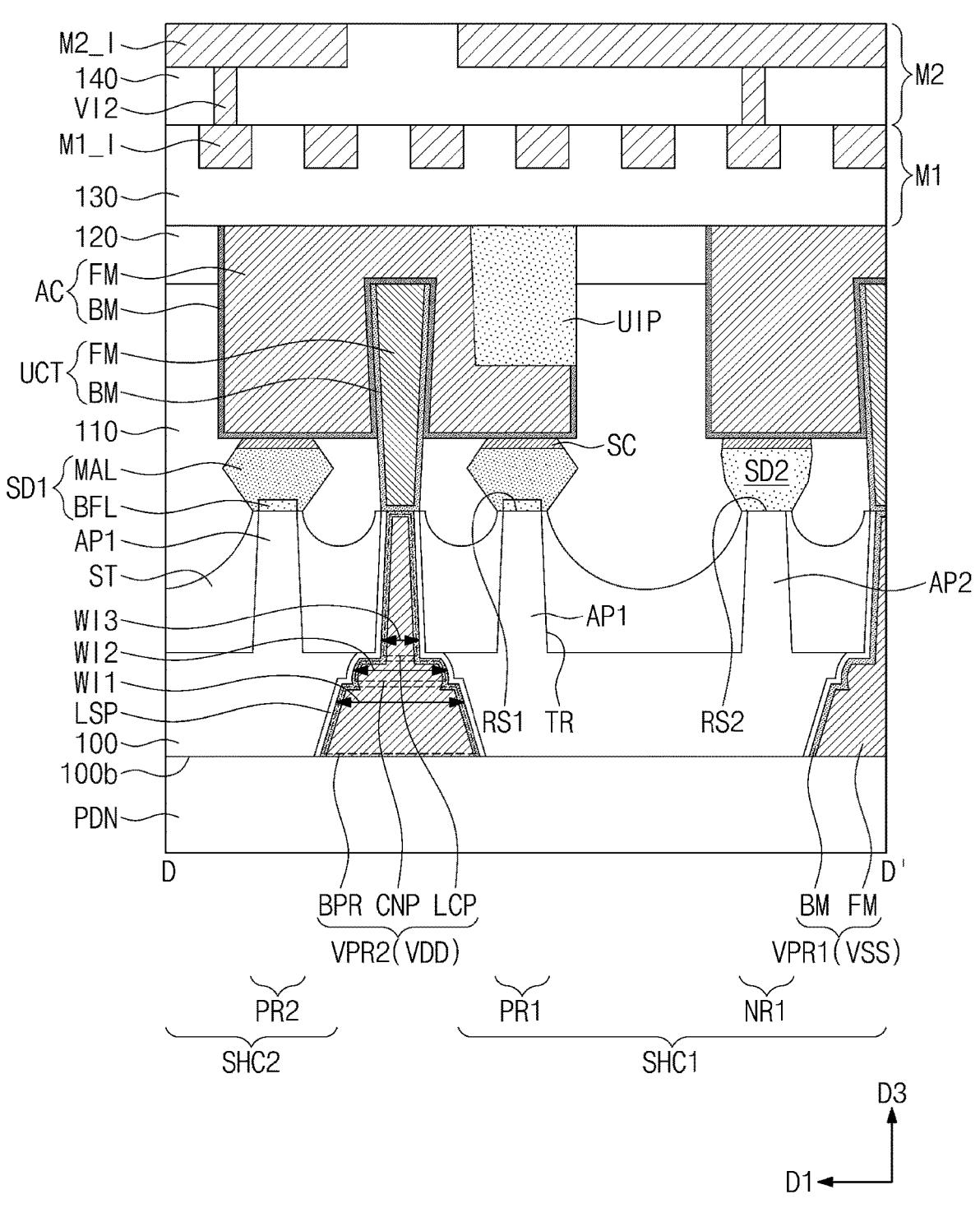
Figure 5E:
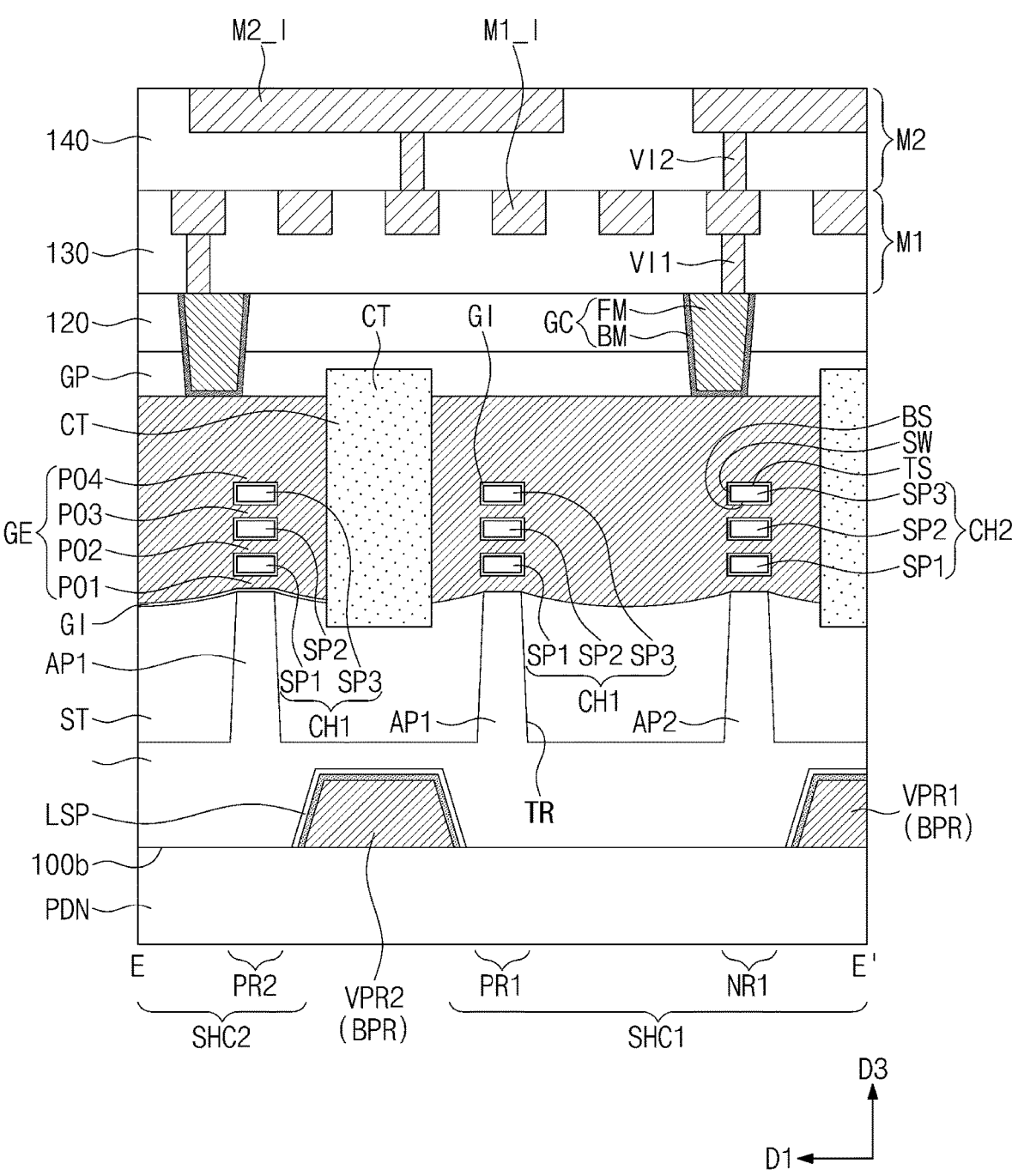

In some embodiments of the inventive concepts, referring to FIGS. 5A and 5D, an upper portion of the active contact AC adjacent to the gate contact GC may be filled with an upper insulating pattern UIP. A bottom surface of the upper insulating pattern UIP may be lower than a bottom surface of the gate contact GC. In other words, a top surface of the active contact AC adjacent to the gate contact GC may be lower than the bottom surface of the gate contact GC due to the upper insulating pattern UIP. Thus, it is possible to prevent an electrical short between the gate contact GC and the active contact AC adjacent thereto.

Each of the active contact AC and the gate contact GC may include a conductive pattern FM and a barrier pattern BM surrounding the conductive pattern FM. For example, the conductive pattern FM may include at least one metal of aluminum, copper, tungsten, molybdenum, or cobalt. The barrier pattern BM may cover sidewalls and a bottom surface of the conductive pattern FM. The barrier pattern BM may include a metal layer/a metal nitride layer. The metal layer may include at least one of titanium, tantalum, tungsten, nickel, cobalt, or platinum. The metal nitride layer may include at least one of a titanium nitride (TiN) layer, a tantalum nitride (TaN) layer, a tungsten nitride (WN) layer, a nickel nitride (NiN) layer, a cobalt nitride (CoN) layer, or a platinum nitride (PtN) layer.

Referring again to FIGS. 4, 5C and 5D, first to third lower power interconnection lines VPR1, VPR2 and VPR3 may be provided in a lower portion of the substrate 100. The first to third lower power interconnection lines VPR1, VPR2 and VPR3 may extend in the second direction D2 in parallel to each other. The first lower power interconnection line VPR1 may be disposed on the fourth boundary BD4 of the first single height cell SHC1. The second lower power interconnection line VPR2 may be disposed on the third boundary BD3 of the first single height cell SHC1. In other words, the first single height cell SHC1 may be defined between the first lower power interconnection line VPR1 and the second lower power interconnection line VPR2. The second single height cell SHC2 may be defined between the second lower power interconnection line VPR2 and the third lower power interconnection line VPR3.

Referring again to FIGS. 5C and 5D, the second lower power interconnection line VPR2 as a representative of the lower power interconnection lines VPR1 to VPR3 may be electrically connected to at least one active contact AC. The second lower power interconnection line VPR2 may include a buried interconnection portion BPR having a line shape extending in the second direction D2, and a lower contact portion LCP protruding from the buried interconnection portion BPR in the third direction D3. In some embodiments of the inventive concepts, the second lower power interconnection line VPR2 may further include a connection portion CNP between the buried interconnection portion BPR and the lower contact portion LCP. However, the connection portion CNP may be omitted.

An upper contact UCT may be provided on the lower contact portion LCP. The upper contact UCT may electrically connect the lower contact portion LCP of the second lower power interconnection line VPR2 to the active contact AC. As a result, in the semiconductor device according to the present embodiments, the lower power interconnection line VPR1, VPR2 or VPR3 may be electrically connected to the source/drain pattern SD1 or SD2 through the lower contact portion LCP, the upper contact UCT and the active contact AC.

The buried interconnection portion BPR, the connection portion CNP and the lower contact portion LCP may be connected to each other in a single body to constitute the second lower power interconnection line VPR2. For example, the second lower power interconnection line VPR2 may include a conductive pattern FM and a barrier pattern BM. Here, the barrier pattern BM between the buried interconnection portion BPR and the connection portion CNP and between the connection portion CNP and the lower contact portion LCP may be omitted.

Referring again to FIG. 5D, the buried interconnection portion BPR may have a first width WI1 in the first direction D1, the connection portion CNP may have a second width WI2 in the first direction D1, and the lower contact portion LCP may have a third width WI3 in the first direction D1. Each of the first to third widths WI1 to WI3 may decrease toward the third direction D3. The second width WI2 may be greater than the third width WI3, and the first width WI1 may be greater than the second width WI2. A ratio WI2/WI3 of the second width WI2 to the third width WI3 may be greater than a ratio WI1/WI2 of the first width WI1 to the second width WI2. In other words, a difference between the second width WI2 and the third width WI3 may be greater than a difference between the first width WI1 and the second width WI2.

The upper contact UCT may include a conductive pattern FM and a barrier pattern BM. The barrier pattern BM of the upper contact UCT may be in direct contact with the barrier pattern BM of the lower contact portion LCP. The conductive pattern FM of the upper contact UCT and the conductive pattern FM of the lower power interconnection line VPR1, VPR2 or VPR3 may include the same metal or different metals. For example, the conductive pattern FM of the lower power interconnection line VPR1, VPR2 or VPR3 may include copper, and the conductive pattern FM of the upper contact UCT may include molybdenum or ruthenium.

In some embodiments of the inventive concepts, the upper contact UCT and the lower contact portion LCP may be self-aligned with each other. In other words, a center line of the upper contact UCT and a center line of the lower contact portion LCP may be aligned with each other. An upper portion of the upper contact UCT may be surrounded by the active contact AC.

A width of the upper contact UCT in the first direction D1 may increase toward the third direction D3. In other words, the width of the upper contact UCT may become progressively less toward a bottom surface 100b of the substrate 100. The width WI3 of the lower contact portion LCP may become progressively greater toward the bottom surface 100b of the substrate 100. Thus, the upper contact UCT and the lower contact portion LCP may constitute a sandglass shape.

A lower spacer LSP may be disposed between each of the lower power interconnection lines VPR1, VPR2 and VPR3 and the substrate 100. The lower spacer LSP may include a silicon-based insulating material (e.g., silicon oxide, silicon nitride, or silicon oxynitride). The lower power interconnection lines VPR1, VPR2 and VPR3 may be insulated or isolated from the substrate 100 by the lower spacers LSP.

A bottom surface of the buried interconnection portion BPR may be coplanar with the bottom surface 100b of the substrate 100. A power delivery network layer PDN may be provided on the bottom surface 100b of the substrate 100. The power delivery network layer PDN may include a plurality of lower interconnection lines electrically connected to the first to third lower power interconnection lines VPR1, VPR2 and VPR3. For example, the power delivery network layer PDN may include an interconnection network for applying a source voltage VSS to the first and third lower power interconnection lines VPR1 and VPR3. The power delivery network layer PDN may include an interconnection network for applying a drain voltage VDD to the second lower power interconnection line VPR2.

A first metal layer M1 may be provided in the third interlayer insulating layer 130. The first metal layer M1 may include first interconnection lines M1_I. The first interconnection lines M1_I of the first metal layer M1 may extend in the second direction D2 in parallel to each other.

According to the embodiments of the inventive concepts, power interconnection lines for supplying power to the single height cell SHC may be disposed in a lower portion of the substrate 100 in the form of the lower power interconnection lines VPR1 to VPR3. Thus, the power interconnection lines may be omitted in the first metal layer M1. The first interconnection lines M1_I for transmitting signals may be disposed in the first metal layer M1. The first interconnection lines M1_I may be arranged in the first direction D1 at a second pitch. The second pitch may be less than the first pitch.

The first metal layer M1 may further include first vias VI1. The first vias VI1 may be provided under the first interconnection lines M1_I of the first metal layer M1. The active contact AC may be electrically connected to a corresponding one of the first interconnection lines M1_I of the first metal layer M1 through a corresponding one of the first vias VI1. The gate contact GC may be electrically connected to a corresponding one of the first interconnection lines M1_I of the first metal layer M1 through a corresponding one of the first vias VI1.

The first interconnection line M1_I of the first metal layer M1 and the first via VI1 thereunder may be formed using different processes. In other words, each of the first interconnection line M1_I and the first via VI1 of the first metal layer M1 may be formed using a single damascene process. The semiconductor device according to the present embodiments may be formed using processes less than 20 nm.

A second metal layer M2 may be provided in the fourth interlayer insulating layer 140. The second metal layer M2 may include a plurality of second interconnection lines M2_I. Each of the second interconnection lines M2_I of the second metal layer M2 may have a line shape or bar shape extending in the first direction D1. In other words, the second interconnection lines M2_I may extend in the first direction D1 in parallel to each other.

The second metal layer M2 may further include second vias VI2 provided under the second interconnection lines M2_I. The first interconnection line M1_I of the first metal layer M1 may be electrically connected to a corresponding one of the second interconnection lines M2_I of the second metal layer M2 through a corresponding one of the second vias VI2. For example, the second interconnection line M2_I of the second metal layer M2 and the second via VI2 thereunder may be formed using a dual damascene process together.

The first interconnection line M1_I of the first metal layer M1 and the second interconnection line M2_I of the second metal layer M2 may include the same conductive material or different conductive materials. For example, each of the first and second interconnection lines M1_I and M2_I of the first and second metal layers M1 and M2 may include at least one metal material of aluminum, copper, tungsten, molybdenum, ruthenium, or cobalt. Even though not shown in the drawings, metal layers (e.g., M3, M4, M5, . . . ) stacked on the fourth interlayer insulating layer 140 may be additionally provided. Each of the stacked metal layers may include interconnection lines for routing between cells.

In the lower power interconnection line VPR1, VPR2 or VPR3 according to the embodiments of the inventive concepts, the buried interconnection portion BPR and the lower contact portion LCP may be formed in a single body, and thus a barrier metal therebetween may be omitted. Thus, resistances of the lower power interconnection lines VPR1 to VPR3 may be reduced, and electrical characteristics of the semiconductor device may be improved.

The upper contact UCT and the lower contact portion LCP according to the embodiments of the inventive concepts may be individually formed by different processes. In other words, a vertical contact LCP and UCT extending from the buried interconnection portion BPR to the active contact AC may be divided into two portions formed independently of each other. According to the inventive concepts, the vertical contact LCP and UCT having a high aspect ratio may be well filled with a metal, and thus reliability of the semiconductor device may be improved.

The lower contact portion LCP according to the embodiments of the inventive concepts may be formed to be self-aligned with the upper contact UCT. Thus, misalignment between the lower contact portion LCP and the upper contact UCT may be prevented, and a contact area therebetween may be maximized to reduce a resistance therebetween. As a result, the inventive concepts may improve both the reliability and the electrical characteristics of the semiconductor device.

Figure 10A:
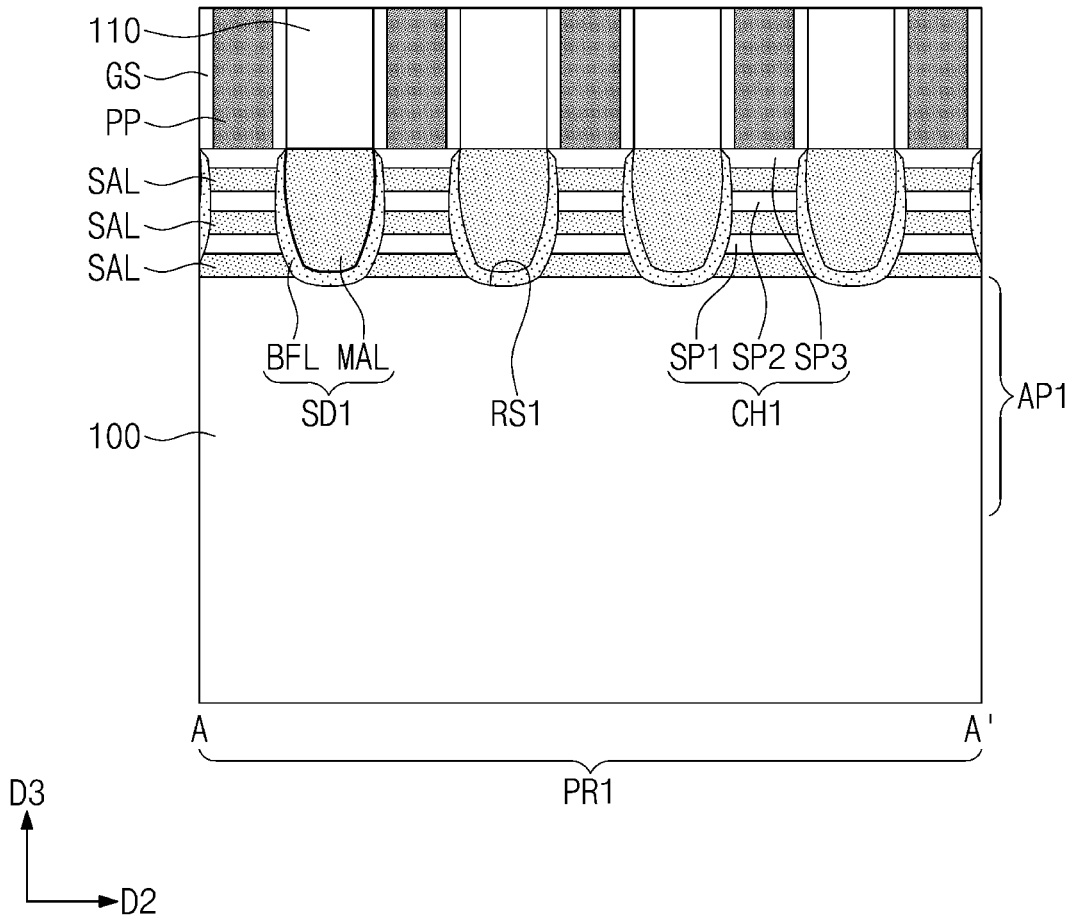
Figure 10B:
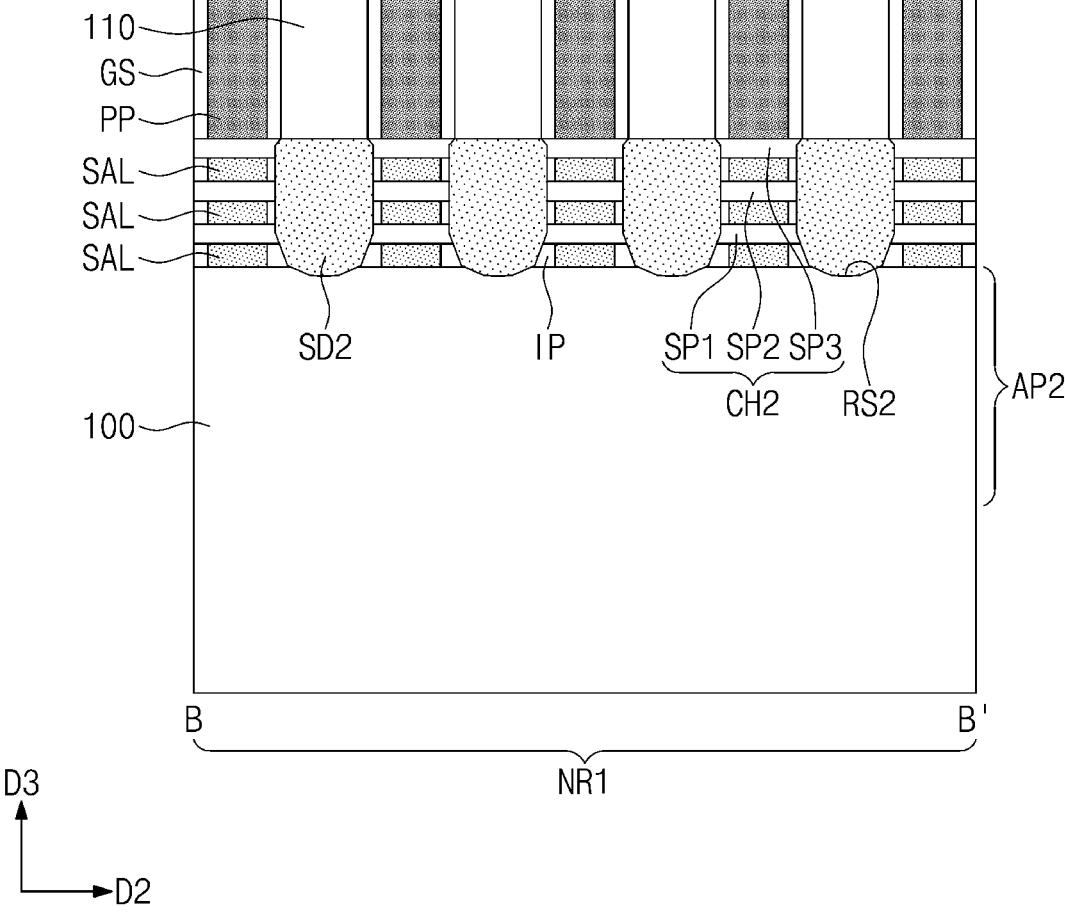
Figure 10C:
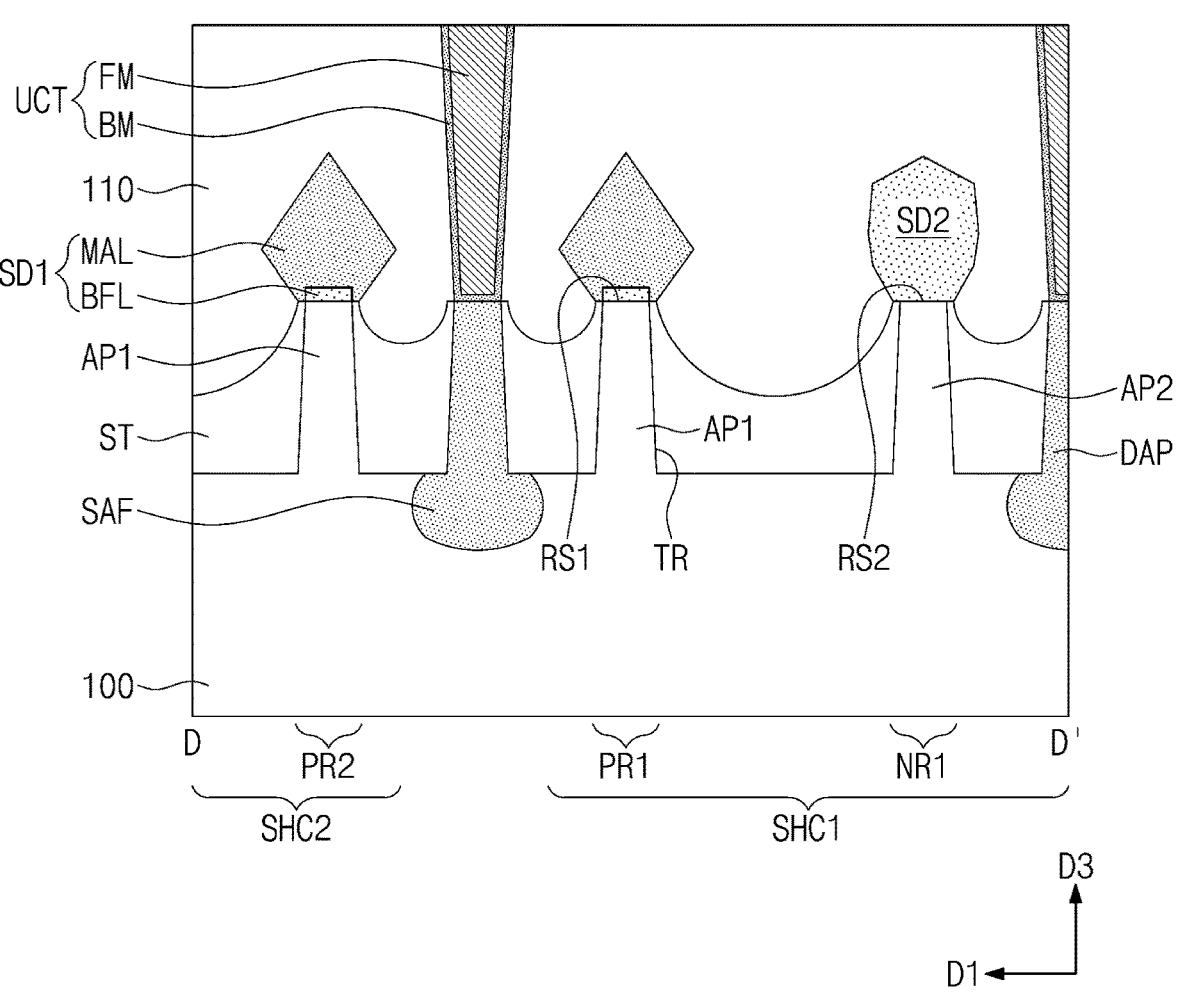
Figure 11A:
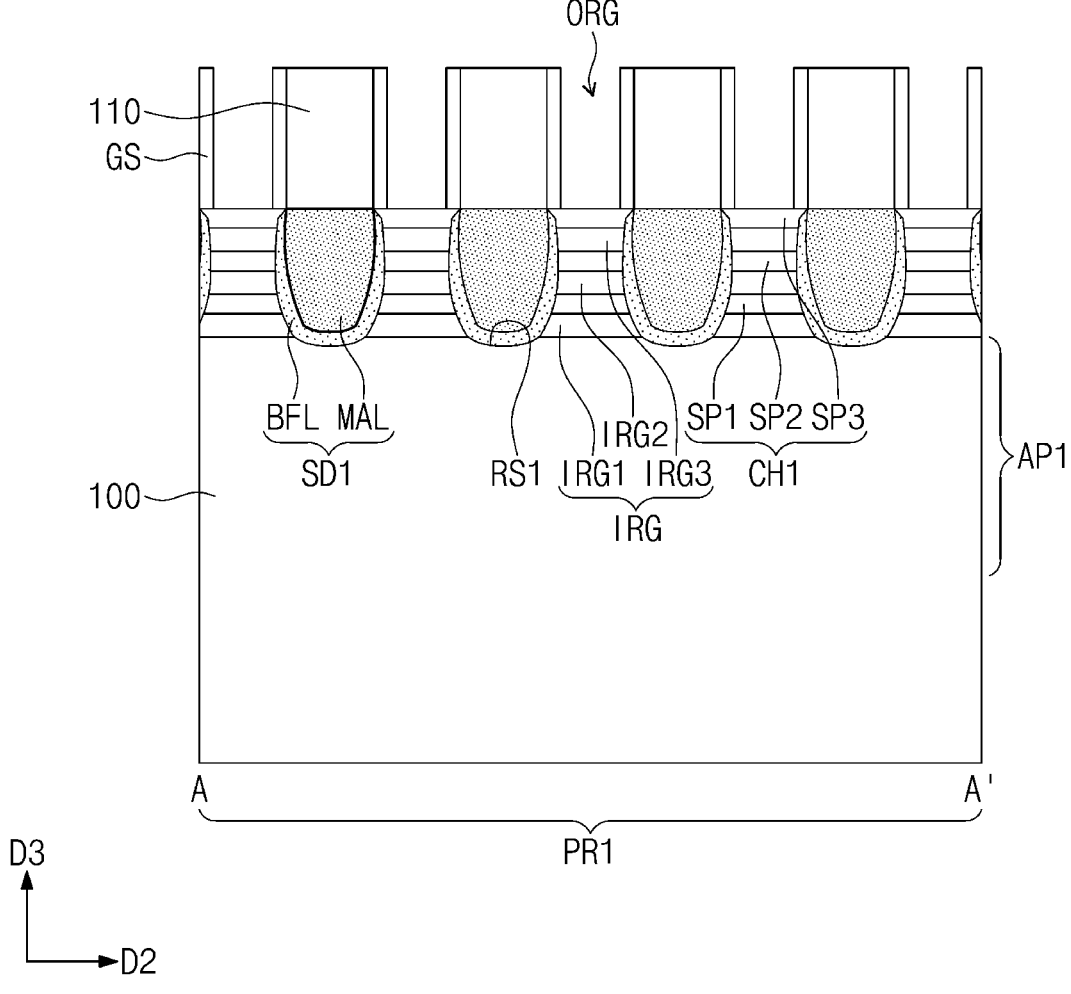
Figure 11B:
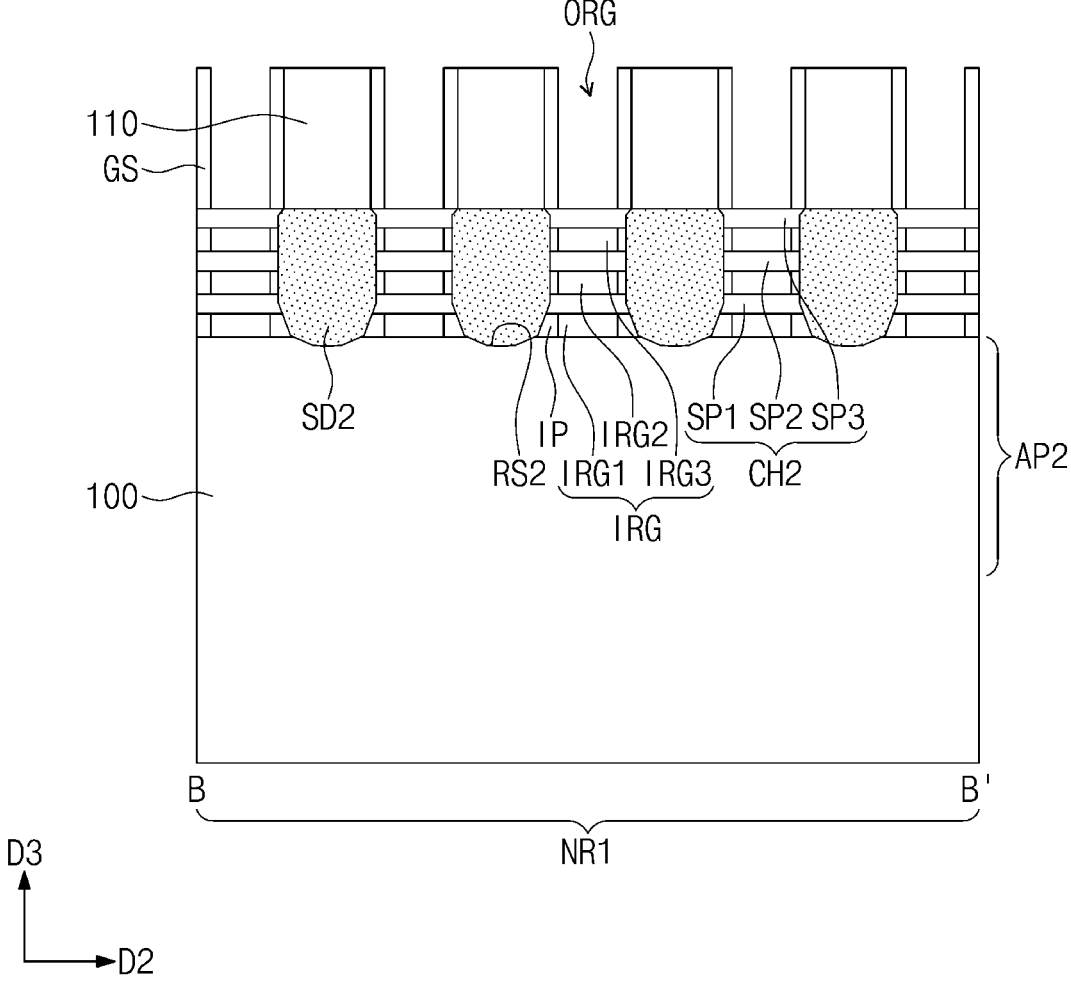
Figure 11C:
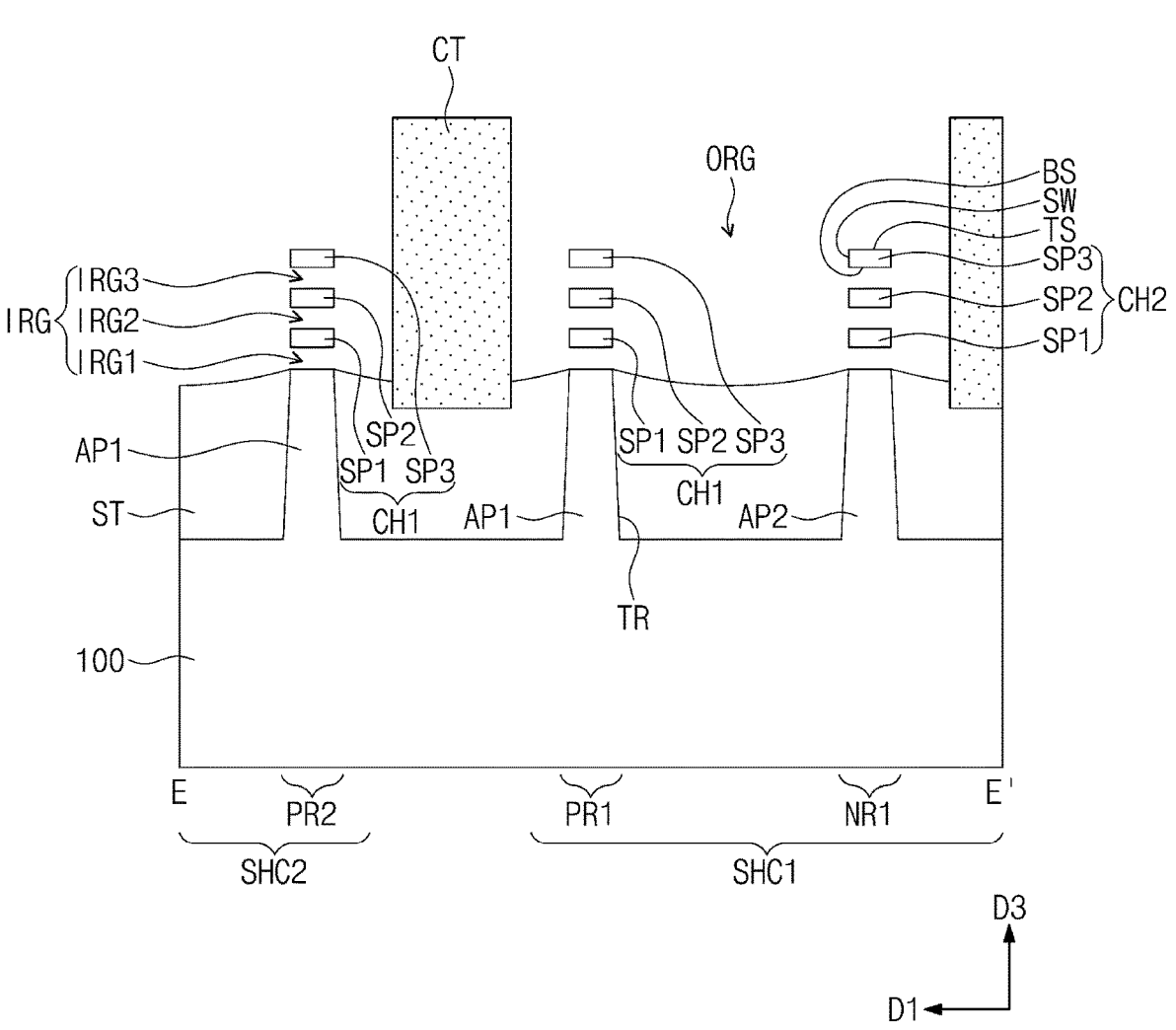
Figure 12A:
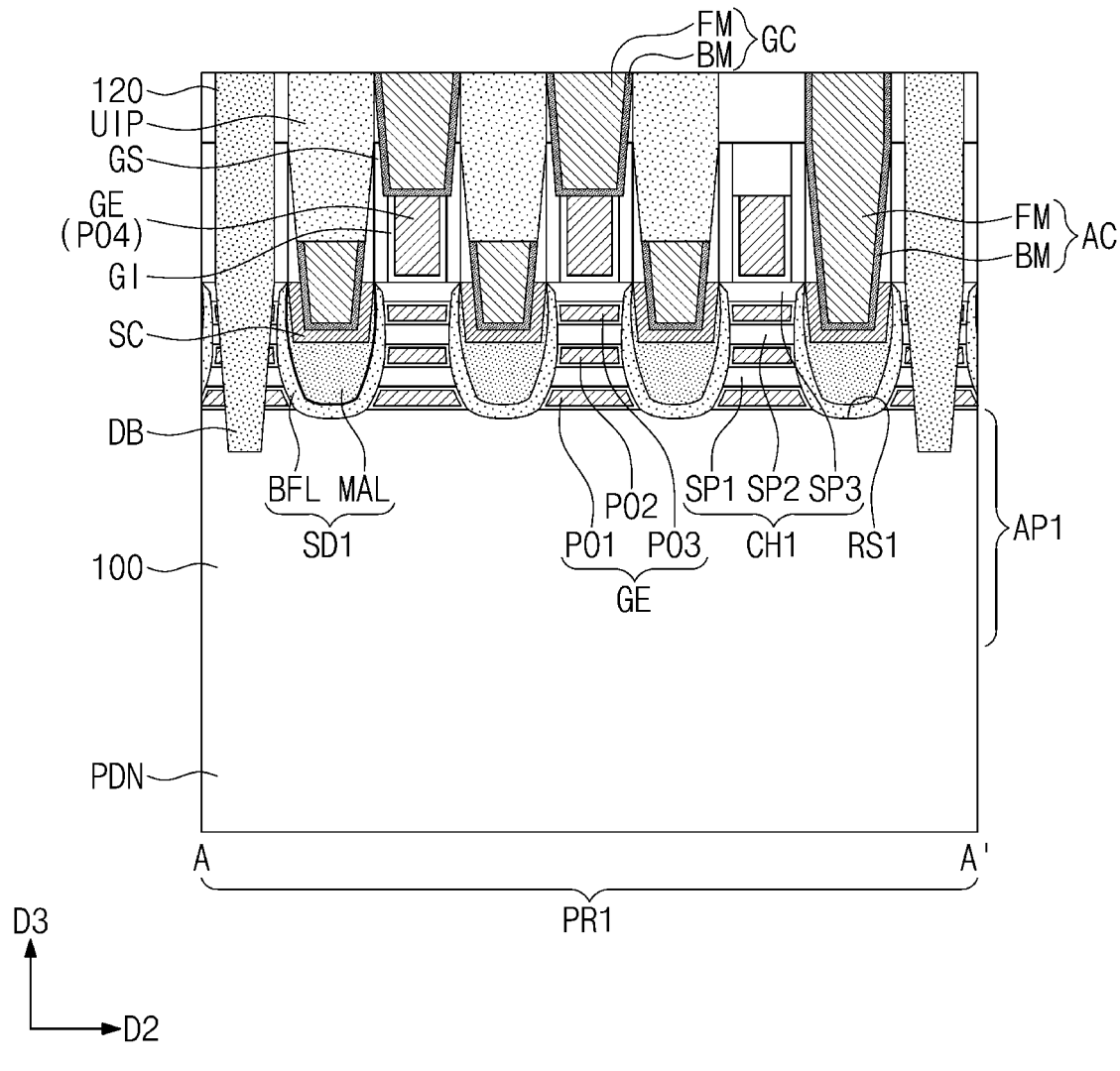
Figure 12B:
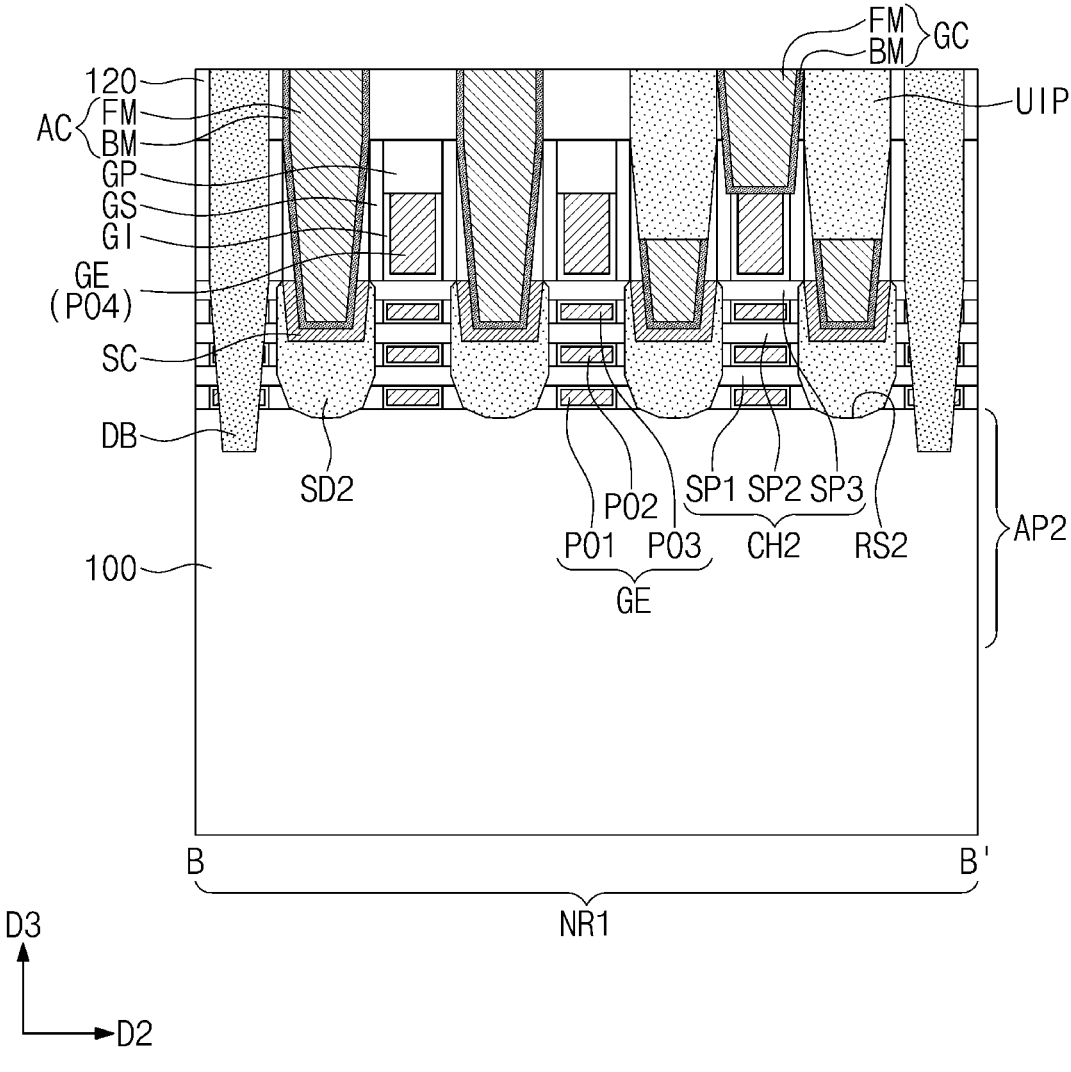
Figure 12C:
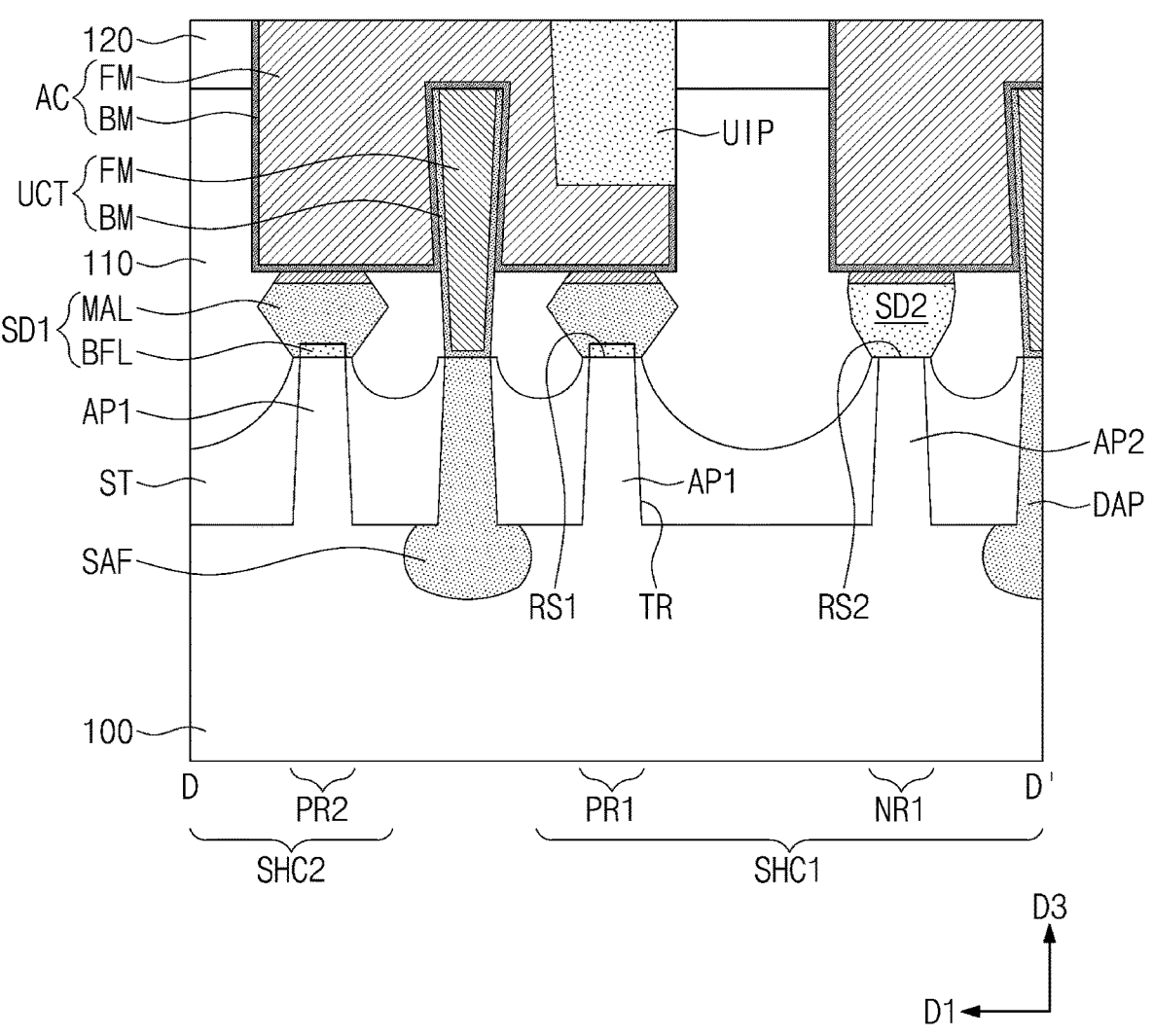
Figure 12D:
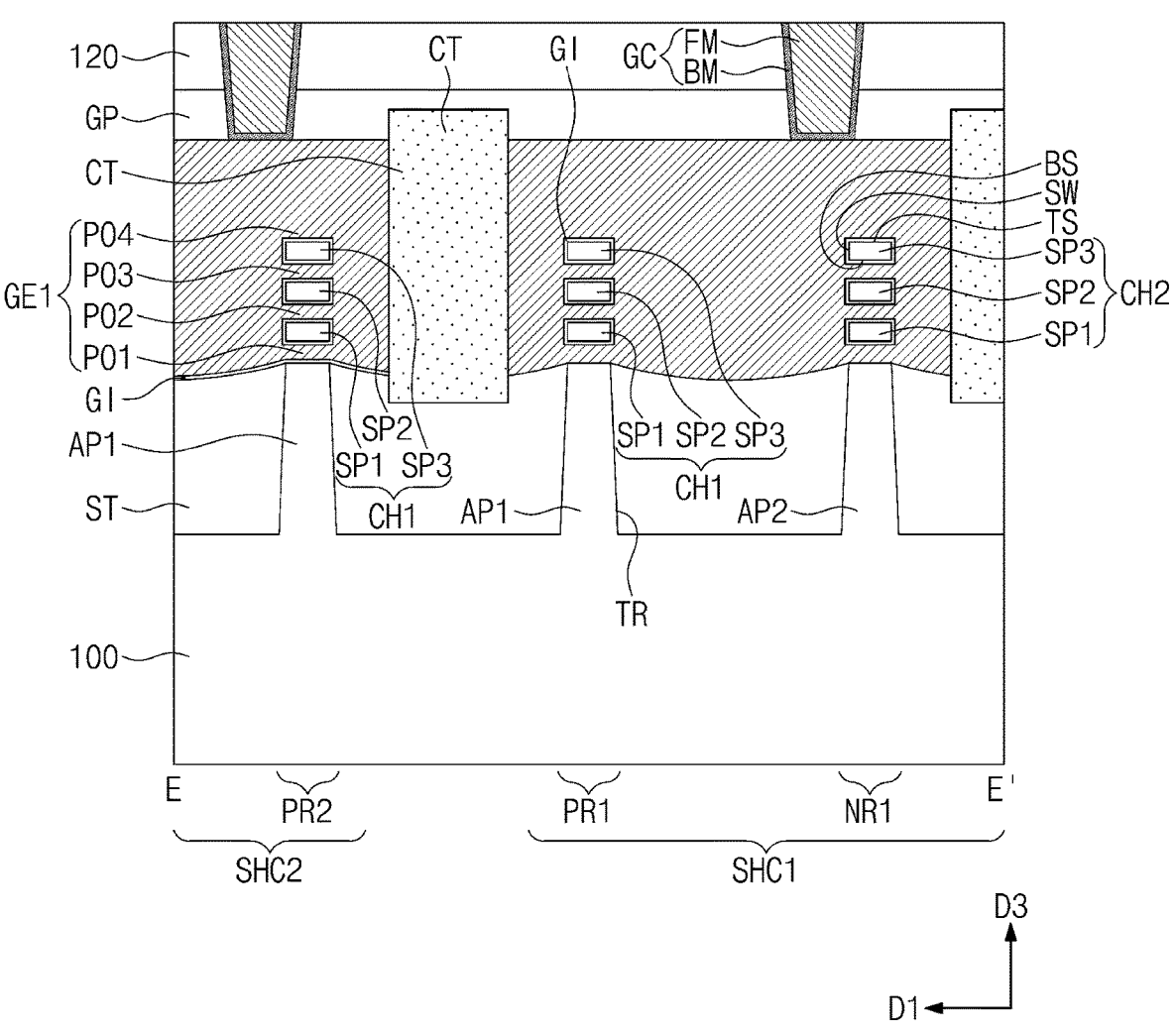

FIGS. 6A to 12D are cross-sectional views illustrating a method of manufacturing a semiconductor device according to some embodiments of the inventive concepts. More particularly, FIGS. 6A, 7A, 8A, 9A, 10A, 11A and 12A are cross-sectional views corresponding to the line A-A' of FIG. 4. FIGS. 8B, 9B, 10B, 11B and 12B are cross-sectional views corresponding to the line B-B' of FIG. 4. FIGS. 6B, 8C, 9C, 10C and 12C are cross-sectional views corresponding to the line D-D' of FIG. 4. FIGS. 7B, 11C and 12D are cross-sectional views corresponding to the line E-E' of FIG. 4.

Figure 6A:
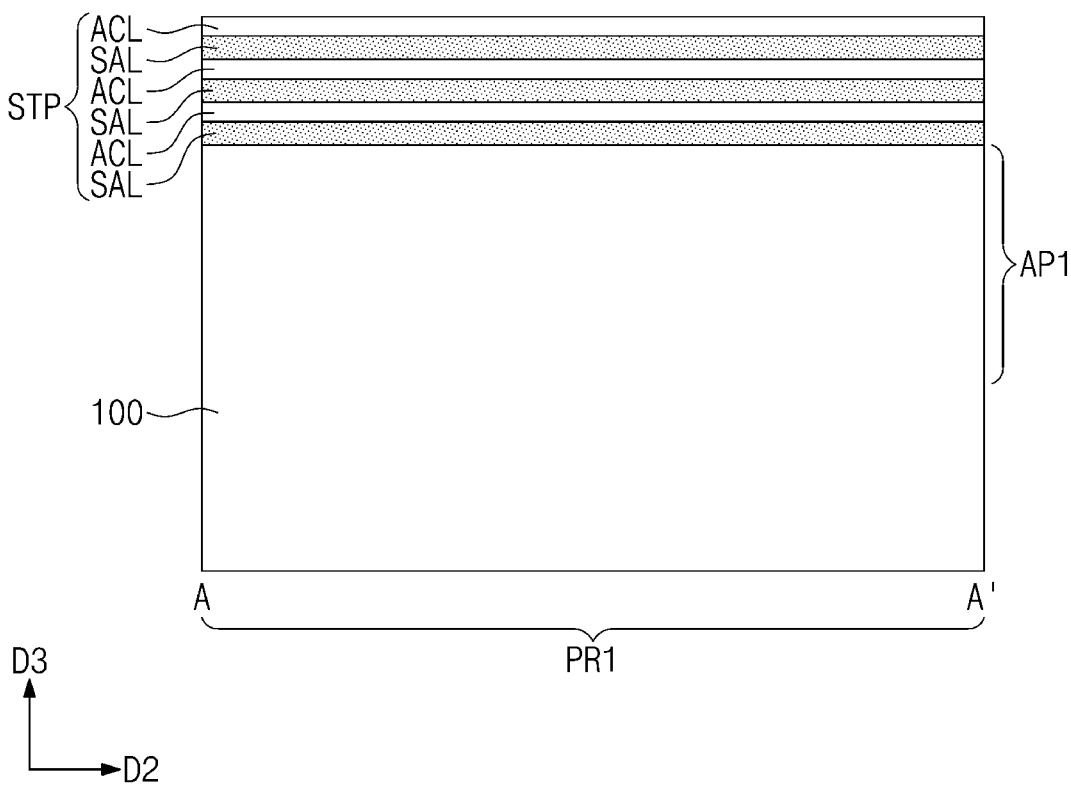
FIGS. 6A to 12D are cross-sectional views illustrating a method of manufacturing a semiconductor device according to some embodiments of the inventive concepts.
Figure 6B:
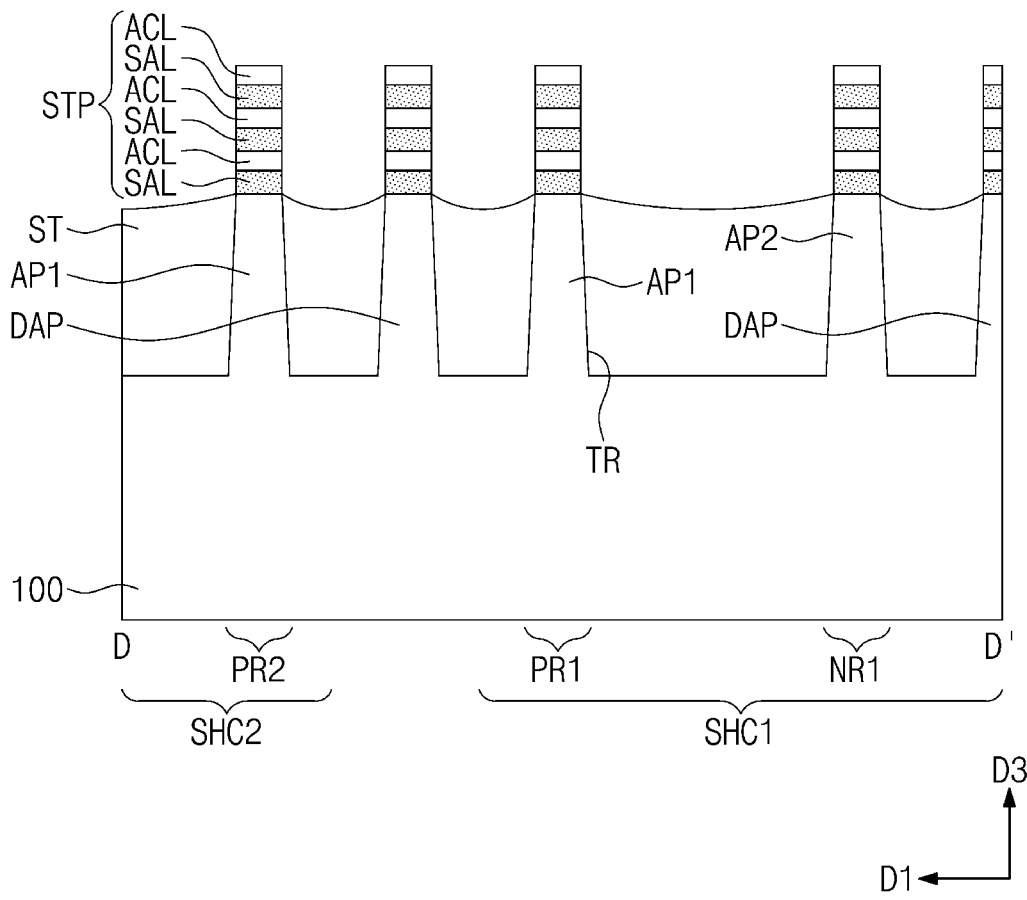

Referring to FIGS. 6A and 6B, a substrate 100 including first and second PMOSFET regions PR1 and PR2 and first and second NMOSFET regions NR1 and NR2 may be provided. First semiconductor layers ACL and second semiconductor layers SAL may be alternately formed on the substrate 100. The first semiconductor layers ACL may include one of silicon (Si), germanium (Ge) and silicon-germanium (SiGe), and the second semiconductor layers SAL may include another of silicon (Si), germanium (Ge) and silicon-germanium (SiGe).

The second semiconductor layer SAL may include a material having an etch selectivity with respect to the first semiconductor layer ACL. For example, the first semiconductor layers ACL may include silicon (Si), and the second semiconductor layers SAL may include silicon-germanium (SiGe). A concentration of germanium (Ge) of each of the second semiconductor layers SAL may range from 10 at % to 30 at %.

Mask patterns may be formed on the first and second PMOSFET regions PR1 and PR2 and the first and second NMOSFET regions NR1 and NR2 of the substrate 100, respectively. Each of the mask patterns may have a line shape or bar shape extending in the second direction D2.

A patterning process may be performed using the mask patterns as etch masks to form a trench TR defining a first active pattern AP1 and a second active pattern AP2. The first active pattern AP1 may be formed on each of the first and second PMOSFET regions PR1 and PR2. The second active pattern AP2 may be formed on each of the first and second NMOSFET regions NR1 and NR2. The first and second active patterns AP1 and AP2 may have line shapes extending in the second direction D2 in parallel to each other when viewed in a plan view.

In some embodiments of the inventive concepts, the patterning process may further include forming at least one dummy pattern DAP. For example, the dummy pattern DAP may be formed between the first and second PMOSFET regions PR1 and PR2. Unlike the first and second active patterns AP1 and AP2 described above, the dummy pattern DAP may have a pillar shape (or a contact shape). In other words, the dummy pattern DAP may have an island shape, not a line shape, when viewed from a plan perspective. The dummy pattern DAP may define a position and a shape of the lower contact portion LCP described with reference to FIGS. 4 and 5D.

A stack pattern STP may be formed on each of the first and second active patterns AP1 and AP2. The stack pattern STP may include the first semiconductor layers ACL and the second semiconductor layers SAL, which are alternately stacked. The stack patterns STP may be formed together with the first and second active patterns AP1 and AP2 in the patterning process. The stack pattern STP may also be formed on the dummy pattern DAP.

A device isolation layer ST filling the trench TR may be formed. For example, an insulating layer covering the first and second active patterns AP1 and AP2 and the stack patterns STP may be formed on an entire top surface of the substrate 100. The insulating layer may be recessed until the stack patterns STP are exposed, thereby forming the device isolation layer ST. The device isolation layer ST may include an insulating material (e.g., silicon oxide). The stack patterns STP may be exposed above the device isolation layer ST. In other words, the stack patterns STP may vertically protrude above the device isolation layer ST.

Figure 7A:
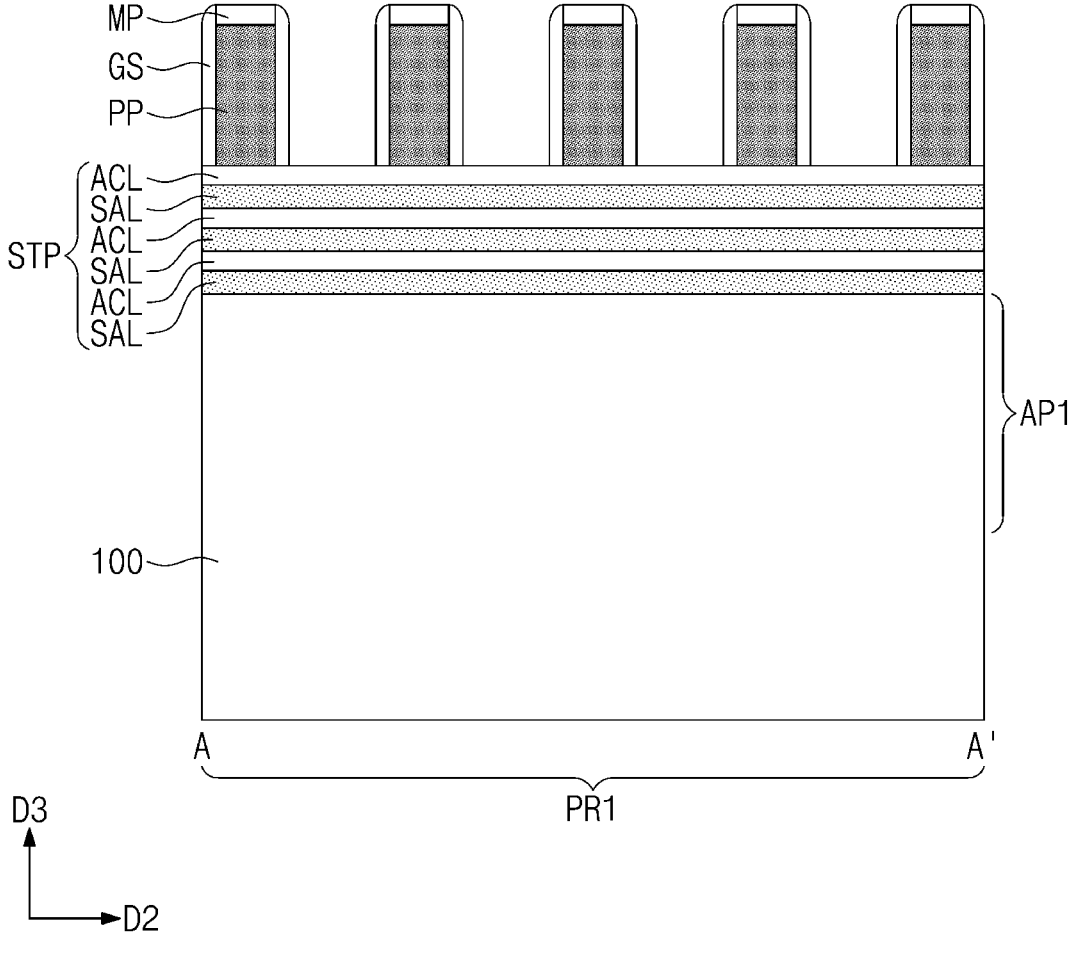
Figure 7B:
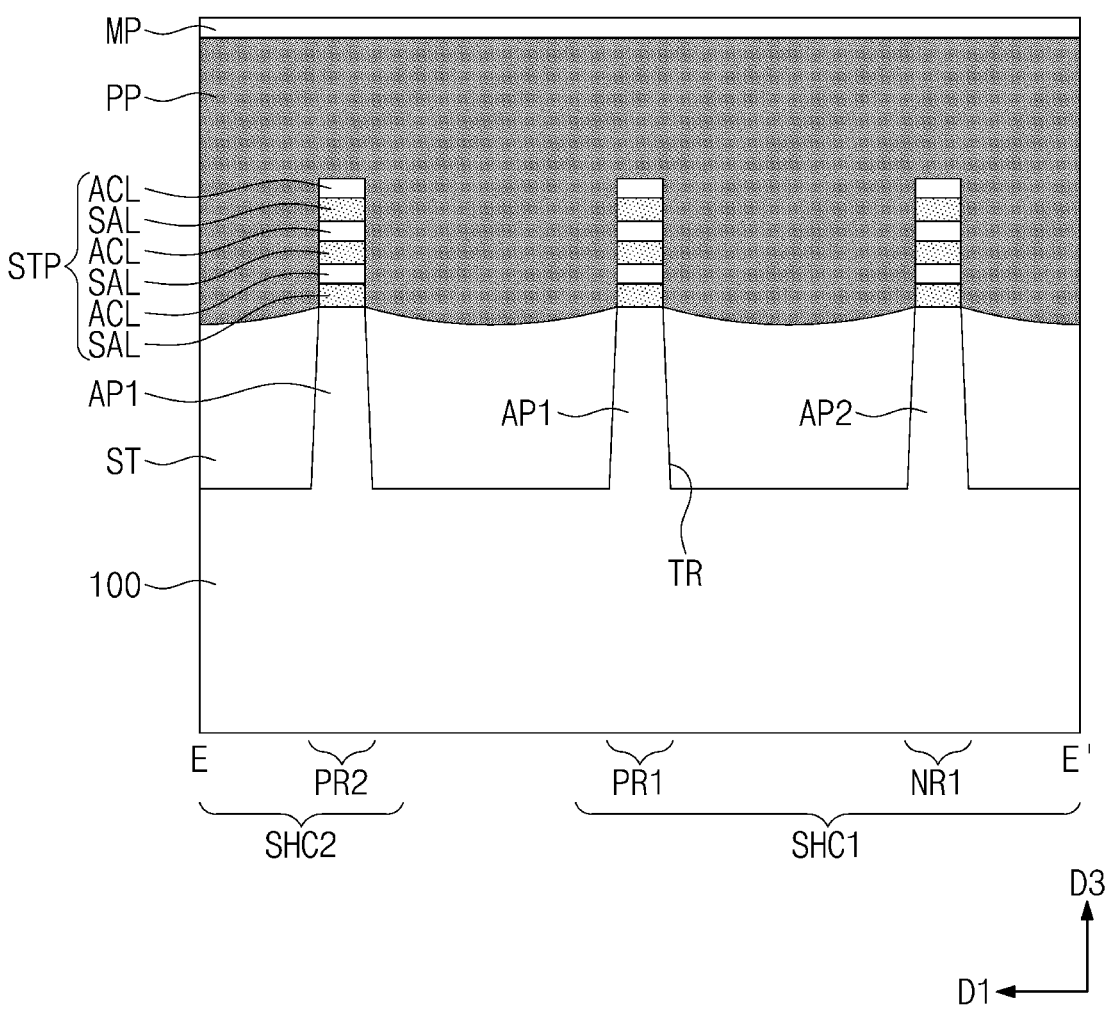

Referring to FIGS. 7A and 7B, sacrificial patterns PP intersecting the stack patterns STP may be formed on the substrate 100. Each of the sacrificial patterns PP may be formed to have a line shape or bar shape extending in the first direction D1. The sacrificial patterns PP may be arranged at a first pitch in the second direction D2. For example, the formation of the sacrificial patterns PP may include forming a sacrificial layer on an entire top surface of the substrate 100, forming hard mask patterns MP on the sacrificial layer, and patterning the sacrificial layer using the hard mask patterns MP as etch masks. The sacrificial layer may include poly-silicon.

A pair of gate spacers GS may be formed on both sidewalls of each of the sacrificial patterns PP, respectively. The formation of the gate spacers GS may include conformally forming a gate spacer layer on an entire top surface of the substrate 100, and anisotropically etching the gate spacer layer. The gate spacer layer may include at least one of SiCN, SiCON, or SiN. In certain embodiments, the gate spacer layer may be formed of a multi-layer including at least two of SiCN, SiCON, or SiN.

Figure 8A:
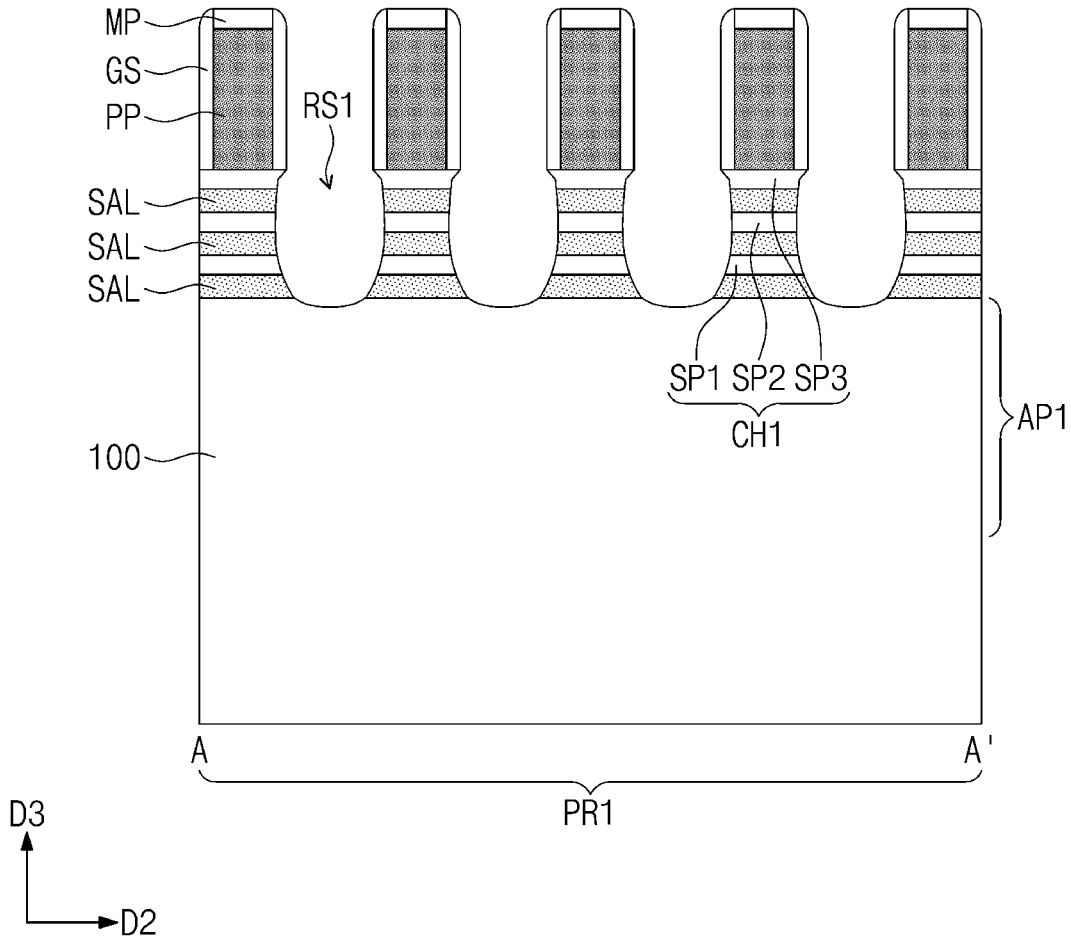
Figure 8B:
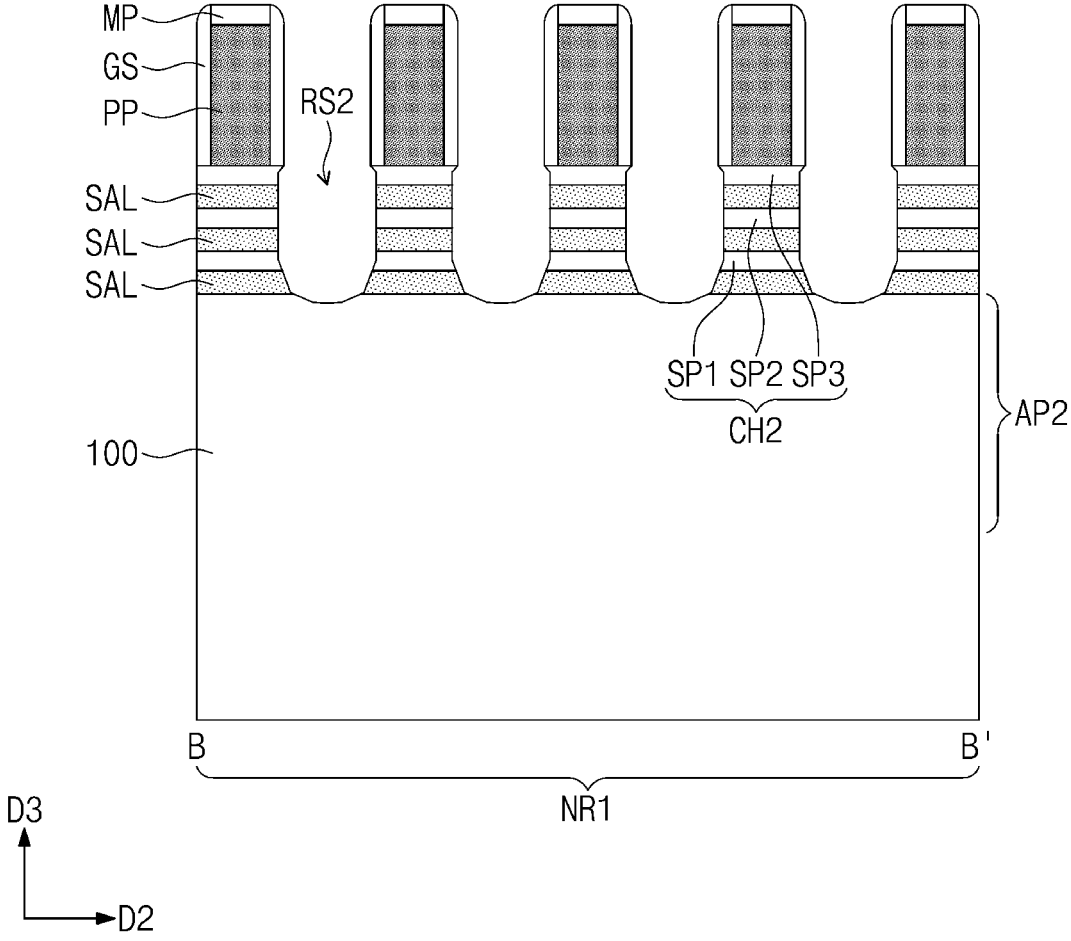
Figure 8C:
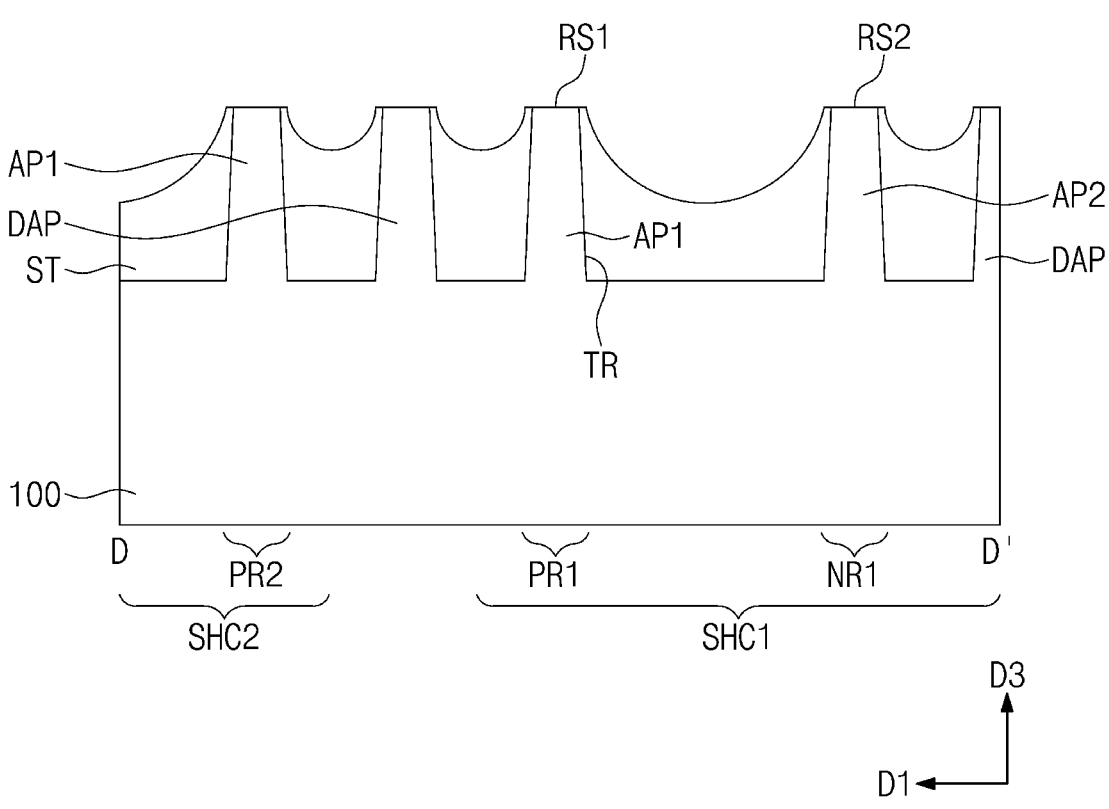

Referring to FIGS. 8A to 8C, first recesses RS1 may be formed in the stack pattern STP on the first active pattern AP1. Second recesses RS2 may be formed in the stack pattern STP on the second active pattern AP2. The device isolation layer ST at both sides of each of the first and second active patterns AP1 and AP2 may be further recessed during the formation of the first and second recesses RS1 and RS2 (see FIG. 8C). The stack pattern STP on the dummy pattern DAP may be removed during the formation of the first and second recesses RS1 and RS2.

More particularly, the stack pattern STP on the first active pattern AP1 may be etched using the hard mask patterns MP and the gate spacers GS as etch masks to form the first recesses RS1. The first recess RS1 may be formed between a pair of the sacrificial patterns PP. The second recesses RS2 in the stack pattern STP on the second active pattern AP2 may be formed by the same method as the first recesses RS1.

First to third semiconductor patterns SP1, SP2 and SP3 stacked sequentially may be formed from the first semiconductor layers ACL between the first recesses RS1 adjacent to each other. First to third semiconductor patterns SP1, SP2 and SP3 stacked sequentially may be formed from the first semiconductor layers ACL between the second recesses RS2 adjacent to each other. The first to third semiconductor patterns SP1, SP2 and SP3 between the first recesses RS1 adjacent to each other may constitute a first channel pattern CH1. The first to third semiconductor patterns SP1, SP2 and SP3 between the second recesses RS2 adjacent to each other may constitute a second channel pattern CH2.

Figure 9A:
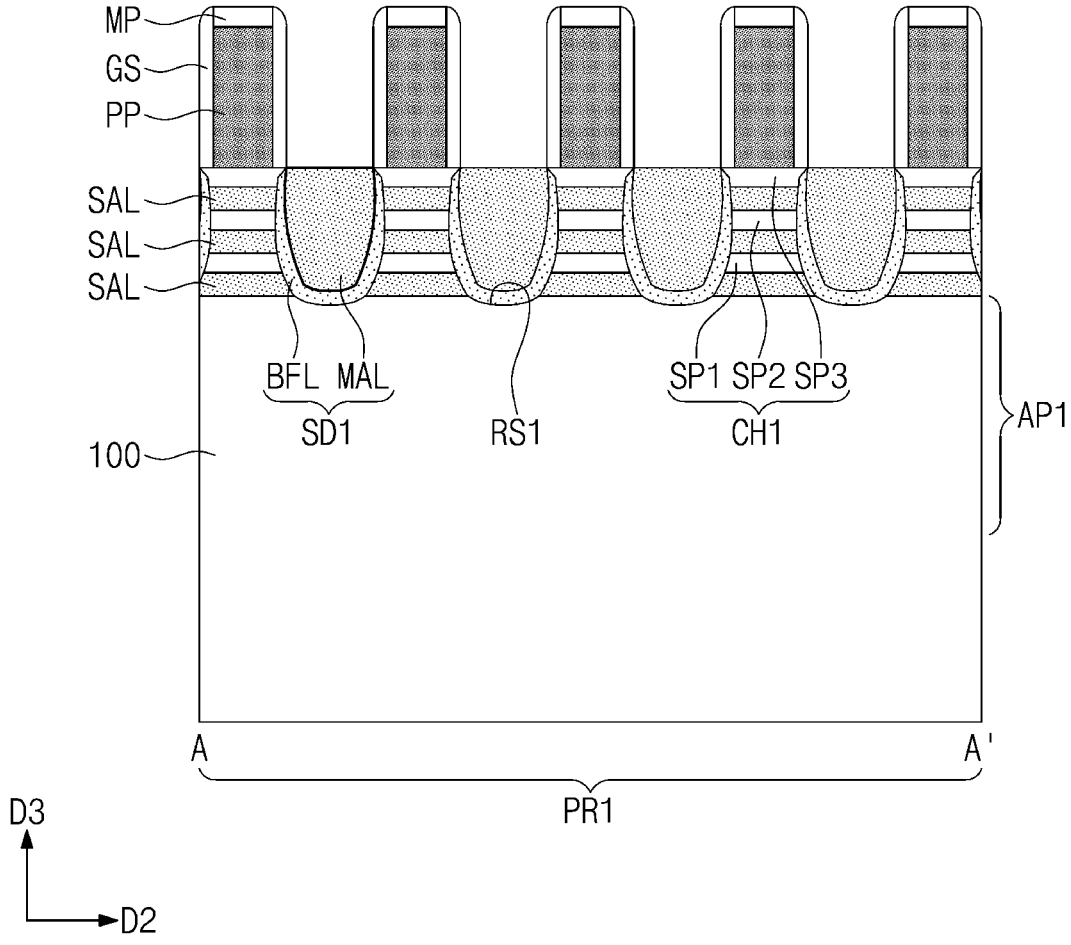
Figure 9B:
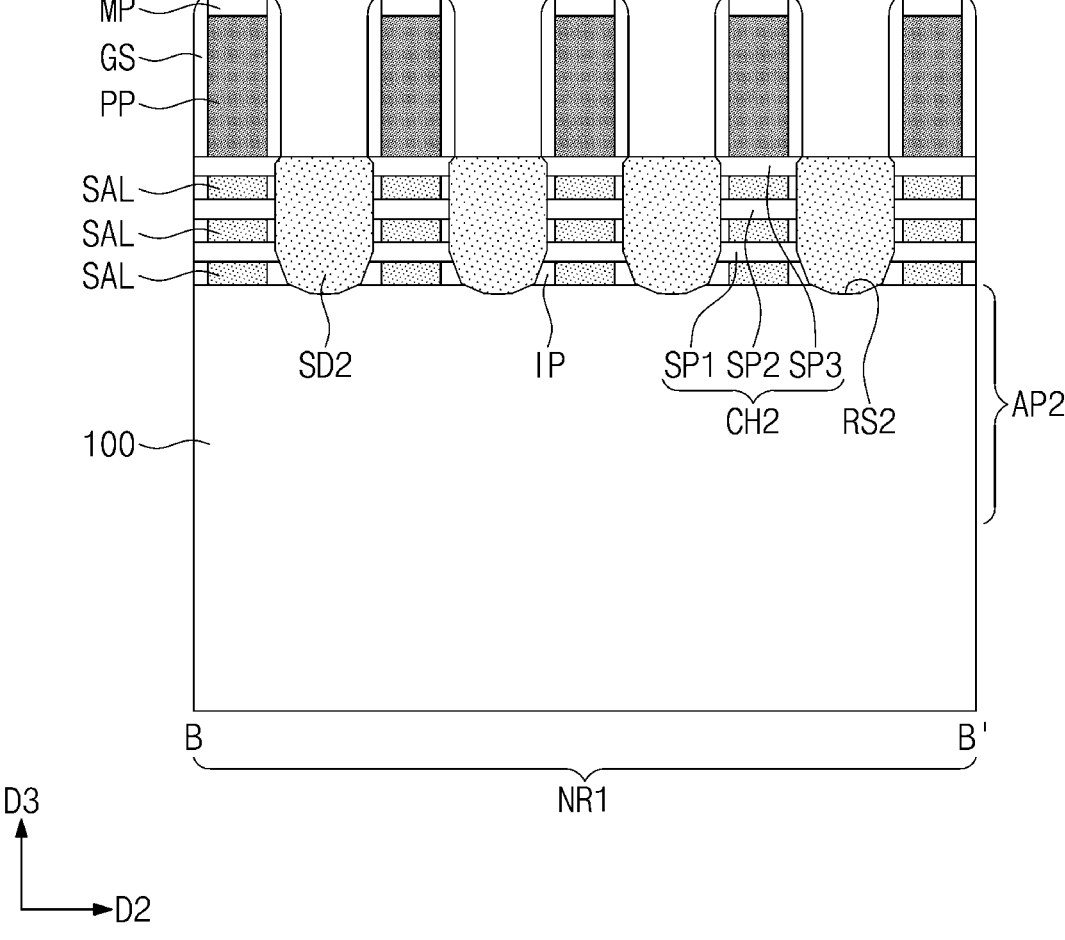
Figure 9C:
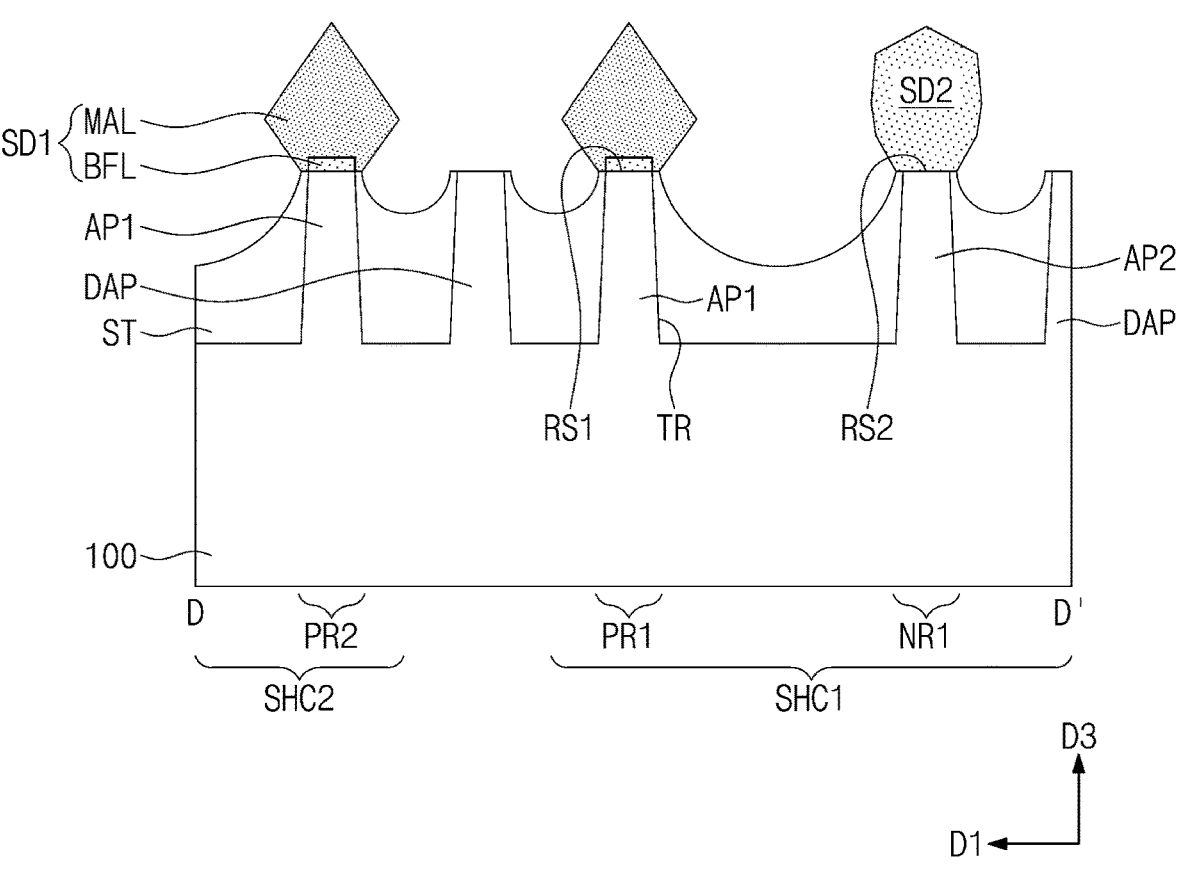

Referring to FIGS. 9A to 9C, first source/drain patterns SD1 may be formed in the first recesses RS1, respectively. For example, a first selective epitaxial growth (SEG) process may be performed using an inner surface of the first recess RS1 as a seed layer to form a buffer layer BFL. The buffer layer BFL may be grown using the first to third semiconductor patterns SP1, SP2 and SP3 and the substrate 100 exposed by the first recess RS1 as a seed. For example, the first SEG process may include a chemical vapor deposition (CVD) process or a molecular beam epitaxy (MBE) process.

The buffer layer BFL may include a semiconductor element (e.g., SiGe) of which a lattice constant is greater than a lattice constant of a semiconductor element of the substrate 100. The buffer layer BFL may contain a relatively low concentration of germanium (Ge). In certain embodiments of the inventive concepts, the buffer layer BFL may contain silicon (Si) except germanium (Ge). A concentration of germanium (Ge) of the buffer layer BFL may range from 0 at % to 10 at %.

A second SEG process may be performed on the buffer layer BFL to form a main layer MAL. The main layer MAL may be formed to completely or almost fill the first recess RS1. The main layer MAL may contain a relatively high concentration of germanium (Ge). For example, a concentration of germanium (Ge) of the main layer MAL may range from 30 at % to 70 at %.

In some embodiments of the inventive concepts, a third SEG process may be performed on the main layer MAL to form a capping layer. The capping layer may include silicon (Si). A concentration of silicon (Si) of the capping layer may range from 98 at % to 100 at %.

Dopants (e.g., boron, gallium or indium) for allowing the first source/drain pattern SD1 to have a p-type may be injected in-situ during the formation of the buffer layer BFL and the main layer MAL. Alternatively, after the formation of the first source/drain pattern SD1, dopants may be injected or implanted into the first source/drain pattern SD1.

Second source/drain patterns SD2 may be formed in the second recesses RS2, respectively. For example, the second source/drain pattern SD2 may be formed by performing a SEG process using an inner surface of the second recess RS2 as a seed layer. For example, the second source/drain pattern SD2 may include the same semiconductor element (e.g., Si) as the substrate 100. Dopants (e.g., phosphorus, arsenic or antimony) for allowing the second source/drain pattern SD2 to have an n-type may be injected in-situ during the formation of the second source/drain pattern SD2. Alternatively, after the formation of the second source/drain pattern SD2, dopants may be injected or implanted into the second source/drain pattern SD2.

In some embodiments of the inventive concepts, before the formation of the second source/drain pattern SD2, portions of the second semiconductor layers SAL exposed by the second recess RS2 may be replaced with an insulating material to form inner spacers IP. As a result, the inner spacers IP may be formed between the second source/drain pattern SD2 and the second semiconductor layers SAL, respectively.

In some embodiments of the inventive concepts, a source/drain pattern (i.e., an epitaxial pattern) may not be formed on the dummy pattern DAP. A mask pattern may be provided on the dummy pattern DAP during the formation of the first and second source/drain patterns SD1 and SD2. In certain embodiments of the inventive concepts, an epitaxial pattern may be formed on the dummy pattern DAP.

Referring to FIGS. 10A to 10C, a first interlayer insulating layer 110 may be formed to cover the first and second source/drain patterns SD1 and SD2, the hard mask patterns MP and the gate spacers GS. For example, the first interlayer insulating layer 110 may include a silicon oxide layer. The first interlayer insulating layer 110 may be planarized to expose top surfaces of the sacrificial patterns PP. The planarization of the first interlayer insulating layer 110 may be performed using an etch-back process or a chemical mechanical polishing (CMP) process. The hard mask patterns MP may be completely removed during the planarization process. As a result, a top surface of the first interlayer insulating layer 110 may be substantially coplanar with the top surfaces of the sacrificial patterns PP and top surfaces of the gate spacers GS. An upper contact UCT may be formed on the dummy pattern DAP. The dummy pattern DAP may be replaced with a sacrificial pillar SAF. The upper contact UCT may be in contact with the sacrificial pillar SAF. The upper contact UCT and the sacrificial pillar SAF may be formed to be aligned with each other.

Figure 13:
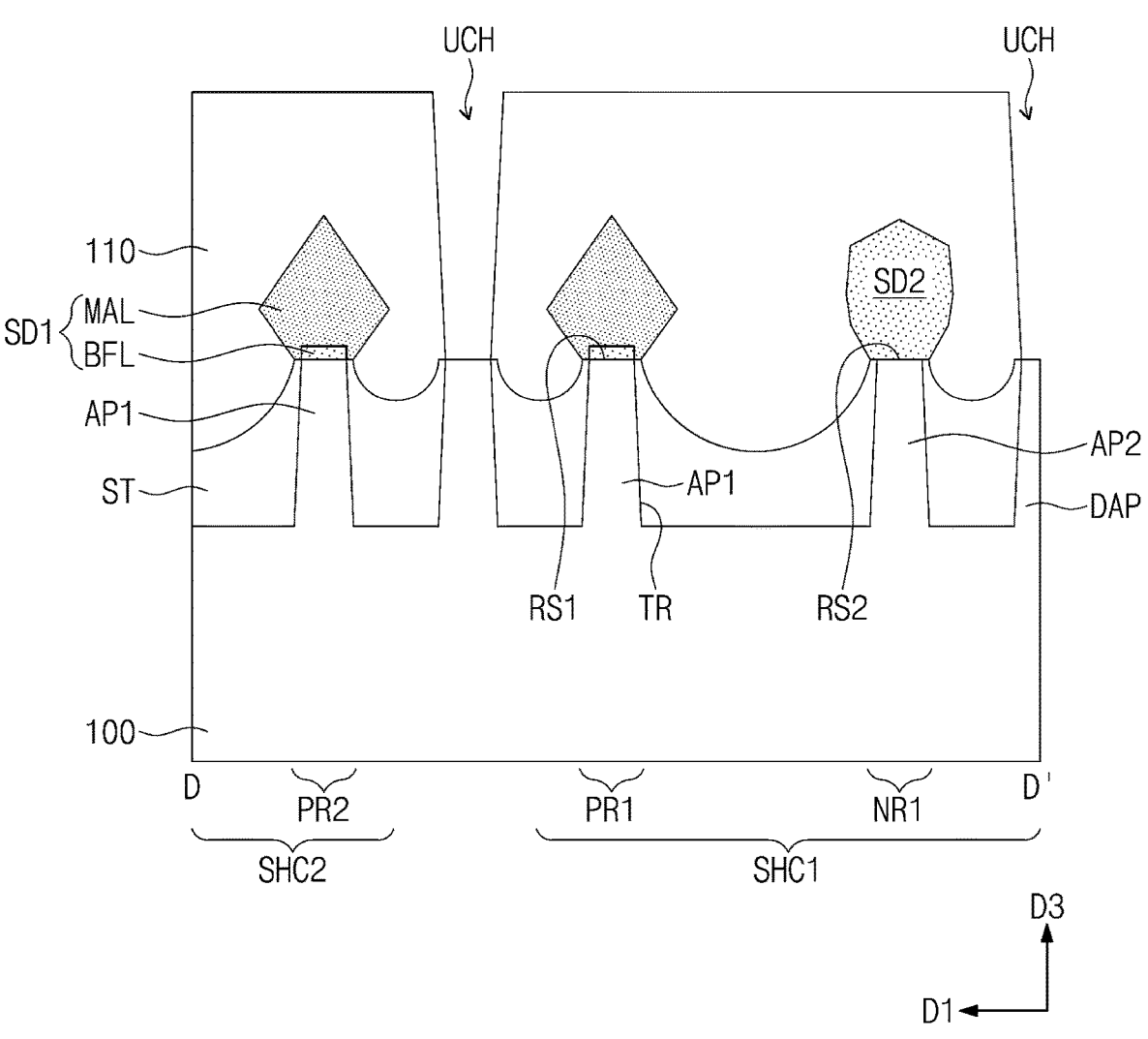
FIGS. 13 and 14 are cross-sectional views illustrating a method of forming an upper contact and a sacrificial pillar of FIG. 10C.
Figure 14:
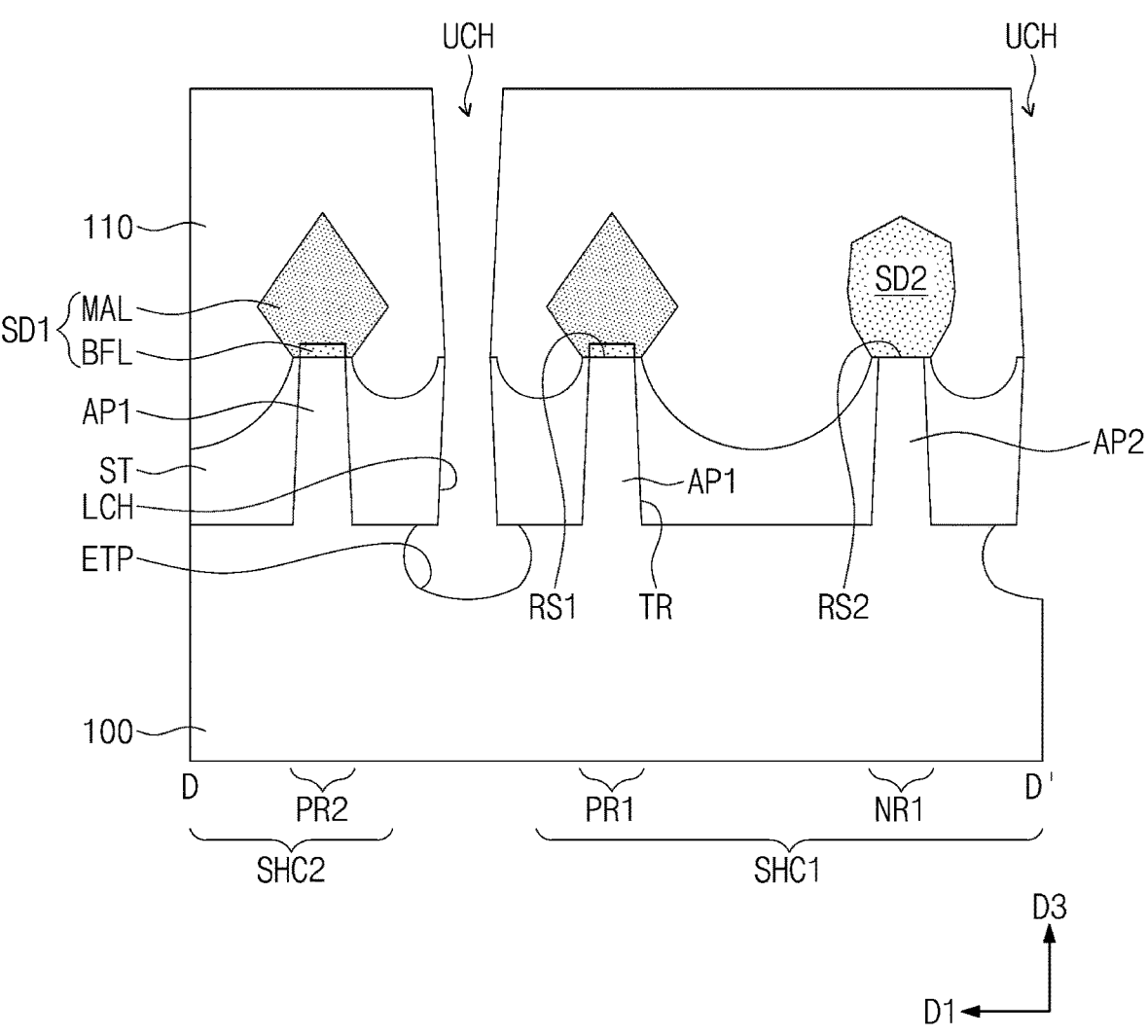

FIGS. 13 and 14 are cross-sectional views illustrating a method of forming an upper contact and a sacrificial pillar of FIG. 10C. Referring to FIG. 13, an upper contact hole UCH exposing the dummy pattern DAP may be formed to penetrate the first interlayer insulating layer 110. The upper contact hole UCH may be formed to vertically overlap with the dummy pattern DAP. A diameter of the upper contact hole UCH may become progressively less toward the dummy pattern DAP. Referring to FIG. 14, a selective etching process may be performed on the dummy pattern DAP exposed by the upper contact hole UCH, thereby completely removing the dummy pattern DAP. The selective etching process may include a wet etching process of selectively etching silicon (Si). A lower contact hole LCH may be formed by the removal of the dummy pattern DAP. The lower contact hole LCH may be connected to the upper contact hole UCH.

The wet etching process may be performed to over-etch an upper portion of the substrate 100. Thus, an expanded region ETP may be formed in the upper portion of the substrate 100. The upper contact hole UCH, the lower contact hole LCH and the expanded region ETP may be connected to each other.

Referring again to FIG. 10C, a SEG process may be performed on the substrate 100 to form the sacrificial pillar SAF filling the expanded region ETP and the lower contact hole LCH. The sacrificial pillar SAF may be formed of a semiconductor material having an etch selectivity with respect to silicon (Si). For example, the sacrificial pillar SAF may include silicon-germanium (SiGe) or germanium (Ge).

The upper contact hole UCH may be filled with a conductive material to form the upper contact UCT. The formation of the upper contact UCT may include forming a barrier pattern BM in the upper contact hole UCH, and forming a conductive pattern FM on the barrier pattern BM.

Referring to FIGS. 11A to 11C, a region of the sacrificial pattern PP may be selectively opened using a photolithography process. For example, regions of the sacrificial pattern PP on the third and fourth boundaries BD3 and BD4 of the first single height cell SHC1 may be selectively opened. The opened region of the sacrificial pattern PP may be selectively etched and thus may be removed. A space formed by the removal of the sacrificial pattern PP may be filled with an insulating material to form a gate cutting pattern CT (see FIG. 11C).

Remaining exposed portions of the sacrificial patterns PP may be selectively removed. An outer region ORG exposing the first and second channel patterns CH1 and CH2 may be formed by the removal of the sacrificial pattern PP (see FIG. 11C). The removal of the sacrificial patterns PP may include performing a wet etching process using an etching solution capable of selectively etching poly-silicon.

The second semiconductor layers SAL exposed through the outer region ORG may be selectively removed to form inner regions IRG (see FIG. 11C). For example, an etching process of selectively etching the second semiconductor layers SAL may be performed to remove the second semiconductor layers SAL while leaving the first to third semiconductor patterns SP1, SP2 and SP3. The etching process may have a high etch rate with respect to silicon-germanium having a relatively high germanium concentration. For example, the etching process may have a high etch rate with respect to silicon-germanium having a germanium concentration greater than 10 at %.

The second semiconductor layers SAL on the first and second PMOSFET regions PR1 and PR2 and the first and second NMOSFET regions NR1 and NR2 may be completely removed during the etching process. The etching process may be a wet etching process. An etching material used in the etching process may quickly remove the second semiconductor layer SAL having a relatively high germanium concentration. Meanwhile, the first source/drain patterns SD1 on the first and second PMOSFET regions PR1 and PR2 may be protected by the buffer layer BFL having a relatively low germanium concentration during the etching process.

Referring again to FIG. 11C, since the second semiconductor layers SAL are selectively removed, the stacked first to third semiconductor patterns SP1, SP2 and SP3 may remain on each of the first and second active patterns AP1 and AP2. First to third inner regions IRG1, IRG2 and IRG3 may be formed by the removal of the second semiconductor layers SAL.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 12A to 12D, a gate insulating layer GI may be conformally formed on the exposed first to third semiconductor patterns SP1, SP2 and SP3. A gate electrode GE may be formed on the gate insulating layer GI. The gate electrode GE may include first to third portions PO1, PO2 and PO3 formed in the first to third inner regions IRG1, IRG2 and IRG3, respectively, and a fourth portion PO4 formed in the outer region ORG.

The gate electrode GE may be recessed to reduce its height. Upper portions of the gate cutting patterns CT may also be slightly recessed during the recessing of the gate electrode GE. A gate capping pattern GP may be formed on the recessed gate electrode GE.

A second interlayer insulating layer 120 may be formed on the first interlayer insulating layer 110. The second interlayer insulating layer 120 may include a silicon oxide layer. Active contacts AC may be formed to penetrate the second interlayer insulating layer 120 and the first interlayer insulating layer 110, and the active contacts AC may be electrically connected to the first and second source/drain patterns SD1 and SD2. A gate contact GC may be formed to penetrate the second interlayer insulating layer 120 and the gate capping pattern GP, and the gate contact GC may be electrically connected to the gate electrode GE.

The formation of each of the active contact AC and the gate contact GC may include forming a barrier pattern BM and forming a conductive pattern FM on the barrier pattern BM. The barrier pattern BM may be conformally formed and may include a metal layer/a metal nitride layer. The conductive pattern FM may include a low-resistance metal.

At least one active contact AC may be formed on the upper contact UCT (see FIG. 12C). The active contact AC may be directly connected to the upper contact UCT. The active contact AC may surround an upper portion of the upper contact UCT.

A pair of isolation structures DB may be formed at both sides of each of the first and second single height cells SHC1 and SHC2. The isolation structure DB may penetrate the second interlayer insulating layer 120 and the gate electrode GE and may extend into the active pattern AP1 or AP2. The isolation structure DB may include an insulating material such as silicon oxide or silicon nitride.

Referring again to FIGS. 4 and 5A to 5E, a third interlayer insulating layer 130 may be formed on the active contacts AC and the gate contacts GC. A first metal layer M1 may be formed in the third interlayer insulating layer 130. A fourth interlayer insulating layer 140 may be formed on the third interlayer insulating layer 130. A second metal layer M2 may be formed in the fourth interlayer insulating layer 140.

Lower power interconnection lines VPR1 to VPR3 may be formed in a lower portion of the substrate 100. Each of the lower power interconnection lines VPR1 to VPR3 may be electrically connected to a corresponding one of the active contacts AC through a corresponding one of the upper contacts UCT. A power delivery network layer PDN may be formed on a bottom surface 100b of the substrate 100. The power delivery network layer PDN may be formed to apply a source voltage or a drain voltage to each of the lower power interconnection lines VPR1 to VPR3.

Figure 15:
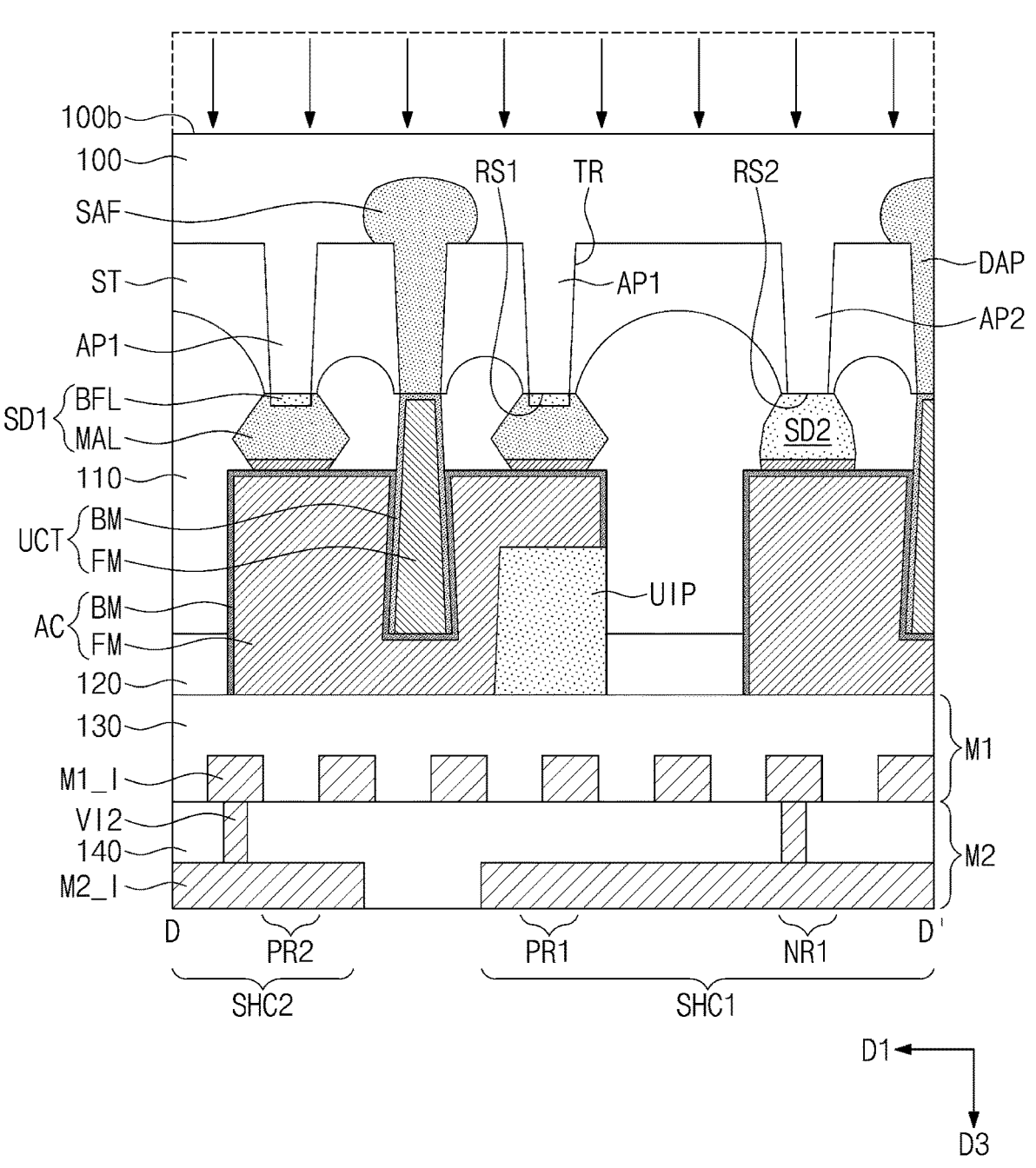
FIGS. 15 to 17 are cross-sectional views illustrating a method of forming a lower power interconnection line of FIG. 5D.
Figure 16:
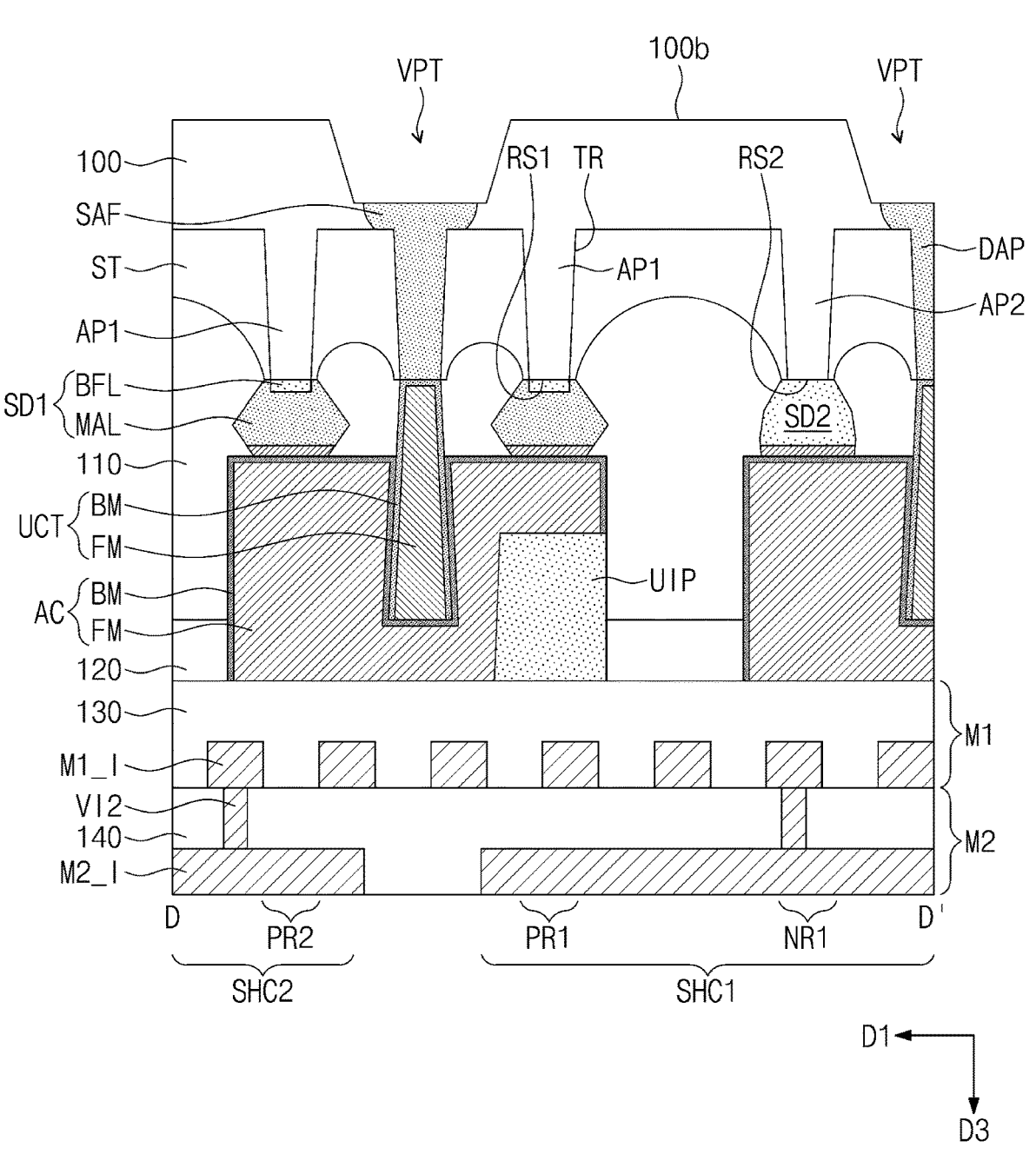
Figure 17:
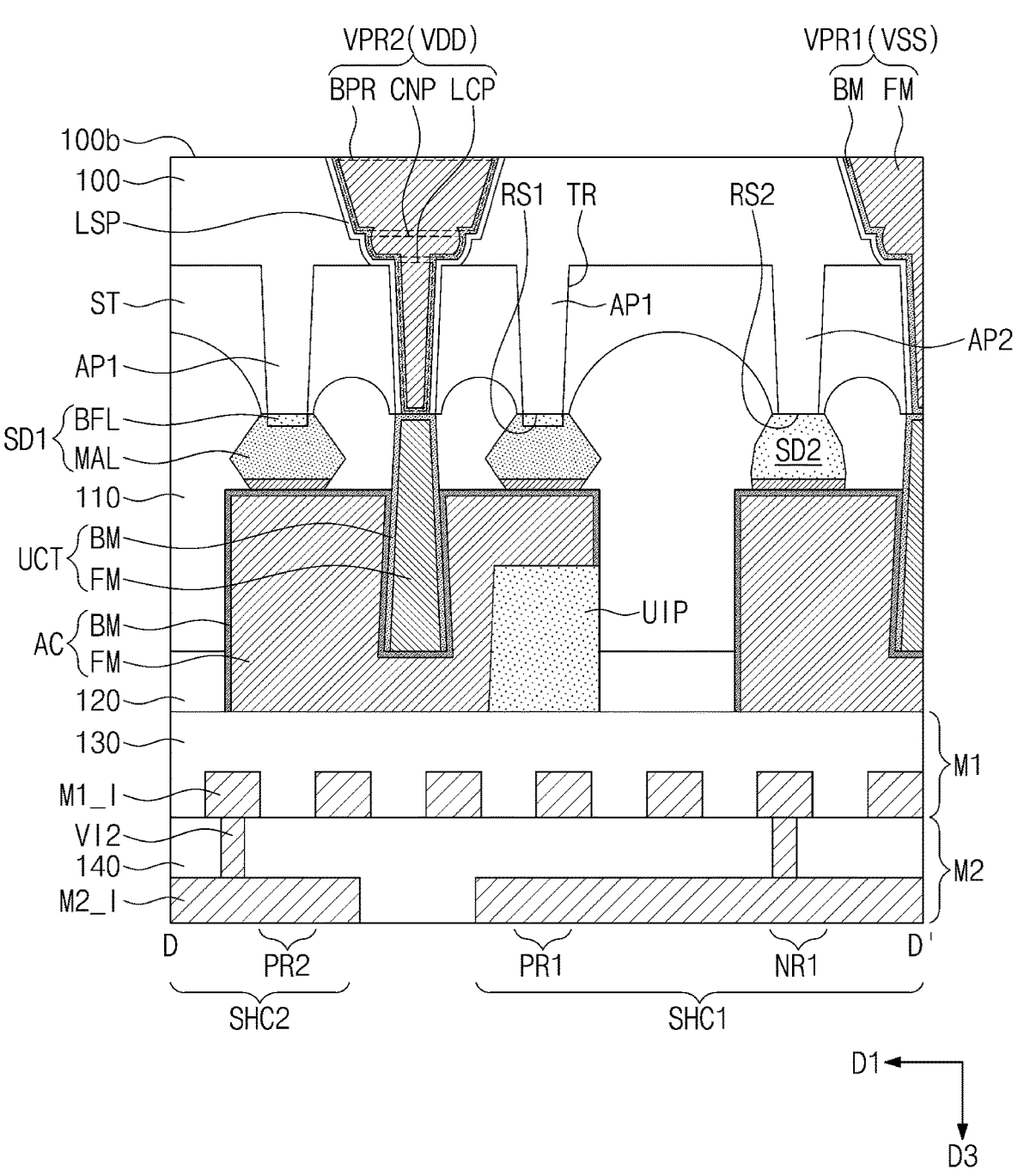

FIGS. 15 to 17 are cross-sectional views illustrating a method of forming a lower power interconnection line of FIG. 5D. Referring to FIG. 15, after a BEOL process is completed, the substrate 100 may be turned over to expose the bottom surface 100b of the substrate 100. A planarization process may be performed on the bottom surface 100b of the substrate 100 to reduce a thickness of the substrate 100. The planarization process may be stopped before a bottom of the sacrificial pillar SAF is exposed.

Referring to FIG. 16, a patterning process may be performed on the bottom surface 100b of the substrate 100 to form a plurality of lower interconnection line trenches VPT. Each of the lower interconnection line trenches VPT may be formed to expose the sacrificial pillar SAF. In other words, the lower interconnection line trench VPT may be formed to be aligned with the sacrificial pillar SAF. The lower interconnection line trench VPT may have a line shape extending in the second direction D2.

Referring to FIG. 17, the exposed sacrificial pillar SAF may be selectively removed to expose the lower contact hole LCH again. The selective removal of the sacrificial pillar SAF may include performing a wet etching process of selectively etching silicon-germanium (SiGe) or germanium (Ge). The lower contact hole LCH and the lower interconnection line trench VPT may be connected to each other. A lower spacer LSP may be formed in the lower interconnection line trench VPT and the lower contact hole LCH. For example, the formation of the lower spacer LSP may include conformally forming an insulating layer in the lower interconnection line trench VPT and the lower contact hole LCH by an atomic layer deposition (ALD) process, and performing an anisotropic etching process on the insulating layer.

The lower power interconnection lines VPR1 to VPR3 may be formed by filling the lower interconnection line trenches VPT and the lower contact holes LCH with a conductive material. For example, the formation of the lower power interconnection lines VPR1 to VPR3 may include forming barrier patterns BM in the lower interconnection line trenches VPT and the lower contact holes LCH, and forming conductive patterns FM on the barrier patterns BM.

The conductive material filling the lower interconnection line trench VPT may form a buried interconnection portion BPR extending in the second direction D2. The conductive material filling the lower contact hole LCH may form a lower contact portion LCP vertically extending from the buried interconnection portion BPR to the upper contact UCT. Thereafter, the power delivery network layer PDN may be formed on the bottom surface 100b of the substrate 100.

According to the embodiments of the inventive concepts, the lower contact portion LCP may be self-aligned with the upper contact UCT by using the dummy pattern DAP. Thus, misalignment between the lower contact portion LCP and the upper contact UCT may be prevented to improve reliability of the semiconductor device. The upper contact UCT and the lower contact portion LCP according to the inventive concepts may be separately formed by different processes. Thus, it is possible to prevent a process defect in which a vertical contact vertically connecting the buried interconnection portion BPR and the active contact AC is insufficiently filled with a metal.

Hereinafter, various embodiments of the inventive concepts will be described. In the following embodiments of the inventive concepts, the descriptions to the same technical features as mentioned with reference to FIGS. 4 to 5E will be omitted and differences between the following embodiments and the embodiments of FIGS. 4 to 5E will be mainly described, for the purpose of ease and convenience in explanation. FIGS. 18 to 22 are cross-sectional views taken along the line D-D' of FIG. 4 to illustrate semiconductor devices according to some embodiments of the inventive concepts.

Figure 18:
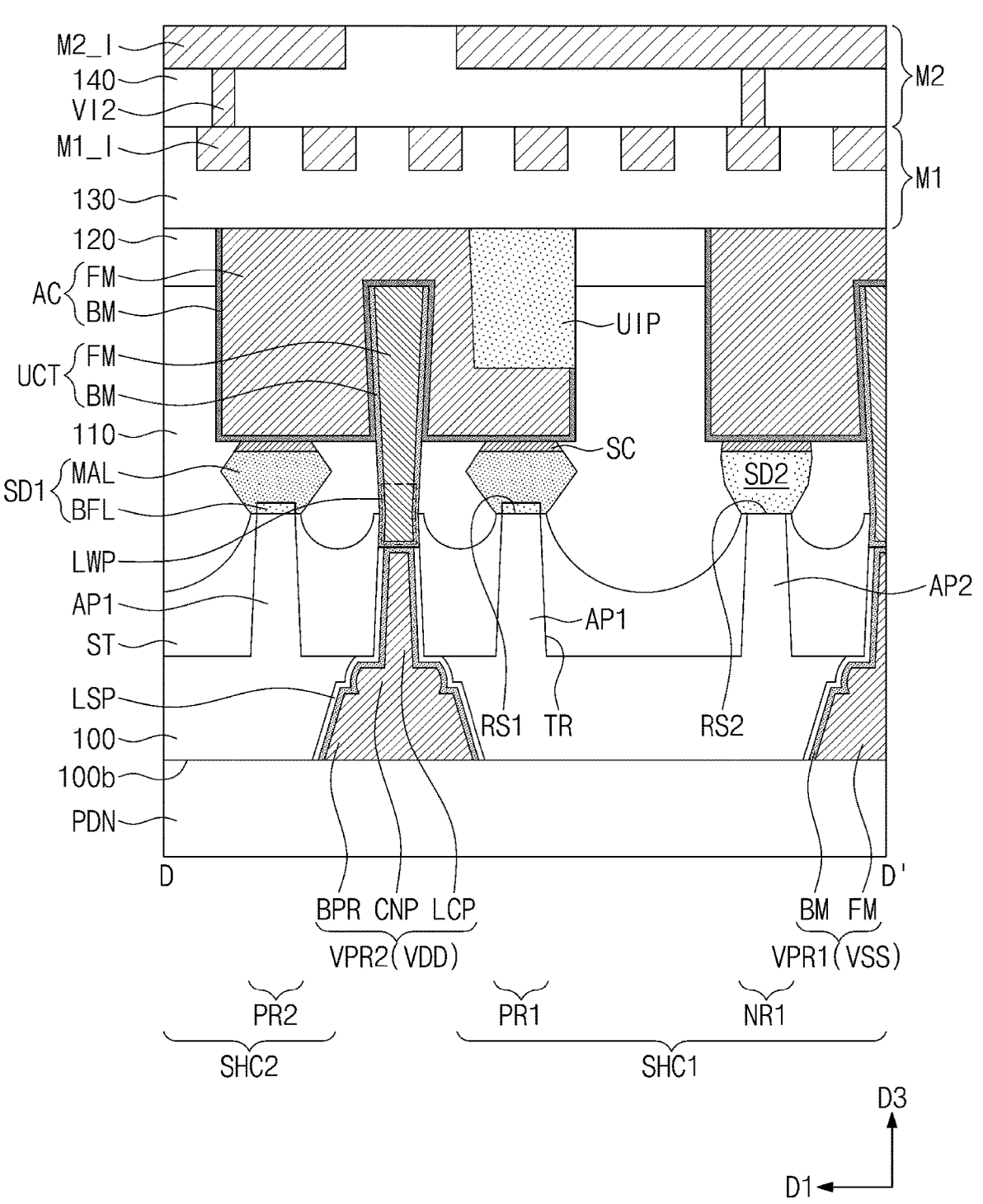
FIGS. 18 to 22 are cross-sectional views taken along the line D-D' of FIG. 4 to illustrate semiconductor devices according to some embodiments of the inventive concepts.

Referring to FIG. 18, a boundary between the lower contact portion LCP and the upper contact UCT may be located at a lower level than a bottom surface of the source/drain pattern SD1 or SD2. Thus, a width of a lower portion LWP of the upper contact UCT may decrease and then increase toward the third direction D3. For example, the lower portion LWP of the upper contact UCT may have a sandglass shape. In certain embodiments of the inventive concepts, the boundary between the lower contact portion LCP and the upper contact UCT may be located at a higher level than the bottom surface of the source/drain pattern SD1 or SD2. In this case, an upper portion of the lower contact portion LCP may have a sandglass shape.

Figure 19:
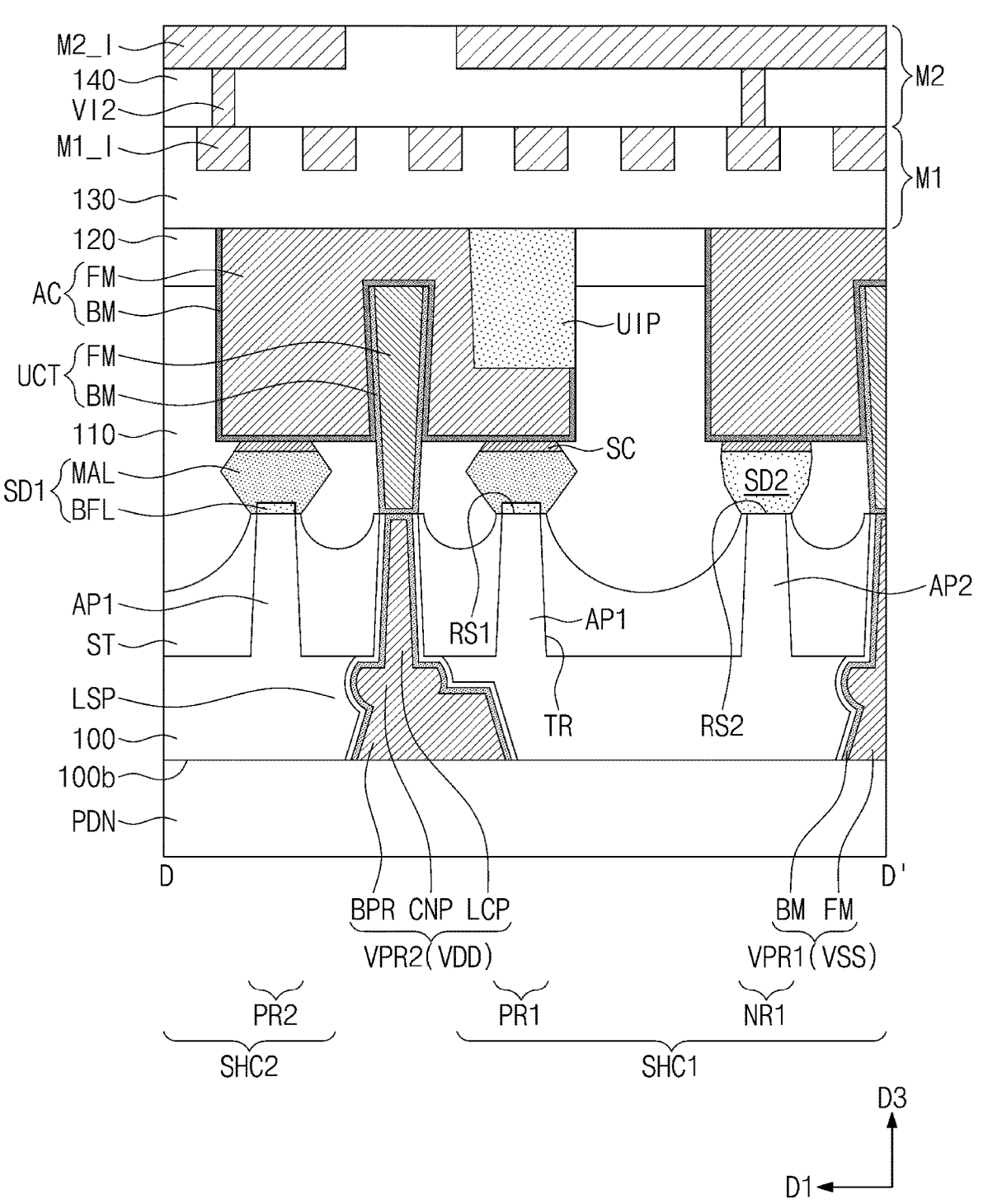

Referring to FIG. 19, a buried interconnection portion BPR may be misaligned from the connection portion CNP and the lower contact portion LCP. For example, the buried interconnection portion BPR may be horizontally offset from the connection portion CNP. The lower interconnection line trench VPT described above with reference to FIG. 16 may be formed to be offset from the sacrificial pillar SAF, and thus a structure of each of lower power interconnection lines VPR1 to VPR3 illustrated in FIG. 19 may be formed. Meanwhile, the sacrificial pillar SAF according to the embodiments of the inventive concepts may have the shape which is buried in the substrate 100 and is expanded, and thus the self-aligned lower power interconnection lines VPR1 to VPR3 may be stably formed even though the lower interconnection line trenches VPT are misaligned.

Figure 20:
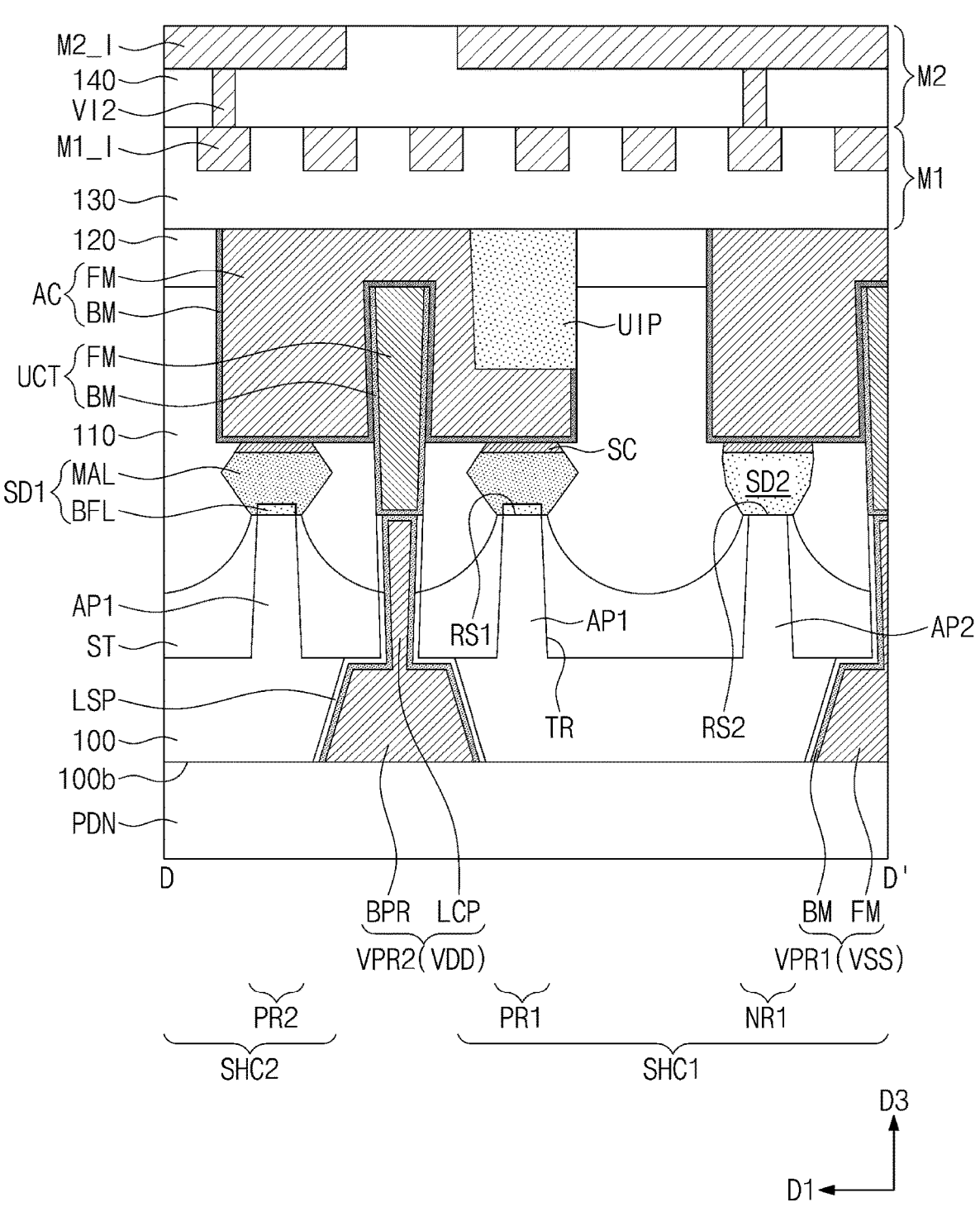

Referring to FIG. 20, the connection portion CNP may be omitted from each of lower power interconnection lines VPR1 to VPR3. A lower contact portion LCP may have a contact shape further extending from the upper contact UCT. In other words, a width of the lower contact portion LCP may increase toward the third direction D3. The lower contact portion LCP according to the present embodiments may be formed by omitting the dummy pattern DAP described in FIG. 6B.

Figure 21:
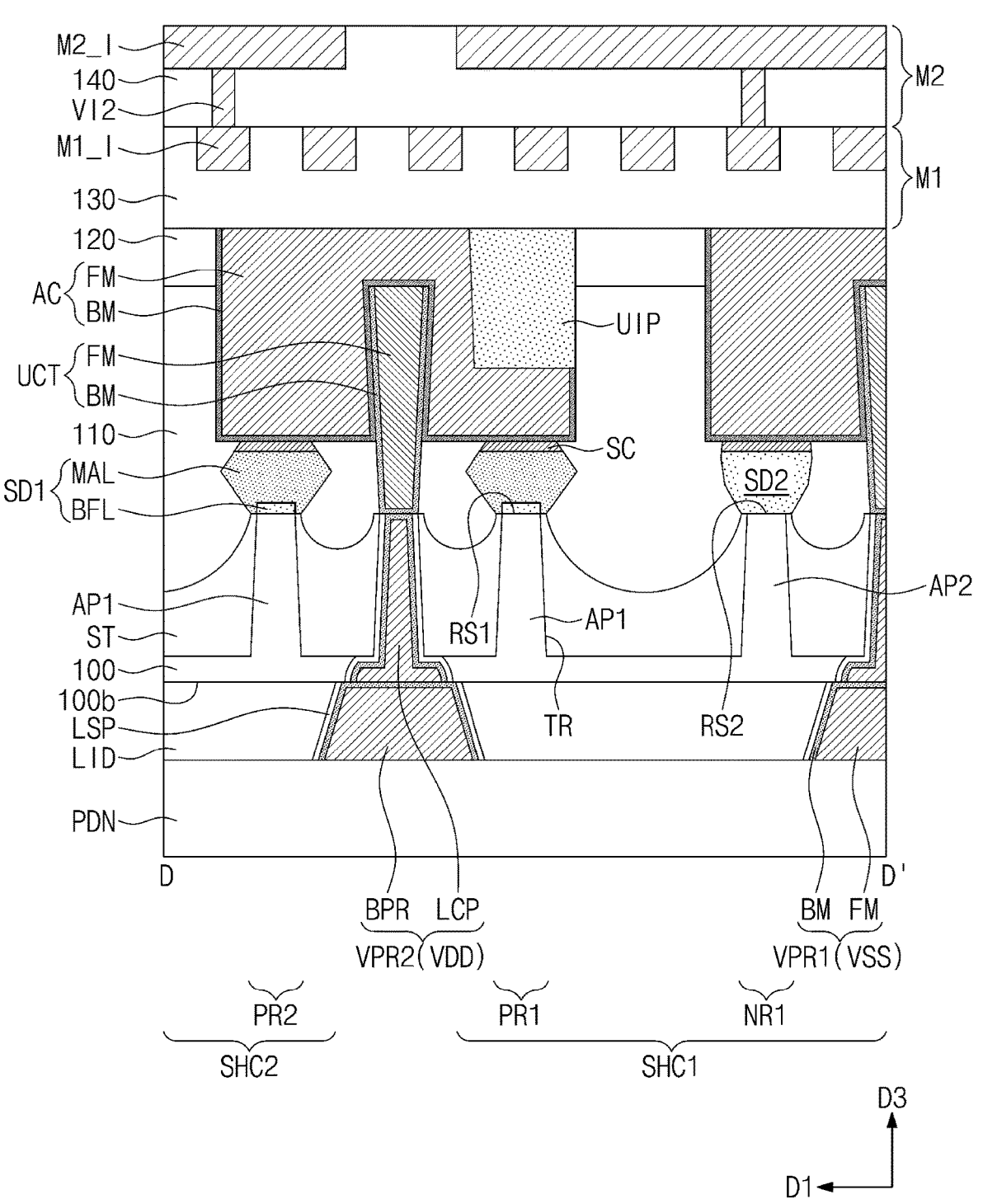

Referring to FIG. 21, a buried interconnection portion BPR and a lower contact portion LCP of each of lower power interconnection lines VPR1 to VPR3 may be formed by different processes. Thus, a barrier pattern BM may be provided at a boundary between the buried interconnection portion BPR and the lower contact portion LCP. The buried interconnection portion BPR may be provided in a lower insulating layer LID on the bottom surface 100b of the substrate 100. A semiconductor device according to the present embodiments may be manufactured using a process of performing the planarization process described above in FIG. 15 until the sacrificial pillar SAF is exposed.

Figure 22:
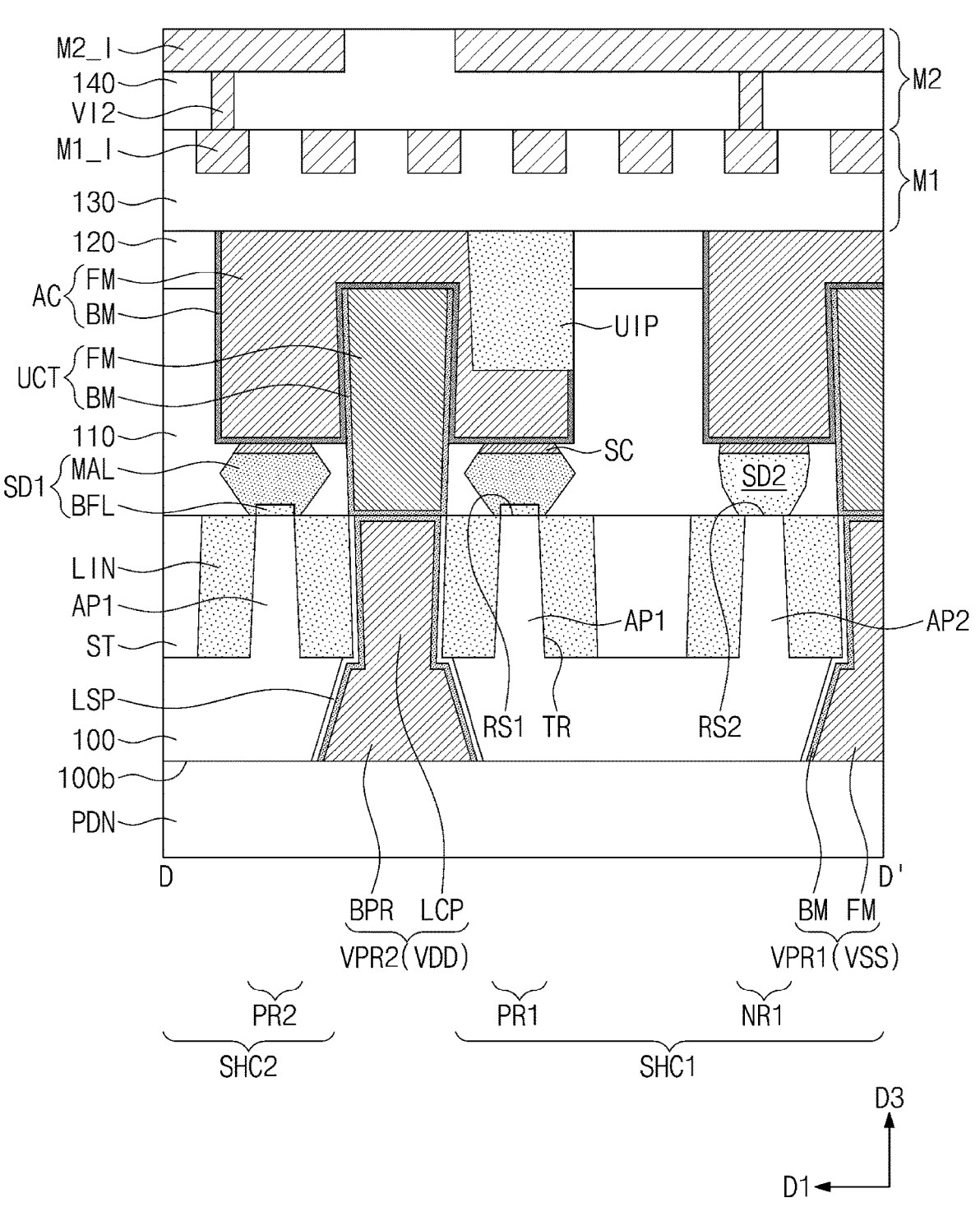

Referring to FIG. 22, a lower contact portion LCP of each of lower power interconnection lines VPR1 to VPR3 may have a contact shape further extending from the upper contact UCT. In other words, a width of the lower contact portion LCP may increase toward the third direction D3. Liner patterns LIN may be provided at both sides of the lower contact portion LCP, respectively. The liner patterns LIN may include silicon oxide, silicon nitride, or silicon oxynitride. The lower contact portion LCP may be self-aligned by the liner patterns LIN. In other words, in the semiconductor device according to the present embodiments, the liner patterns LIN at both sides of the active pattern AP1 or AP2 may be formed instead of the dummy pattern DAP described in FIG. 6B. The lower contact portion LCP self-aligned with the upper contact UCT may be formed using the liner patterns LIN.

Figure 23A:
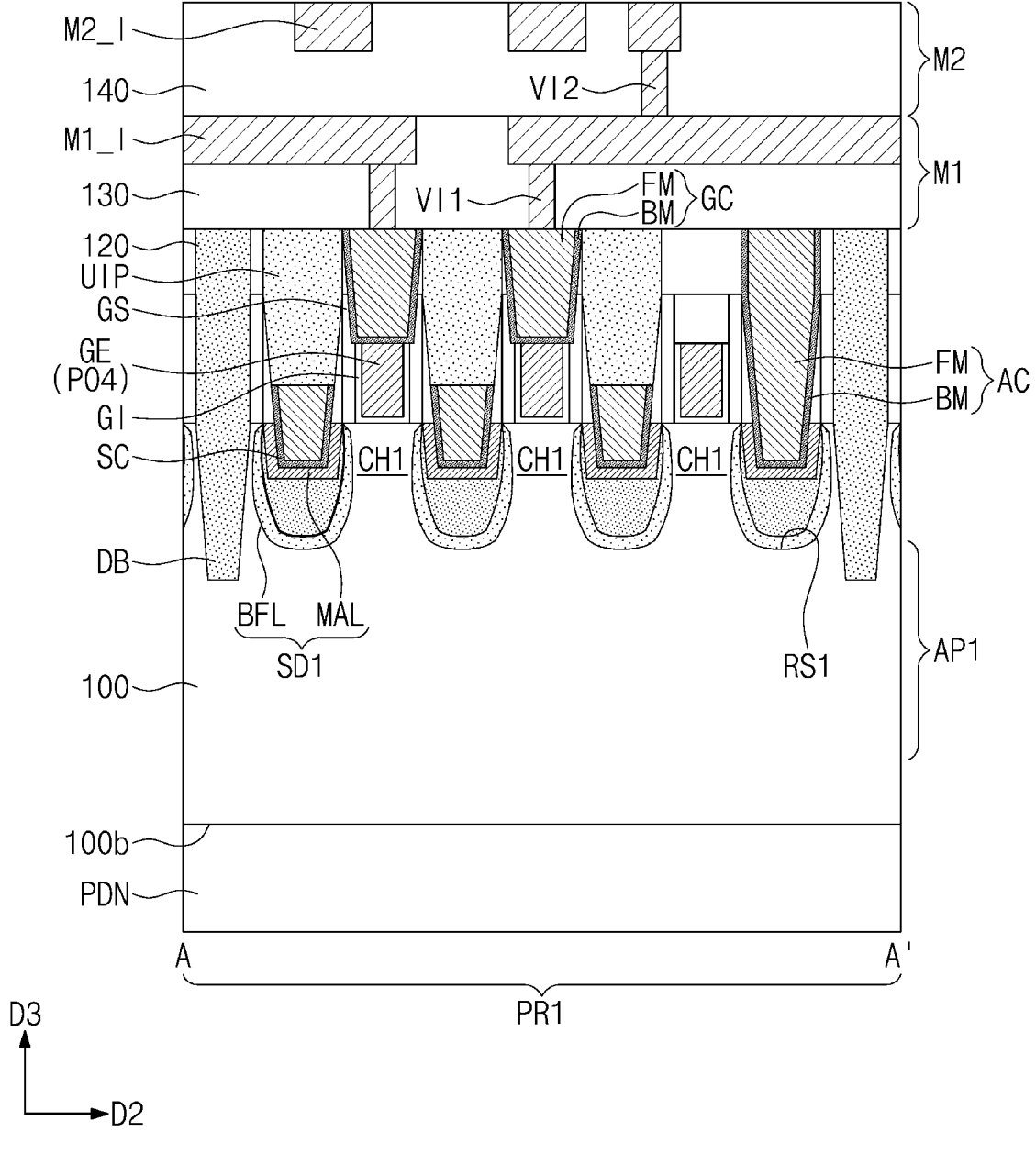
FIGS. 23A, 23B and 23C are cross-sectional views taken along the lines A-A', B-B' and E-E' of FIG. 4, respectively, to illustrate a semiconductor device according to some embodiments of the inventive concepts.
Figure 23B:
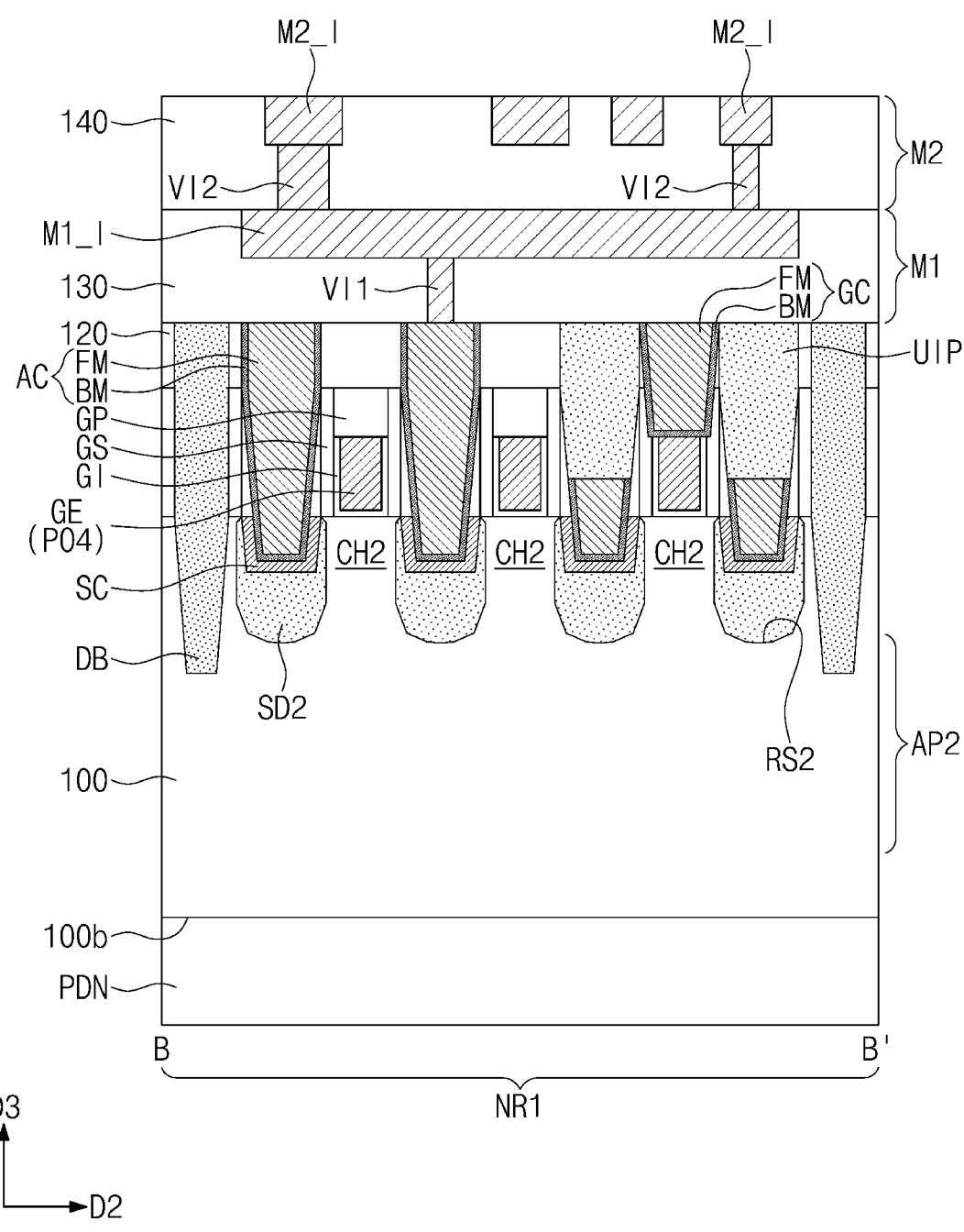
Figure 23C:
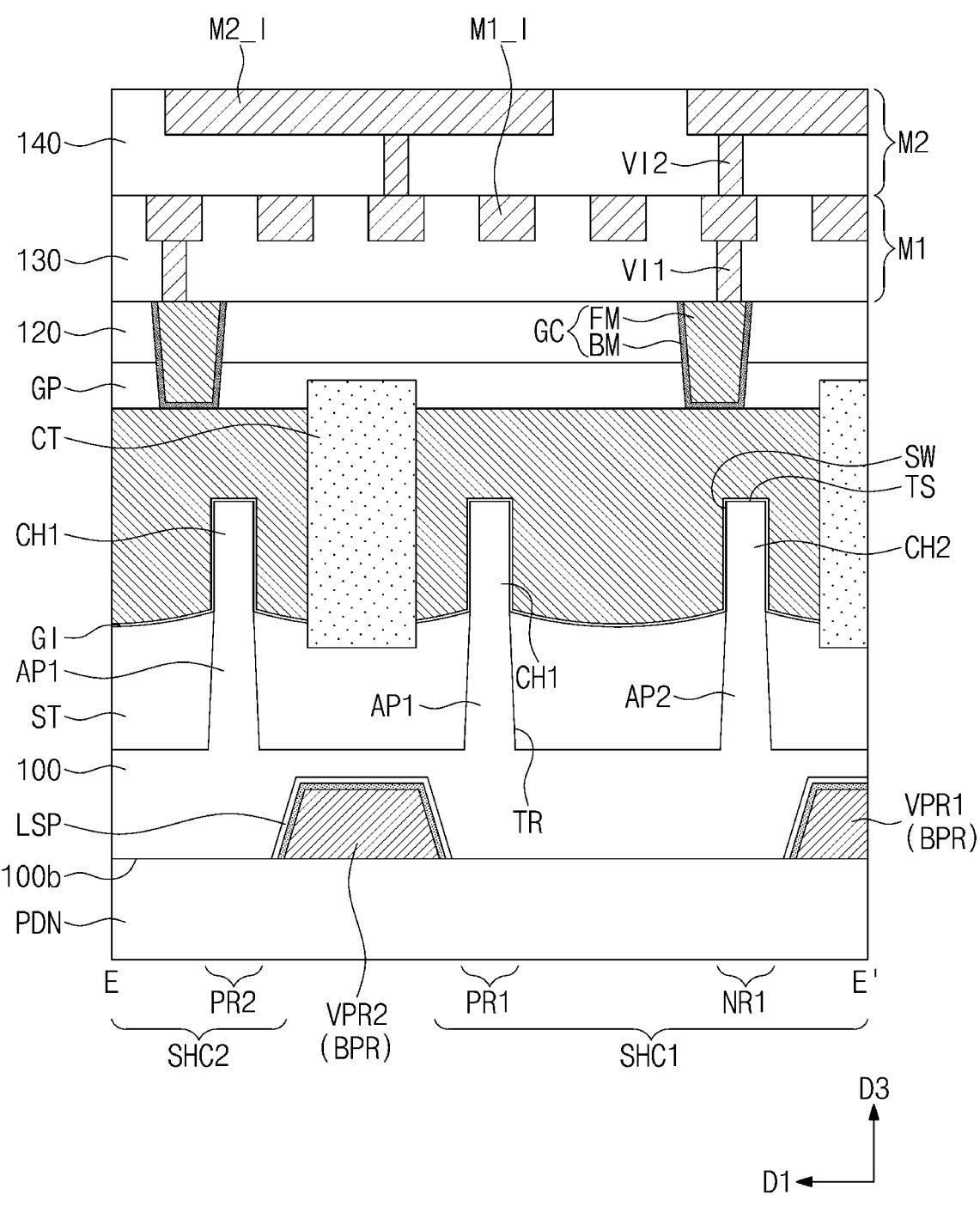

FIGS. 23A, 23B and 23C are cross-sectional views taken along the lines A-A', B-B' and E-E' of FIG. 4, respectively, to illustrate a semiconductor device according to some embodiments of the inventive concepts. Referring to FIGS. 4 and 23A to 23C, a device isolation layer ST may define a first active pattern AP1 and a second active pattern AP2 on a substrate 100. The first active pattern AP1 may be defined on each of the first PMOSFET region PR1 and the second PMOSFET region PR2, and the second active pattern AP2 may be defined on each of the first NMOSFET region NR1 and the second NMOSFET region NR2.

The device isolation layer ST may cover a sidewall of a lower portion of each of the first and second active patterns AP1 and AP2. An upper portion of each of the first and second active patterns AP1 and AP2 may protrude above the device isolation layer ST (see FIG. 23C).

An upper portion of the first active pattern AP1 may include first source/drain patterns SD1 and a first channel pattern CH1 between the first source/drain patterns SD1. An upper portion of the second active pattern AP2 may include second source/drain patterns SD2 and a second channel pattern CH2 between the second source/drain patterns SD2.

Referring again to FIG. 23C, each of the first and second channel patterns CH1 and CH2 may not include the stacked first to third semiconductor patterns SP1, SP2 and SP3 described above with reference to FIGS. 5A to 5E. Each of the first and second channel patterns CH1 and CH2 may have a semiconductor pillar shape protruding above the device isolation layer ST.

A gate electrode GE may be provided on a top surface TS and both sidewalls SW of each of the first and second channel patterns CH1 and CH2. In other words, a transistor according to the present embodiments may be a three-dimensional field effect transistor (e.g., a FinFET) in which the gate electrode GE three-dimensionally surrounds a channel.

A first interlayer insulating layer 110 and a second interlayer insulating layer 120 may be provided on an entire top surface of the substrate 100. Active contacts AC may penetrate the first and second interlayer insulating layers 110 and 120 so as to be connected to the first and second source/drain patterns SD1 and SD2. A gate contact GC may penetrate the second interlayer insulating layer 120 and the gate capping pattern GP so as to be connected to the gate electrode GE. The active contacts AC and the gate contacts GC may be substantially the same as described above with reference to FIGS. 4 and 5A to 5E.

A third interlayer insulating layer 130 may be provided on the second interlayer insulating layer 120. A fourth interlayer insulating layer 140 may be provided on the third interlayer insulating layer 130. A first metal layer M1 may be provided in the third interlayer insulating layer 130. A second metal layer M2 may be provided in the fourth interlayer insulating layer 140. The first metal layer M1 and the second metal layer M2 may be substantially the same as described above with reference to FIGS. 4 and 5A to 5E.

First to third lower power interconnection lines VPR1, VPR2 and VPR3 may be provided in a lower portion of the substrate 100. A power delivery network layer PDN may be provided on a bottom surface 100b of the substrate 100. Each of the first to third lower power interconnection lines VPR1, VPR2 and VPR3 may be electrically connected to a corresponding one of the active contacts AC. The first to third lower power interconnection lines VPR1, VPR2 and VPR3 and the power delivery network layer PDN may be substantially the same as described above with reference to FIGS. 4 and 5A to 5E.

The semiconductor device according to the inventive concepts may reduce a resistance of the lower power interconnection line to improve electrical characteristics. According to the inventive concepts, the vertical contact connecting the buried interconnection portion to the active contact may be divided into the upper contact and the lower contact portion, which are individually formed by different processes. Thus, the vertical contact may be effectively filled with a metal, and the reliability of the semiconductor device may be improved. The lower contact portion may be self-aligned with the upper contact to improve the reliability and the electrical characteristics of the semiconductor device according to the inventive concepts.

While the embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate having a first and second active patterns therein;
   a first and second source/drain patterns extending on the first and second active patterns, respectively;
   an active contact on the first and second source/drain patterns;
   an upper contact extending from the active contact towards the substrate, and between the first and second active patterns;
   a lower power interconnection line buried in a lower portion of the substrate, said lower power interconnection line comprising:
      a buried interconnection portion having a line shape and extending in a first direction; and
      a lower contact portion extending in a second direction vertically from the buried interconnection portion to a bottom surface of the upper contact, the second direction different from the first direction; and
   a barrier pattern extending between the lower contact portion and the upper contact, but not between the buried interconnection portion and the lower contact portion.

2. The device of claim 1, wherein a width of the upper contact becomes progressively smaller in a direction extending toward a bottom surface of the substrate; and wherein a width of the lower contact portion becomes progressively greater toward the bottom surface of the substrate.

3. The device of claim 2, wherein the upper contact and the lower contact portion have a generally sandglass shape when viewed in transverse cross-section.

4. The device of claim 1, wherein the lower power interconnection line further comprises a connection portion extending between the buried interconnection portion and the lower contact portion; wherein the buried interconnection portion has a first width; wherein the connection portion has a second width less than the first width; wherein the lower contact portion has a third width less than the second width; and wherein a ratio of the second width to the third width is greater than a ratio of the first width to the second width.

5. The device of claim 1, wherein the lower contact portion is self-aligned with the upper contact.

6. The device of claim 1, wherein the buried interconnection portion is offset from the lower contact portion.

7. The device of claim 1, further comprising a power delivery network layer extending on a bottom surface of the substrate; and wherein the power delivery network layer is configured to apply a source voltage or a drain voltage to the lower power interconnection line.

8. The device of claim 1, further comprising:
a channel pattern extending on each of the first and second active patterns; and
a gate electrode on the channel pattern; and
wherein the channel pattern comprises a plurality of semiconductor patterns, which are stacked and spaced apart from each other.

9. The device of claim 1, wherein the lower power interconnection line extends along a boundary between adjacent logic cells.

10. The device of claim 1, wherein a conductive pattern of the upper contact and a conductive pattern of the lower power interconnection line include different metals.

11. A semiconductor device, comprising:
a substrate having first and second active patterns therein;
first and second source/drain patterns extending on the first and second active patterns, respectively;
an active contact on the first and second source/drain patterns;
an upper contact extending from the active contact towards the substrate, and between the first and second active patterns; and
a lower power interconnection line buried in a lower portion of the substrate, said lower power interconnection line comprising:
a buried interconnection portion having a line shape and extending in a first direction;
a lower contact portion extending vertically in a second direction from the buried interconnection portion to a bottom surface of the upper contact, the second direction different from the first direction; and
a connection portion extending between the buried interconnection portion and the lower contact portion; and
wherein the buried interconnection portion has a first width, the connection portion has a second width less than the first width, the lower contact portion has a third width less than the second width, and a ratio of the second width to the third width is greater than a ratio of the first width to the second width.

12. The device of claim 11, wherein the buried interconnection portion, the lower contact portion and the connection portion are connected to each other in a single body.

13. The device of claim 11, further comprising a power delivery network layer provided on a bottom surface of the substrate; and wherein the power delivery network layer is configured to apply a source voltage or a drain voltage to the lower power interconnection line.

14. The device of claim 11, wherein a width of the upper contact becomes progressively smaller in a direction towards a bottom surface of the substrate; and wherein the third width of the lower contact portion becomes progressively larger in a direction towards the bottom surface of the substrate.

15. The device of claim 14, wherein the upper contact and the lower contact portion have a generally sandglass shape when viewed in transverse cross-section.

16. A semiconductor device, comprising:
a substrate having first and second active regions therein, which are spaced apart from each other in a first direction;
first and second active patterns on the first and second active regions, respectively;
a first channel pattern and a first source/drain pattern on the first active pattern;
a second channel pattern and a second source/drain pattern on the second active pattern, said second source/drain pattern having the same conductivity type as the first source/drain pattern;
a gate electrode on the first and second channel patterns;
a gate insulating layer extending between the gate electrode and the first and second channel patterns;
a gate spacer on a sidewall of the gate electrode;
a gate capping pattern on a top surface of the gate electrode;
a gate cutting pattern, which penetrates the gate electrode between the first and second channel patterns;
an interlayer insulating layer covering the first and second source/drain patterns and the gate capping pattern;
an active contact penetrating the interlayer insulating layer so as to be electrically connected to the first and second source/drain patterns;
metal-semiconductor compound layers extending between the active contact and corresponding ones of the first and second source/drain patterns;
a gate contact penetrating the interlayer insulating layer and the gate capping pattern so as to be electrically connected to the gate electrode;
a first metal layer on the interlayer insulating layer, the first metal layer including a first interconnection line electrically connected to the gate contact;
a second metal layer on the first metal layer, the second metal layer including a second interconnection line electrically connected to the first metal layer;
an upper contact extending from the active contact toward the substrate, and between the first and second active patterns;
a lower power interconnection line, which is buried in a lower portion of the substrate, vertically overlaps with the gate cutting pattern, and extends in a second direction orthogonal to the first direction, said lower power interconnection line comprising:
a buried interconnection portion having a line shape extending in the second direction; and
a lower contact portion vertically extending in a third direction from the buried interconnection portion to a bottom surface of the upper contact; and
a power delivery network layer extending on a bottom surface of the substrate.

17. The device of claim 16, wherein the lower power interconnection line extends along a boundary between the first active region and the second active region.

18. The device of claim 16, wherein a width of the upper contact becomes progressively smaller in a direction towards the bottom surface of the substrate; and wherein a width of the lower contact portion becomes progressively larger in a direction towards the bottom surface of the substrate.

19. The device of claim 18, wherein the upper contact and the lower contact portion have a generally sandglass shape when viewed in transverse cross-section.

20. The device of claim 16, wherein the lower power interconnection line further comprises a connection portion extending between the buried interconnection portion and the lower contact portion; and wherein the buried interconnection portion has a first width, the connection portion has a second width less than the first width, the lower contact portion has a third width less than the second width, and a ratio of the second width to the third width is greater than a ratio of the first width to the second width.

* * * * *